United States Patent [19]
Sekiguchi et al.

[11] Patent Number: 5,933,724
[45] Date of Patent: Aug. 3, 1999

[54] METHOD OF MANUFACTURING A SEMICONDUCTOR INTEGRATED CIRCUIT DEVICE USING A PHOTOMASK IN WHICH TRANSMITTED LIGHT BEAM INTENSITIES ARE CONTROLLED

[75] Inventors: Toshihiro Sekiguchi, Hidaka; Yoshitaka Tadaki, Hanno; Keizo Kawakita, Ome; Jun Murata, Kunitachi; Katsuo Yuhara, Ibaraki-ken; Toshikazu Kumai; Michio Tanaka, both of Ome; Michio Nishimura, Tokorozawa; Kazuhiko Saitoh, Ibaraki-ken; Takatoshi Kakizaki, Tsukuba; Takeshi Sakai, Ome; Toshiyuki Kaeriyama; Songsu Cho, both of Ibaraki-ken, all of Japan

[73] Assignees: Hitachi, Ltd., Tokyo, Japan; Texas Instruments, Dallas, Tex.

[21] Appl. No.: 08/703,067

[22] Filed: Aug. 26, 1996

[30] Foreign Application Priority Data

Aug. 28, 1995 [JP] Japan .................................. 7-218877

[51] Int. Cl.$^6$ ................................................ H01L 21/8242
[52] U.S. Cl. ............................................ 438/239; 438/253
[58] Field of Search ............................... 438/396, 32, 571, 438/619, 948, 253, 238, 239

[56] References Cited

U.S. PATENT DOCUMENTS

| 5,455,144 | 10/1995 | Okamoto et al. | 430/313 |
| 5,502,001 | 3/1996 | Okamoto | 437/173 |
| 5,583,069 | 12/1996 | Ahn et al. | 438/253 |

*Primary Examiner*—Joni Chang
*Attorney, Agent, or Firm*—Antonelli, Terry, Stout & Kraus, LLP

[57] ABSTRACT

A phase shifting mask is used for manufacturing a semiconductor integrated circuit device including a conductor pattern in which the line width of patterned conductor strips or the space between patterned conductor strips is not constant. For main transparent areas in the mask corresponding to the conductor pattern, auxiliary pattern segments are provided for compensating changes in the phase distribution of transmitted light caused by changes of the line width or the space. Alternately, the spaces between the conductor strips are adjusted to suppress the changes in the phase distribution of transmitted light. Whether the auxiliary pattern segments should have the phase shifting function is determined depending upon the disposition of the main transparent areas.

26 Claims, 48 Drawing Sheets

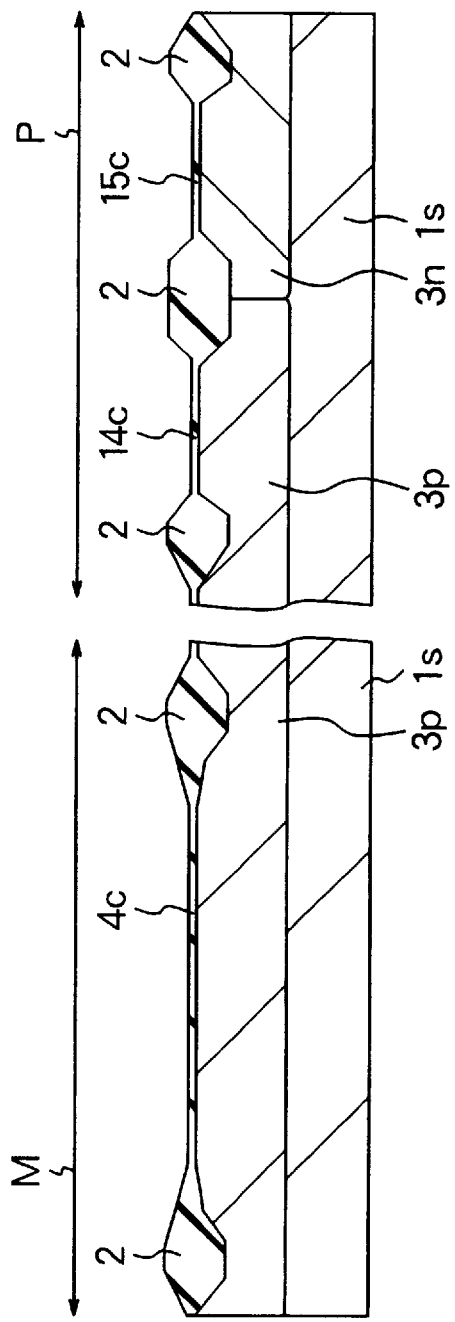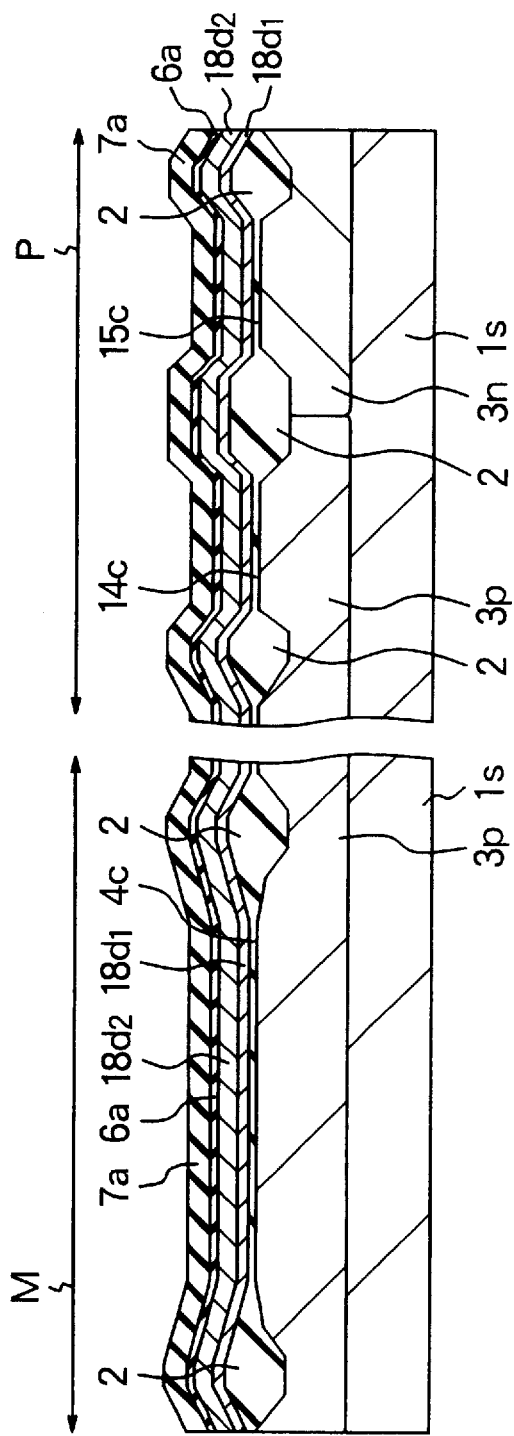

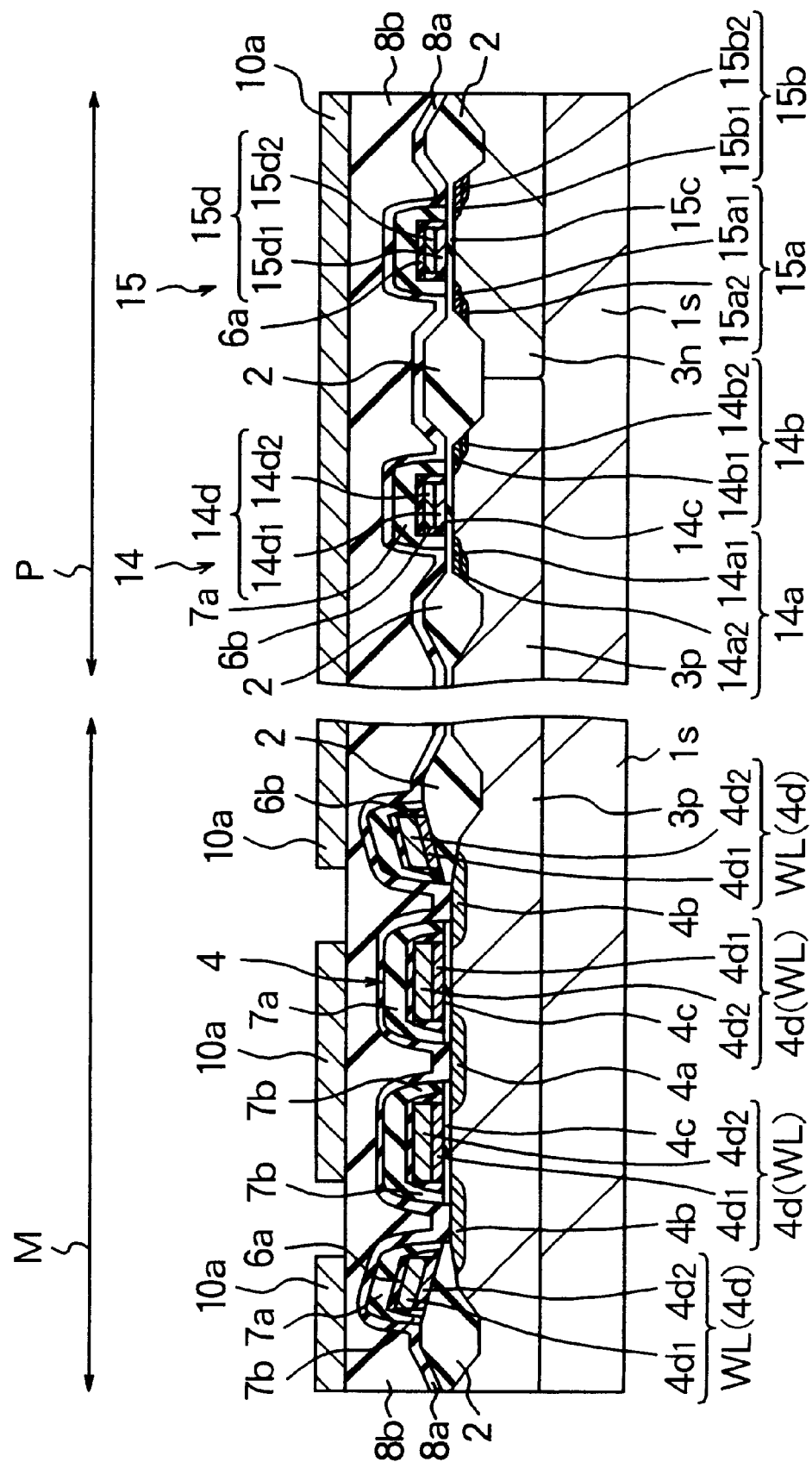

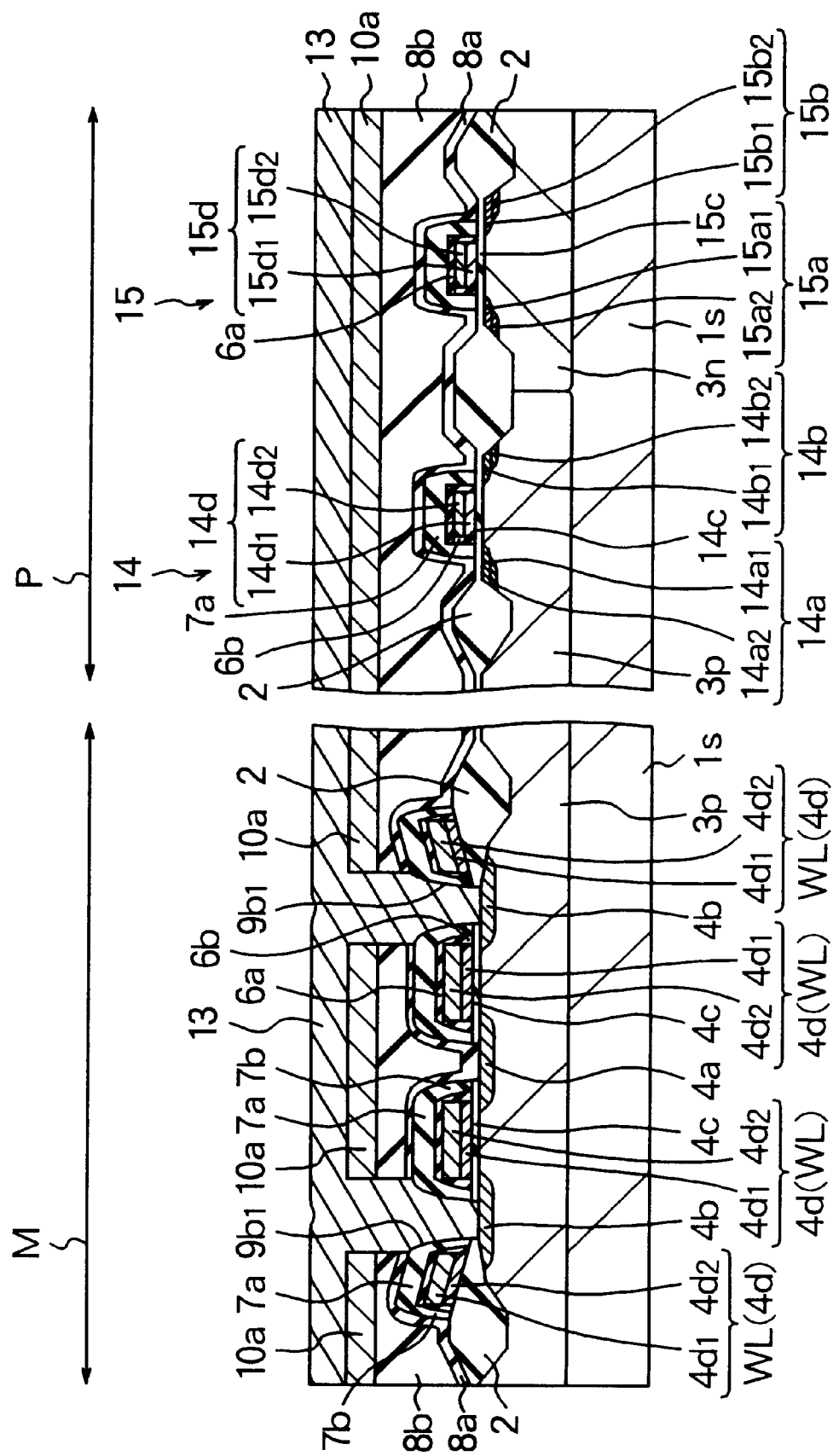

FIG. 23r1
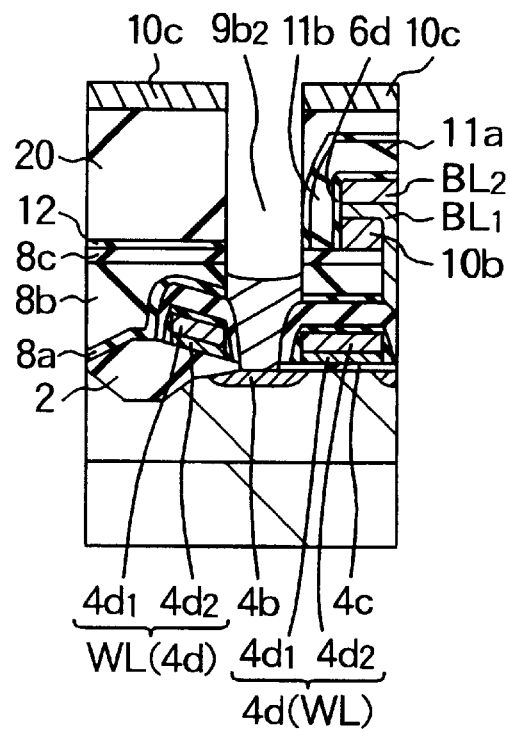
FIG. 23r2
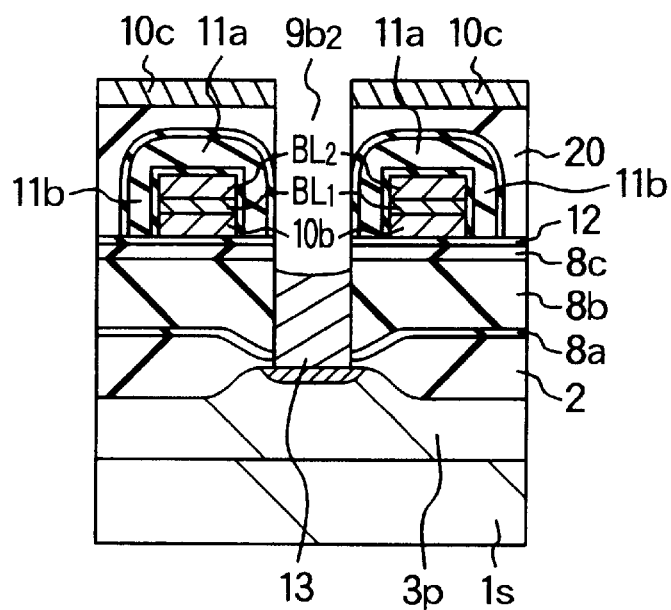

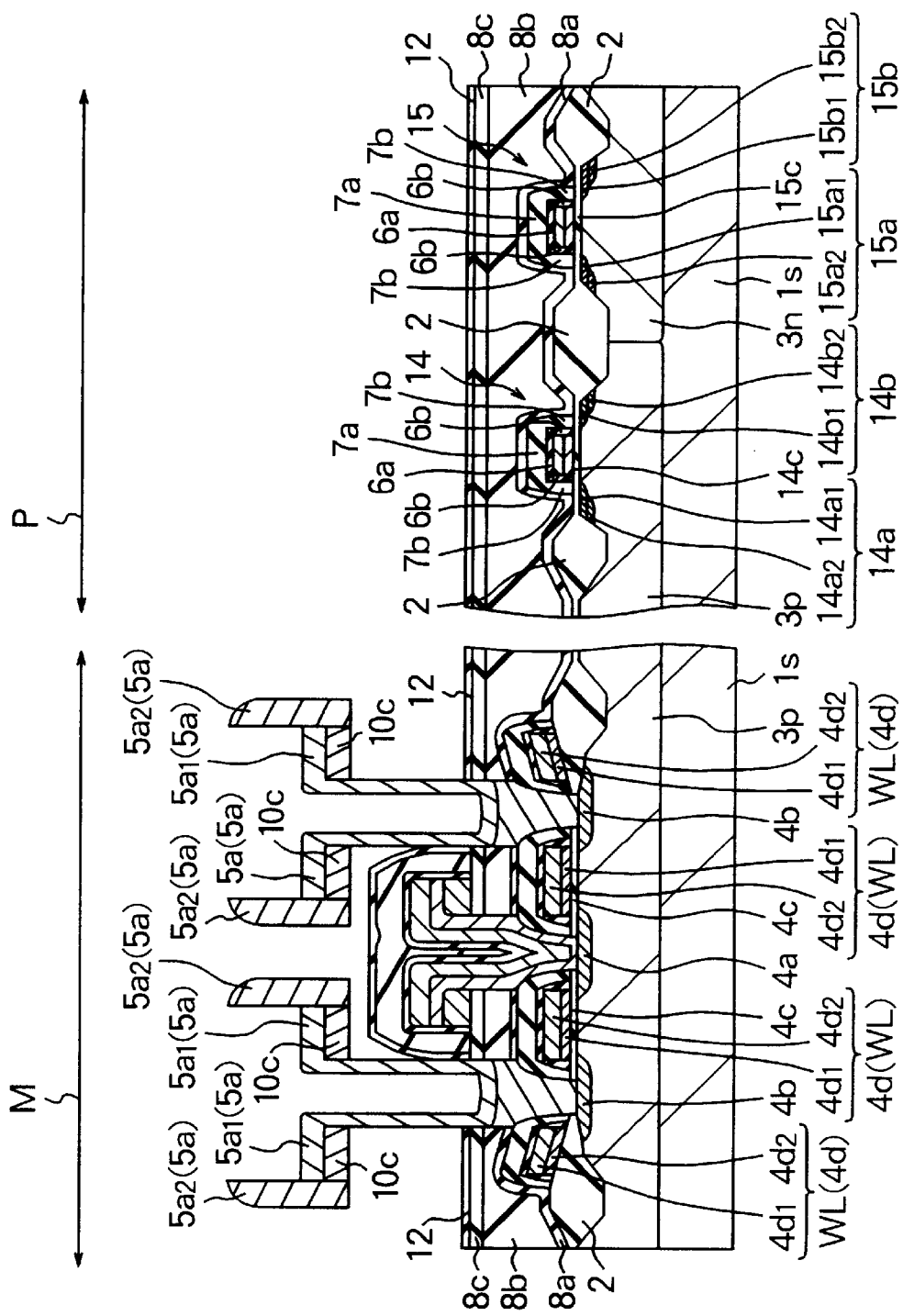

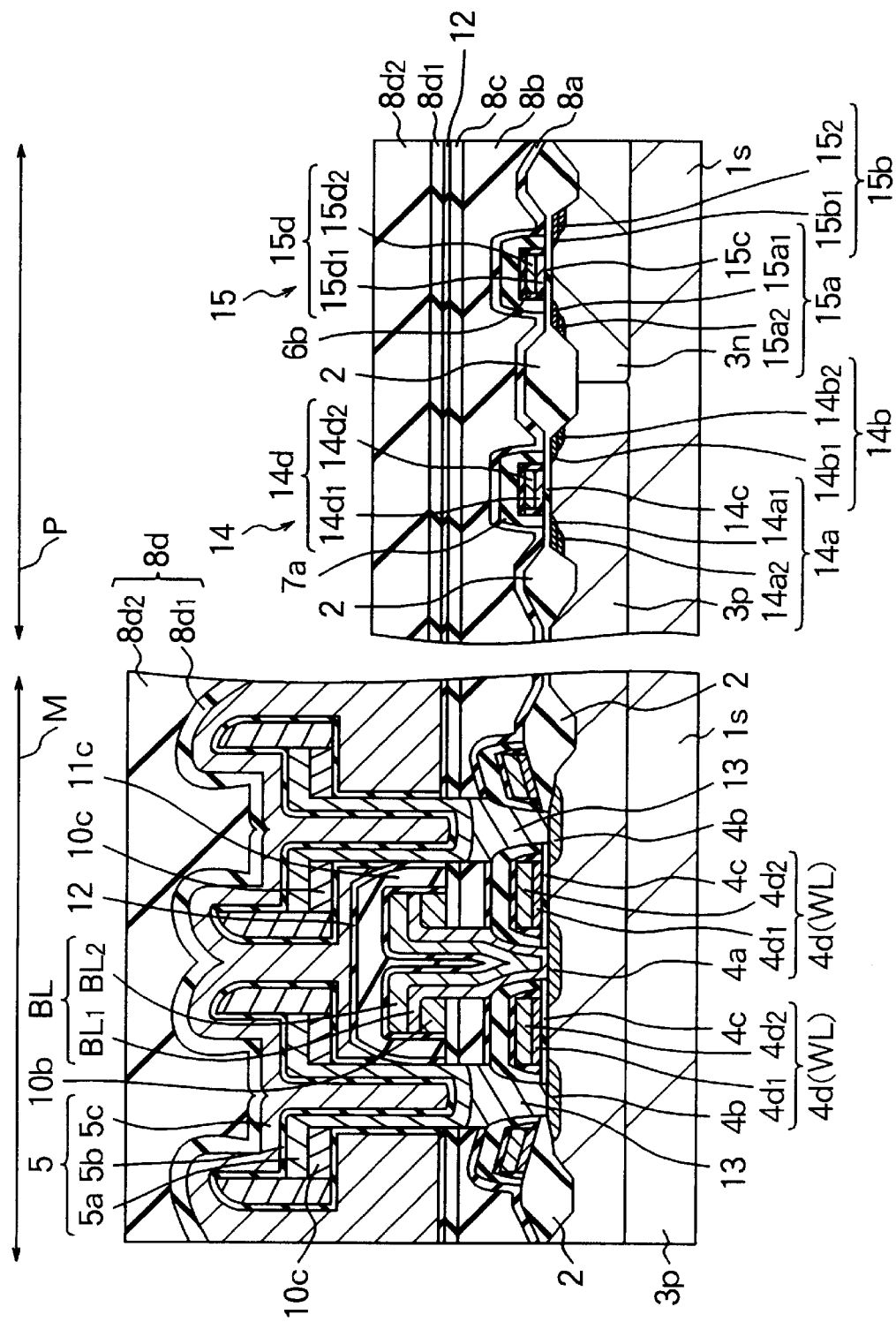

METHOD OF MANUFACTURING A SEMICONDUCTOR INTEGRATED CIRCUIT DEVICE USING A PHOTOMASK IN WHICH TRANSMITTED LIGHT BEAM INTENSITIES ARE CONTROLLED

The present invention is related to U.S. application Ser. No. 08/694,766, filed on Aug. 9, 1996, now abandoned by Toshio Sekiguchi, Hideo Aoki, Yoshitaka Tadaki, Keizo Kawakita, Jun Murata, Katsuo Yuhara, Michio Nishimura, Kazuhiko Saitoh, Minoru Ohtsuka, Masayuki Yasuda, Toshiyuki Kaeriyama and Song Su Cho corresponding to Japanese Patent Application No. 07-208037, filed on Aug. 15, 1995, the content of which is herein incorporated by reference in its entirety.

BACKGROUND OF THE INVENTION

The present invention relates to a technique for manufacturing semiconductor integrated circuit devices, and in particular to a method for manufacturing semiconductor integrated circuit devices using a phase shifting lithography technique in exposure processing.

In the photolithography technique of transferring a circuit pattern on a photomask to a semiconductor substrate by using a light beam such as the g-line (436 nm) or the i-line (365 nm), limits are being posed on minimum working dimensions of the pattern allowing favorable transfer as the degree of the device integration of semiconductor integrated circuit devices is improved.

It is conceivable to further shorten the wavelength of the exposure light beam as a method for making the minimum working dimensions of the pattern allowing favorable transfer shorter. As a matter of fact, however, there are various problems, and the wavelength of the light beam cannot be shortened simply.

Therefore, there is a technique of increasing the numerical aperture (NA) of the optical system in exposure apparatuses in order to improve the resolution without changing the exposure length. In this case, there was a problem that the depth of focus became excessively shallow with the increase of the NA and use of a short-wavelength light beam.

Therefore, various exposure techniques for attempting to improve the resolution without making the depth of focus shallow are under study. As the representative means thereof, there is a phase shifting lithography technique using a phase shifting mask.

The phase shifting lithography technique is a technique for improving the resolution and contrast of the projected image by manipulating the phase of the light transmitted through a phase shifting mask (including a reticle). In a predetermined position on the phase shifting mask, a phase shifter for generating a phase difference between transmitted light beams is formed.

For example, according to a phase shifting technique disclosed in JP-B-62-59296 (published on Dec. 10, 1987 and corresponding to U.S. Ser. No. 365672 filed on Apr. 5, 1982), a transparent film is disposed in one of a pair of transparent areas which are adjacent to each other with an opaque area between, so that a phase difference is generated between light beams transmitted through these two transparent areas, and the transmitted light beams interfere and weaken each other on a location corresponding to the opaque area on a semiconductor wafer.

According to a phase shifting technique disclosed in JP-A-62-67514 (published on Mar. 27, 1987), a part of the opaque area of a mask is removed to form a fine opening pattern and thereafter a transparent film is disposed either in the opening pattern or in the transparent area located near the opening pattern, so that a phase difference is generated between the light beam transmitted through the transparent area and the light beam transmitted through the opening pattern, and the amplitude distribution of the light beam transmitted through the transparent area is prevented from spreading in the lateral direction.

According to a phase shifting technique disclosed in JP-A-2-140743 (published on May 30, 1990), a phase shifter is disposed in a part of the transparent area of a mask so that a phase difference is generated between the transmitted light beams and a phase shifter boundary portion is emphasized.

In the case of the phase shifting lithography technique, its application to the transfer of a pattern including a simple repetition poses no problems. In the case where the phase shifting lithography technique is applied to the transfer of a complicated pattern such as a pattern for forming a semiconductor integrated circuit device, however, it is difficult to dispose phase shifters and in some cases a problem that the pattern cannot be transferred favorably is posed.

For example, as for mutually adjacent word lines of a DRAM, the space between adjacent word conductor lines including an area in which bit line contact holes and capacitor contact holes are disposed becomes wider on some locations than the space between other portions of those word lines or the space between other adjacent word lines because of the alignment tolerance of the contact holes.

In the case where such a pattern for the word lines is transferred by using a phase shifting mask, a phase shifter is disposed on either one of mutually transparent areas (for word line transfer). If there are portions having different spaces between adjacent transparent areas as described above, however, a difference is caused in strength of transmitted light beam between the portion and another portion. Therefore, the phase of the light beam can be manipulated favorably. As a result, a portion originally desired to be wide might become narrow, or a portion which need not be thick might become thick. Thus the shape and dimensions cannot be obtained as designed and the pattern cannot be transferred favorably in some cases.

Furthermore, in DRAMs for example, the memory capacity as a whole tends to increase and an increase in degree of device integration is attempted. As the degree of device integration is increased, the space of lines included in adjacent capacitor patterns is also narrowed.

In the case where a pattern for capacitor contact holes is transferred by using a phase shifting mask, at least one auxiliary pattern segment is disposed around a transparent area for forming contact holes. As the space of lines included in adjacent capacitor patterns is made narrower as described above, however, simply disposing auxiliary pattern segments might cause a pattern to be formed in a position corresponding to an area between auxiliary pattern segments, i.e., in an area in which a pattern should not be formed originally. This is caused by, for example, interference between light beams transmitted through adjacent auxiliary pattern segments.

In JP-A-6-130646 (published on May 13, 1994), a photomask having four rectangular phase shifters around a main hole has been shown.

In JP-A-6-289591 (published on Oct. 18, 1994), a phase shifting mask having auxiliary openings disposed on opposite sides of a main opening so as to be displaced from each other with respect to the center of the main opening and a phase shifting mask having a plurality of auxiliary openings disposed around the main opening at a predetermined pitch has been disclosed.

In JP-A-5-19446 (published on Jan. 29, 1993), a phase shifting mask having a predetermined auxiliary pattern disposed in a boundary portion of a pattern area has been disclosed.

In JP-A-6-85086 (published on Mar. 25, 1994), it is shown that problems such as shortcircuit caused between lines by a step are prevented by forming a contact pad having a line width smaller than the minimum line width so that the contact pad will have the same height as a flattening insulating layer and become flat.

SUMMARY OF THE INVENTION

An object of the present invention is to provide a technique, in transferring a predetermined pattern by using a photomask having a phase shifter, capable of transferring the shape and dimensions of the pattern to be transferred, so as to be faithful to the design pattern.

According to one aspect of the present invention, there is provided a method of manufacturing a semiconductor integrated circuit device including generally linear conductor strips having varying widths and extending in a first direction, at least two generally linear conductor strips being juxtaposed in a second direction substantially perpendicular to the first direction to form a conductor strip unit in a manner such that widths of the conductor strips as viewed in the second direction are substantially periodically changed, the conductor strips forming the conductor strip units being repetitively juxtaposed with a fine interval in the second direction in a conductor strip forming order, the method comprising the steps of:

(a) preparing a semiconductor substrate having a main surface;

(b) forming a photoresist film on the main surface of the semiconductor substrate;

(c) conducting pattern transference onto the photoresist film by use of a phase shifting mask of the type having a pattern including a plurality of generally linear transparent areas and a plurality of generally linear opaque areas, the plurality of generally linear transparent areas corresponding to the conductor strips, phases of light beams transmitted through adjacent transparent areas being substantially opposite to each other, wherein, in the phase shifting mask, arrangement units each including a plurality of generally linear transparent areas and a plurality of generally linear opaque areas are repetitively juxtaposed with the fine interval, the arrangement units corresponding to the conductor strip units, an interval between the linear transparent areas within each of the arrangement units is substantially constant over a length of the linear transparent areas, and an interval between the arrangement units is substantially constant over a length of the linear transparent areas; and (d) developing the pattern and forming the linear conductor strips having varying widths by use of the pattern.

According to another aspect of the present invention, there is provided a method of manufacturing a semiconductor integrated circuit device including generally linear conductor strips having varying widths and extending in a first direction, at least two generally linear conductor strips being juxtaposed in a second direction substantially perpendicular to the first direction to form a conductor strip unit in a manner such that widths of the conductor strips as viewed in the second direction are substantially periodically changed, the conductor strips forming the conductor strip units being repetitively juxtaposed with a fine interval in the second direction in a conductor strip forming order, each of the generally linear conductor strips having at least one expanded portion, the method comprising the steps of:

(a) preparing a semiconductor substrate having a main surface;

(b) forming a photoresist film on the main surface of the semiconductor substrate;

(c) conducting pattern transference onto the photoresist film by use of a phase shifting mask of the type having a pattern including a plurality of generally linear main transparent areas and a plurality of generally linear opaque areas, the plurality of generally linear transparent areas corresponding to the conductor strips, phases of light beams transmitted through adjacent main transparent areas being substantially opposite to each other, wherein, in the phase shifting mask, arrangement units each including a plurality of generally linear transparent areas and a plurality of generally linear opaque areas are repetitively juxtaposed with the fine interval, the arrangement units corresponding to the conductor strip units, each of the generally linear main transparent areas has expanded portions corresponding to the expanded portions of the strips, and an auxiliary transparent area is provided in an opaque area near the expanded portion of each of the main transparent areas as viewed in a lengthwise direction of the generally linear main transparent area, for substantially phase-inverting a light beam to be transmitted through the auxiliary transparent area with respect to a light beam to be transmitted through said expanded portion of said main transparent area, said auxiliary transparent area having a shape and dimensions smaller than a resolution limit; and (d) developing the pattern and forming the conductor linear strips having varying widths by use of the pattern.

According to another aspect of the present invention, there is there is provided a method of manufacturing a semiconductor integrated circuit device, the semiconductor integrated circuit device having contact holes arranged generally periodically in matrix in a first direction and in a second direction substantially perpendicular to the first direction, an arrangement pitch of the contact holes in the first direction being larger than an arrangement pitch of the contact holes in the second direction, the method comprising the steps of:

(a) preparing a semiconductor substrate having a main surface;

(b) forming a photoresist film on the main surface of the semiconductor substrate;

(c) conducting pattern transference onto the photoresist film by use of a phase shifting mask having a pattern including a plurality of main transparent areas respectively corresponding to the contact holes and having opaque areas defining the main transparent areas, wherein in the phase shifting mask, phases of light beams transmitted through the main transparent areas are substantially identical, an opaque area surrounding each of the main transparent areas is provided with auxiliary transparent areas each having a shape and dimensions smaller than a resolution limit, phases of light beams transmitted through the main transparent areas are substantially opposite to phases of light beams transmitted through the auxiliary transparent areas, and those of the auxiliary transparent areas which are disposed between adjacent transparent areas arranged in the second direction are shared by the adjacent transparent areas; and (d) developing the pattern and forming the contact holes by use of the pattern.

According to the one aspect of the present invention, the space or interval between mutually adjacent transparent areas for word line transfer is made constant in each space line. Thereby, it becomes possible to conduct phase difference on light beams transmitted through mutually adjacent transparent areas, in the whole area between both the transparent areas favorably substantially according to the design. As a result, it becomes possible to form the shape and dimensions of the transferred pattern (word line WL) substantially according to the design.

According to another aspect of the present invention, a minute opaque area is disposed in a wide area of each transparent area for forming a bit line, and in the peripheral opaque area an auxiliary pattern segment is disposed near a boundary area located between an expanded portion and a narrow-width portion of the transparent area. Thereby, it is possible to suppress a significant change of transmitted light caused by a difference in area ratio between the expanded portion and the narrow-width portion of the transparent area. Therefore, the expanded portion and the narrow-width portion of the transparent area can be transferred favorably substantially according to the design. As a result, it becomes possible to form the shape and dimensions of the transferred pattern (bit line BL) substantially according to the design.

According to another aspect of the present invention, auxiliary pattern segments disposed on four sides of the transparent area for forming capacitor contact holes are disposed asymmetrically, for example, by changing the dimensions, according to the disposition state of the transparent area for forming capacitor contact holes. Thereby the transparent area for contact holes can be transferred favorably without transferring a useless pattern. As a result, it becomes possible to form the shape and dimensions of capacitor contact holes substantially according to the design.

DESCRIPTION OF THE PREFERRED EMBODIMENTS

Hereafter, preferred embodiments of the present invention will be described in detail by referring to drawing. Throughout all drawing illustrating the preferred embodiments, components having the same function are denoted by like characters and repetitive description will be omitted.

A semiconductor integrated circuit device of a first embodiment is preferably a 64-Mbit DRAM. However, the word bit configuration is not limited to this, but may be varied diversely. The circuit block configuration of a principal portion of a semiconductor chip in which the DRAM is formed is shown in FIG. 1.

Figure 1:
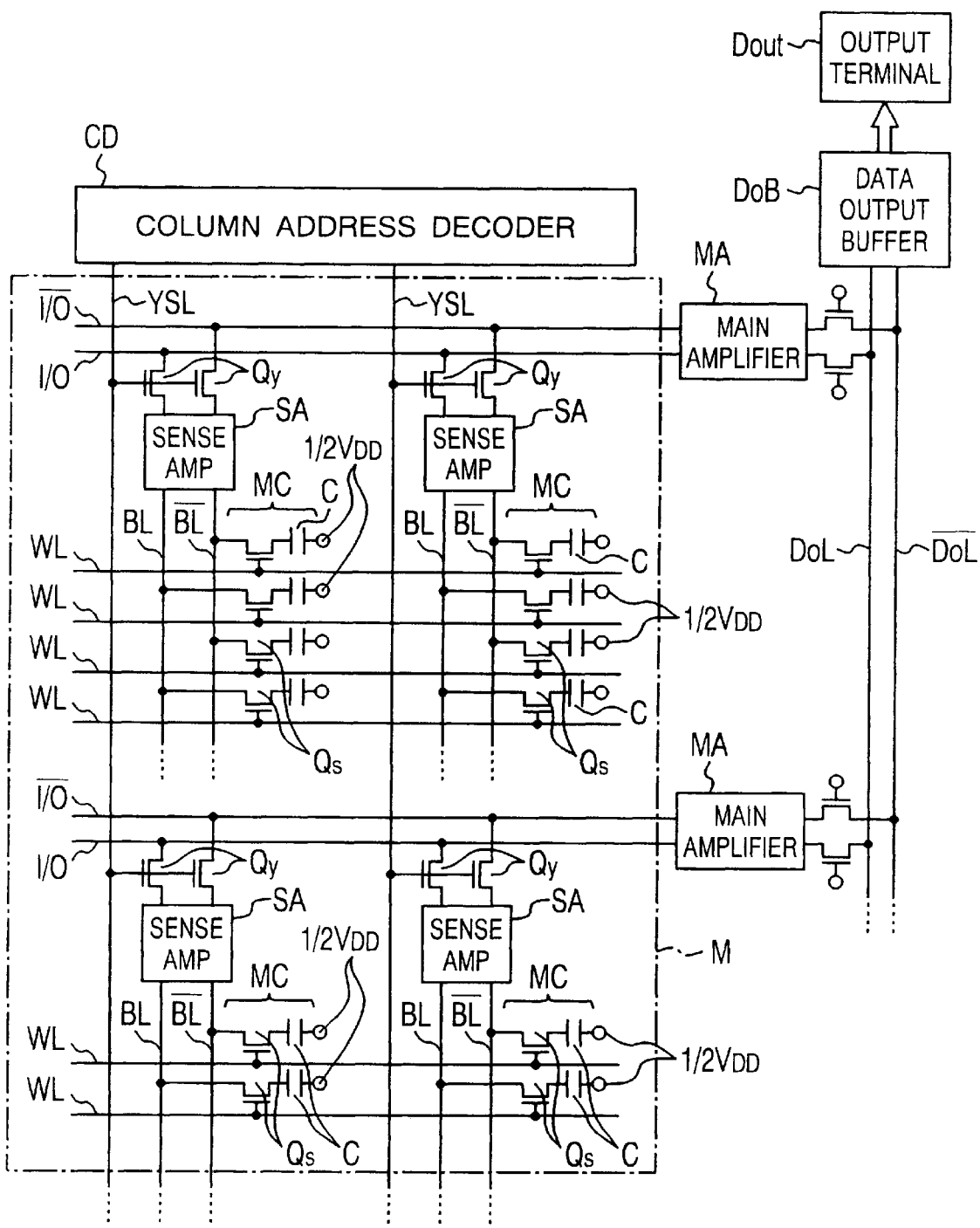
FIG. 1 is a block diagram of a semiconductor integrated circuit device according to an embodiment of the present invention.

A plurality of memory cells MC are spread all over a memory cell section M disposed in the semiconductor chip in the longitudinal and lateral directions of FIG. 1. The memory cell MC is the minimum unit of the memory which stores either of binary data, i.e., a high (hereafter abbreviated to "H") signal level or a low (hereafter abbreviated to "L") signal level. The memory cell MC has one memory cell selection MOSFET Qs and one capacitor C.

Such a memory MC is disposed near an intersecting point of a complementary bit line pair BL/$\overline{BL}$ and a word line WL extending nearly perpendicular thereto. By the way, a bar "-" of $\overline{BL}$ indicates low level activation. One terminal of the capacitor C of the memory cell MC connected to the bit line pair BL/$\overline{BL}$ is set to preferably the potential of a power supply voltage VDD/2.

In the longitudinal direction of FIG. 1, m complementary bit line pairs BL/$\overline{BL}$ are arranged. To each bit line pair BL/$\overline{BL}$, n memory cells MC are electrically connected. The complementary bit line pair BL/$\overline{BL}$ is extended in the lateral direction of FIG. 1 and is electrically connected to a column address decoder CD and a column driver (not illustrated) via a sense amplifier circuit SA and column selection MOSFETs Qy.

The sense amplifier SA senses and amplifies a minute voltage (or current) transmitted on the bit line BL. The sense amplifier SA is connected to a main amplifier MA via a data I/O signal line pair I/O/$\overline{I/O}$, and it is furthermore connected to a data output buffer DOB electrically. By the way, a bar "-" of $\overline{IO}$ indicates low level activation.

A minute signal on the bit line pair BL/$\overline{BL}$ is transferred to the main amplifier MA via the local I/O signal line pair I/O/$\overline{I/O}$ and amplified in the main amplifier MA. The amplified signal is transmitted to a data output buffer DOB via a data output line pair DOL/$\overline{DOL}$.

The data output buffer DOB is a circuit for amplifying a signal read out from the memory cell MC so that the signal will be transmitted to an external device without attenuation in a line conductor path on the way. The data output buffer DOB is electrically connected to an output terminal Dout. By the way, a bar "-" of $\overline{DOL}$ indicates low level activation.

The column address decoder CD is a circuit for receiving a signal from a column address buffer (not illustrated) and selecting one predetermined column selection line YSL. A column driver is a circuit for supplying a selection pulse voltage to one predetermined column selection line YSL according to a signal supplied from the column address decoder CD.

The column address buffer is a circuit for taking in and holding a plurality of column address signals according to a column selection signal supplied from a timing generator and forming a complementary internal address signal on the basis of these column address signals.

As for word lines WL, n word lines are arranged in the lateral direction of FIG. 1. To each word line WL, m memory cells MC are electrically connected. Each word line WL is extended in the longitudinal direction of FIG. 1 and connected electrically to a row address decoder (not illustrated) and a row driver (not illustrated).

The row address decoder is a circuit for receiving a signal supplied from a row address buffer (not illustrated) and selecting one predetermined word line WL. The row address decoder is supplied with a complementary internal address signal from the row address buffer.

The row address buffer takes in and hold a row address signal transmitted from an address multiplexer (not illustrated) according to a timing signal supplied from the timing generator. A row driver is a circuit for supplying a selection pulse voltage to one predetermined word line WL according to a signal supplied from the row address decoder. Preferably, power supply voltage of this DRAM is approximately 3.3 V, and ground voltage is approximately 0 V.

Figure 2:
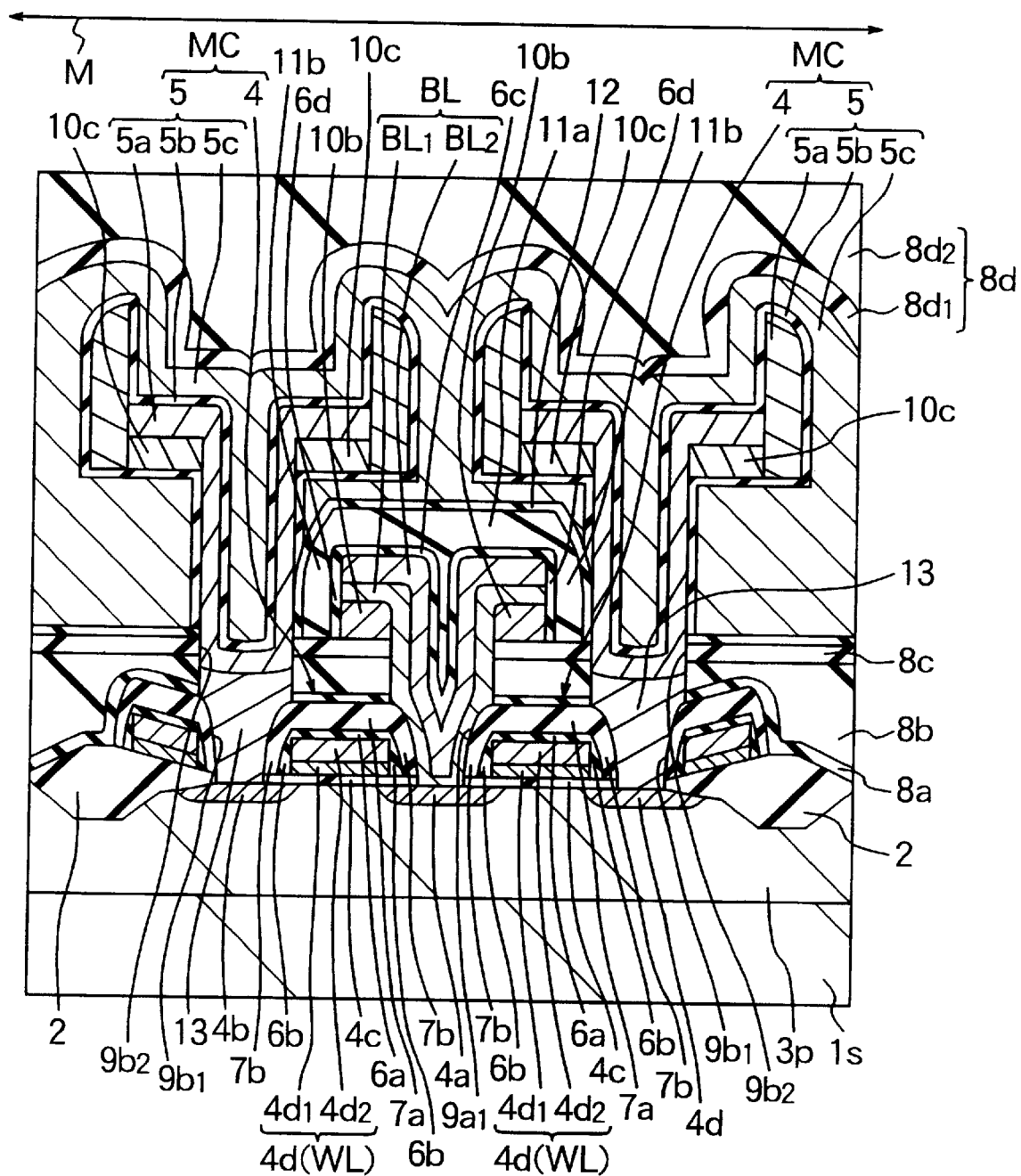
FIG. 2 is a sectional view of a principal portion of a memory cell section of the semiconductor integrated circuit device illustrate in FIG. 1.

A sectional view of a principal portion of this DRAM in the memory cell section is shown in FIG. 2. Top views of a principal portion of this DRAM in the memory cell section are shown in FIGS. 3 through 6. A sectional view of a principal portion of this DRAM in the peripheral circuit section is shown in FIG. 7. The memory cell section M of FIG. 2 is represented by a sectional view taken along II—II lines of FIGS. 3 through 6.

A semiconductor substrate 1s included in the DRAM is preferably made of a silicon (Si) single crystal of p-type. On the semiconductor substrate 1s, an isolating field insulating film 2 is formed.

Figure 3:
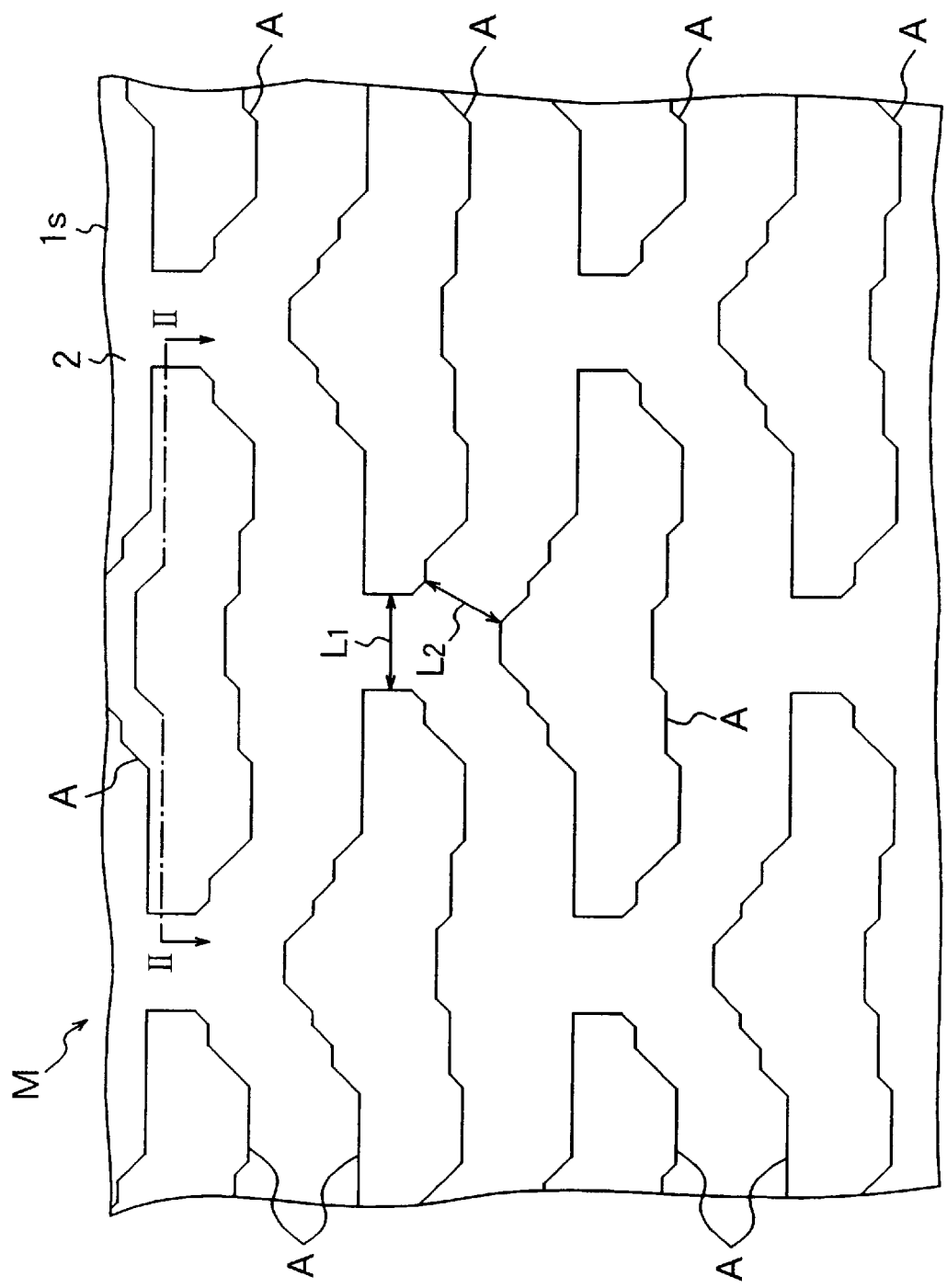
FIG. 3 is a top view of a principal portion of a unit active region of a memory cell section illustrated in FIG. 2.

The field insulating film 2 is preferably made of silicon dioxide ($SiO_2$). As shown in FIG. 3, a region surrounded by the field insulating film 2 becomes a unit active region A of the device.

The unit active region A is formed so as to take the shape of a planar inverted letter V. The active regions A are disposed at determined spaces L1 along the lateral direction of FIG. 3. However, unit active regions A which are adjacent to each other in the longitudinal direction of FIG. 3 are disposed so as to be relatively deviated in the lateral direction by half of the lateral length. Preferably, the space L1 between active regions in the lateral direction is approximately 0.4 μm. A length L2 represents a minimum distance between adjacent unit active regions. Preferably, the length L2 is approximately 0.35 μm in FIG. 3.

In a main surface of the semiconductor substrate 1s in a memory cell section M, a p-well 3p is formed. Into the p-well 3p, preferably boron has been introduced as a p-type impurity. On the p-well 3p, a memory cell MC is formed.

The memory cell MC includes one memory cell selection MOSFET (hereafter referred to as selection MOS) 4 (corresponding to Qs in the above described circuit diagram) and one capacitor 5 (corresponding to C in the above described circuit diagram). Preferably, the size of the one memory cell is approximately 1.15 μm².

The selection MOS 4 has one pair of semiconductor regions 4a and 4b formed on the resulting semiconductor substrate 1s so as to be spaced apart from each other, a gate insulating film 4c formed on the resulting semiconductor substrate 1s, and a gate electrode 4d formed on the gate insulating film 4c.

The semiconductor regions 4a and 4b are regions for forming a source region and a drain region of the selection MOS 4. Into the semiconductor regions 4a and 4b, an n-type impurity such as phosphorus or arsenic (As) has been introduced. Between the semiconductor regions 4a and 4b, a channel region of the selection MOS 4 has been formed.

The gate insulating film 4c is preferably made of $SiO_2$. The gate electrode 4d is formed by forming a conductor film 4d2 preferably made of tungsten silicide ($WSi_2$) on a conductor film 4d1 preferably made of a low-resistance polysilicon film. The resistance of the gate electrode 4d is reduced by the conductor film 4d2. The gate electrode 4d may be formed by a single substance film of low-resistance poly-silicon, or it may be formed by a predetermined metal such as tungsten.

Figure 4:
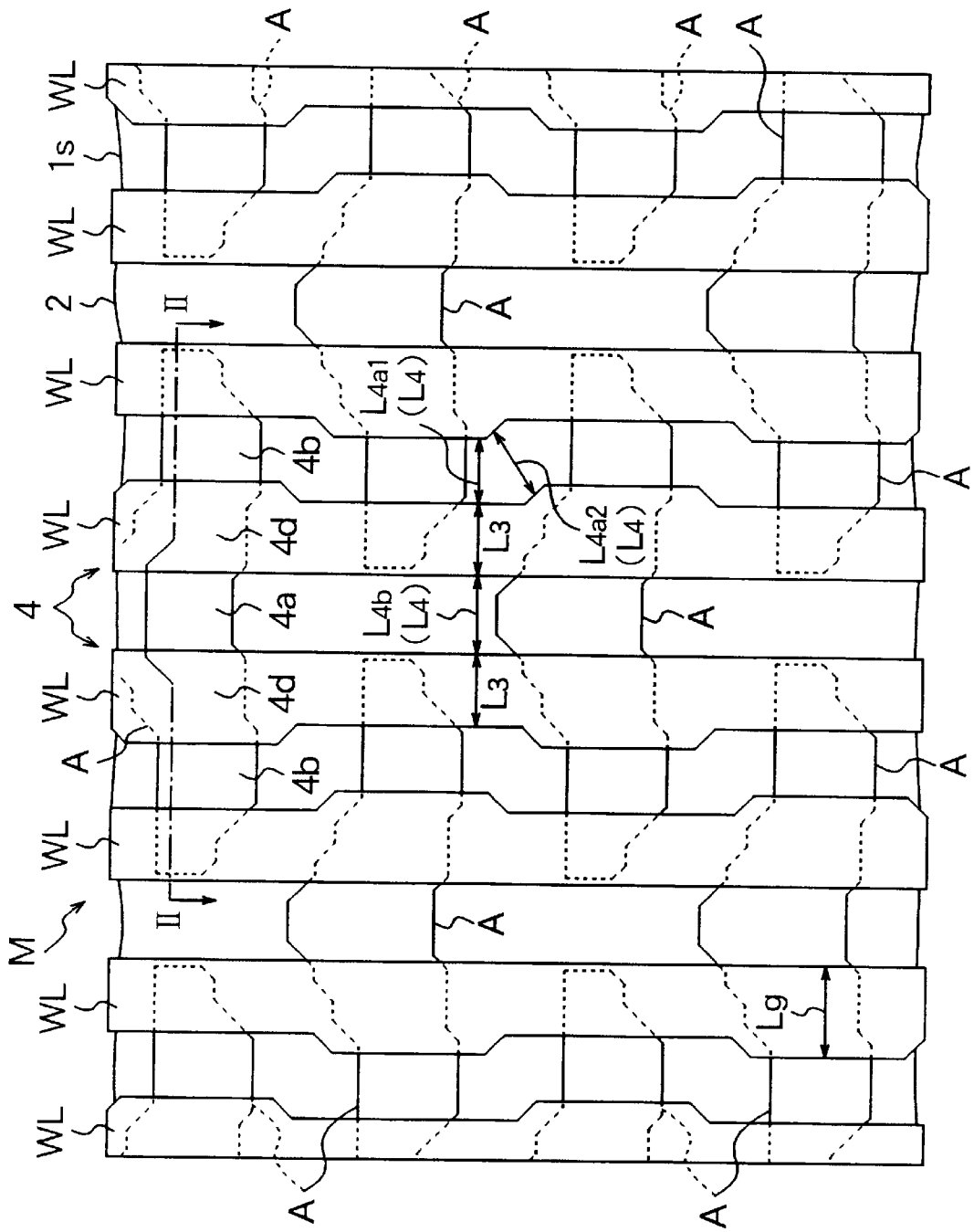
FIG. 4 is a top view of a principal portion of word line conductors of the memory cell section illustrated in FIG. 2.

The gate electrode 4d is also a part of a word line conductor WL (hereafter also referred to simply as word line). As shown in FIG. 4, the word lines WL are formed to extend linearly in a direction perpendicular to the direction in which the above described active regions A extend.

Portions of the word line WL which cross the unit active region A are expanded portions forming gate electrodes 4d of the selection MOS 4. The expanded portions have a fixed width (Lg) required to obtain a predetermined threshold voltage. The expanded portions are wider in width than other portions of the word line WL. Preferably, the width Lg of the expanded portions of the word line WL is approximately 0.44 µm. Preferably, a width L3 of narrow width portions of the word line WL is approximately 0.3 µm.

The expanded portions of the word line WL are forming by making portions of the word line WL project from one side of the word line WL. However, the word lines WL which are adjacent to each other so as to respectively have projections facing each other are disposed so that projection positions respectively of the adjacent word lines WL will be deviated from each other in the longitudinal direction (length direction) of FIG. 4, i.e., so that a projection of a word line WL will engage with an indent of its adjacent word line WL.

In the present embodiment, spaces L4a1 and L4a2 between the word lines WL which are adjacent to each other so as to respectively have projections facing each other are always constant in the direction in which the word lines WL extend. Preferably, the spaces L4a1 and L4a2 are set equal to approximately 0.3 µm. Furthermore, a space L4b between word lines WL which are adjacent to each other so that sides having no projections will face each other is also always constant in the direction in which the word lines WL extend. Preferably, the space L4b is set equal to approximately 0.3 µm.

In the present embodiment, the spaces L4a1 and L4a2 and the space L4b between word lines WL which are adjacent to each other are set so as to become always constant in each space line. Furthermore, the space L4 between the adjacent word lines WL is set equal to the width L3 of the thin portion of the word lines WL.

The upper and side surfaces of each of the gate electrode 4d (word line WL) are covered with a cap insulating film (first cap insulating film) 7a and side walls (first side wall insulating films) 7b via insulating films 6a and 6b. The cap insulating film 7a and the side walls 7b are covered with inter-layer insulating films 8a through 8c.

In the inter-layer insulating films 8a through 8c, a contact hole 9a1 is formed so as to expose the semiconductor region 4a located on the surface of the resulting semiconductor substrate 1s. In the inter-layer insulating films 8a and 8b, a contact hole (lower contact hole) 9b1 is formed so as to expose the semiconductor region 4b located on the other surface of the resulting semiconductor substrate 1s. Preferably, dimensions of the contact holes 9a1 and 9b1 are approximately 0.36 µm by 0.36 µm.

The insulating films 6a and 6b are preferably made of $SiO_2$. In the present embodiment, the cap insulating film 7a and the side walls 7b are preferably made of silicon nitride.

In forming the cap insulating film 7a and the side walls 7b, the insulating films 6a and 6b function to prevent the inside of a film forming processor from being polluted with metal elements contained in the conductor film 4d2.

In forming the contact holes 9a1 and 9b1 in the inter-layer insulating films 8a and 8b, the cap insulating film 7a and the side walls 7b serve as etching stoppers. The cap insulating film 7a and the side walls 7b serve as films for forming contact holes 9a1 and contact holes 9b1 between adjacent word lines WL in a self-aligned manner. In other words, the cap insulating film 7a and the side walls 7b define dimensions of the contact holes 9a1 and 9b1 in the width direction of the word lines WL.

Even if the contact holes 9a1 and 9b1 are deviated in the width direction of the word lines WL (lateral direction of FIG. 3), the cap insulating film 7a and the side walls 7b serve as the etching stoppers and consequently exposure of a part of the word line WL from the contact holes 9a1 and 9b1 is prevented. Therefore, alignment tolerance of the contact holes 9a1 and 9b1 can be reduced.

Even if the contact holes 9a1 and 9b1 are deviated in the length direction of the word line WL (vertical direction of FIG. 3), the thickness of the inter-layer insulating films 8a and 8b is secured to some degree and consequently the upper surface of the semiconductor substrate 1s is prevented from being exposed from the contact holes 9a1 and 9b1.

The inter-layer insulating film 8a is preferably made of $SiO_2$. The inter-layer insulating film 8b is preferably made of BPSG (Boro Phospho Silicate Glass). The inter-layer insulating film 8a functions to prevent boron or phosphorus contained in the inter-layer insulating film 8b located on the film 8a from being diffused to the resulting semiconductor substrate 1s located under the film 8a.

Furthermore, the inter-layer insulating film 8b functions to make the underlayer of the wiring layer flat. Thereby, the margin of the photolithography can be secured, and the pattern transfer precision of the contact holes 9a1 and 9b1 and the wiring can be improved.

On the inter-layer insulating film 8b, the inter-layer insulating film 8c preferably made of $SiO_2$ is formed. If a portion of the cap insulating film 7a is exposed from the inter-layer insulating film 8b, the exposed portion might be etched and the word line WL might be exposed in a bit line forming process which will be described later. The inter-layer insulating film 8c functions to prevent it. In the case where such a problem does not occur, therefore, the inter-layer insulating film may not be provided.

On the inter-layer insulating film 8c, a bit line conductor (hereafter also referred to simply as bit line) BL is formed. The bit line BL is formed by forming a conductor film (second conductor film) BL2 preferably made of $WSi_2$ on a conductor film (first conductor film) BL1 preferably made of low-resistance poly-silicon. The bit line BL is electrically connected to the semiconductor region 4a via the contact hole 9a1.

Between the conductor film BL1 and the inter-layer insulating film 8c, a mask film (second mask film) 10b used as an etching mask in forming the contact hole 9a1 is left. This mask film 10b is a film for raising the etching selection ratio in forming the contact hole 9a1. The mask film 10b is preferably made of low-resistance poly-silicon. The mask film 10b is also a part of a bit line BL.

Figure 5:
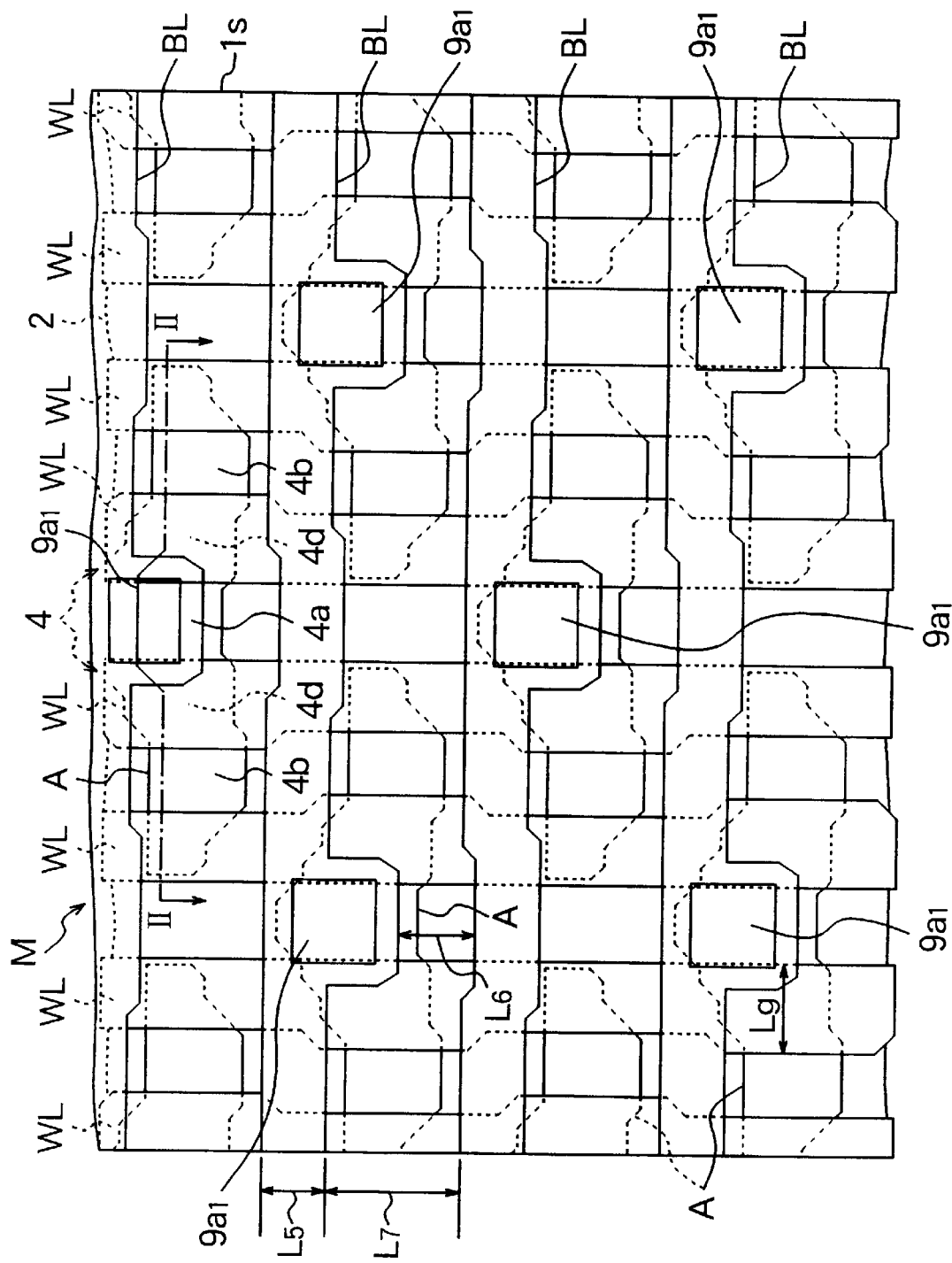
FIG. 5 is a top view of a principal portion of bit line conductors of the memory cell section illustrated in FIG. 2.

A top view of the bit line conductors BL and the bit line contact holes 9a1 is shown in FIG. 5. The bit line conductor BL extends linearly in the lateral direction of FIG. 5 so as to cross the word line conductor WL (preferably so as to be nearly perpendicular to the word line conductor WL). In the bit line BL, a projection or an expanded portion is formed in a portion located in the center of the active region A. In the projection, the bit line contact hole 9a1 is disposed.

It is not always necessary to square the center line of the bit line conductor BL with the center of the bit contact hole 9a1. In the case where the center line of the bit line conductor BL is not squared with the center of the bit contact hole 9a1, however, the bit line BL needs a projection for completely surrounding the capacitor contact holes 9a1.

If the above described projection is formed on the bit line conductor BL, there is a possibility that a short-circuit defect between the projection and a bit line conductor BL adjacent to the projection will occur. Therefore, a portion of the bit line BL adjacent to the projection facing the projection is slightly bent so as to be separated from the projection.

Preferably, a width L5 of the bit line conductor BL is approximately 0.28 μm. Preferably, a space L6 between the projection of the bit line conductor BL and its adjacent bit line conductor BL is approximately 0.3 μm. Preferably, a space L7 between adjacent bit line conductors is approximately 0.58 μm.

The upper and side surfaces of the bit line BL are covered with a cap insulating film (second cap insulating film) 11a and side walls (second side wall insulating films) 11b via insulating film 6c and 6d. The cap insulating film 11a and the side walls 11b serve as etching stoppers in forming a contact hole 9b2 in the inter-layer insulating film 8c, and serve as films for forming the contact hole 9b2 between adjacent bit lines BL in a self-aligned manner. In other words, the cap insulating film 11a and the side walls 11b define the dimensions of the contact holes 9b1 and 9b2 in the width direction of the bit line BL.

Even if the contact holes 9b1 and 9b2 are deviated in the width direction of the bit lines BL (vertical direction of FIG. 4), the cap insulating film 11a and the side walls 11b serve as the etching stoppers and consequently the contact holes 9b1 and 9b2 are prevented from getting into the isolating region excessively. Therefore, the alignment tolerance of the contact holes 9b1 and 9b2 can be reduced.

Furthermore, the cap insulating film 11a and the side walls 11b are covered with an insulating film 12. The insulating film 12 is a film functioning as an etching stopper in removing an underlying insulating film left after the capacitor 5 has been formed. The insulating film 12 is made of silicon nitride.

The thickness of the insulating film 12 is set to a value in the range of 100 to 500 Å, preferably to approximately 250 Å. Because, in final hydrogen annealing processing for terminating a dangling bond, a thickness greater than this value causes hydrogen to be seized by the silicon nitride film or prevented from moving and makes a sufficient terminating effect unobtainable.

Over the bit line BL, the capacitor 5 preferably taking the shape of a cylinder is formed. In other words, the DRAM of the present embodiment has the COB structure. The capacitor 5 is formed by covering the surface of a first electrode (third conductor film) 5a with a second electrode 5c via a capacitor insulating film 5b.

The first electrode 5a is preferably made of low-resistance poly-silicon. The first electrode 5a is electrically connected to one semiconductor region 4b of the selection MOS 4 through a conductor film (first conductor film) 13 embedded in the contact hole 9b1. The conductor film 13 is preferably made of low-resistance poly-silicon.

Figure 6:
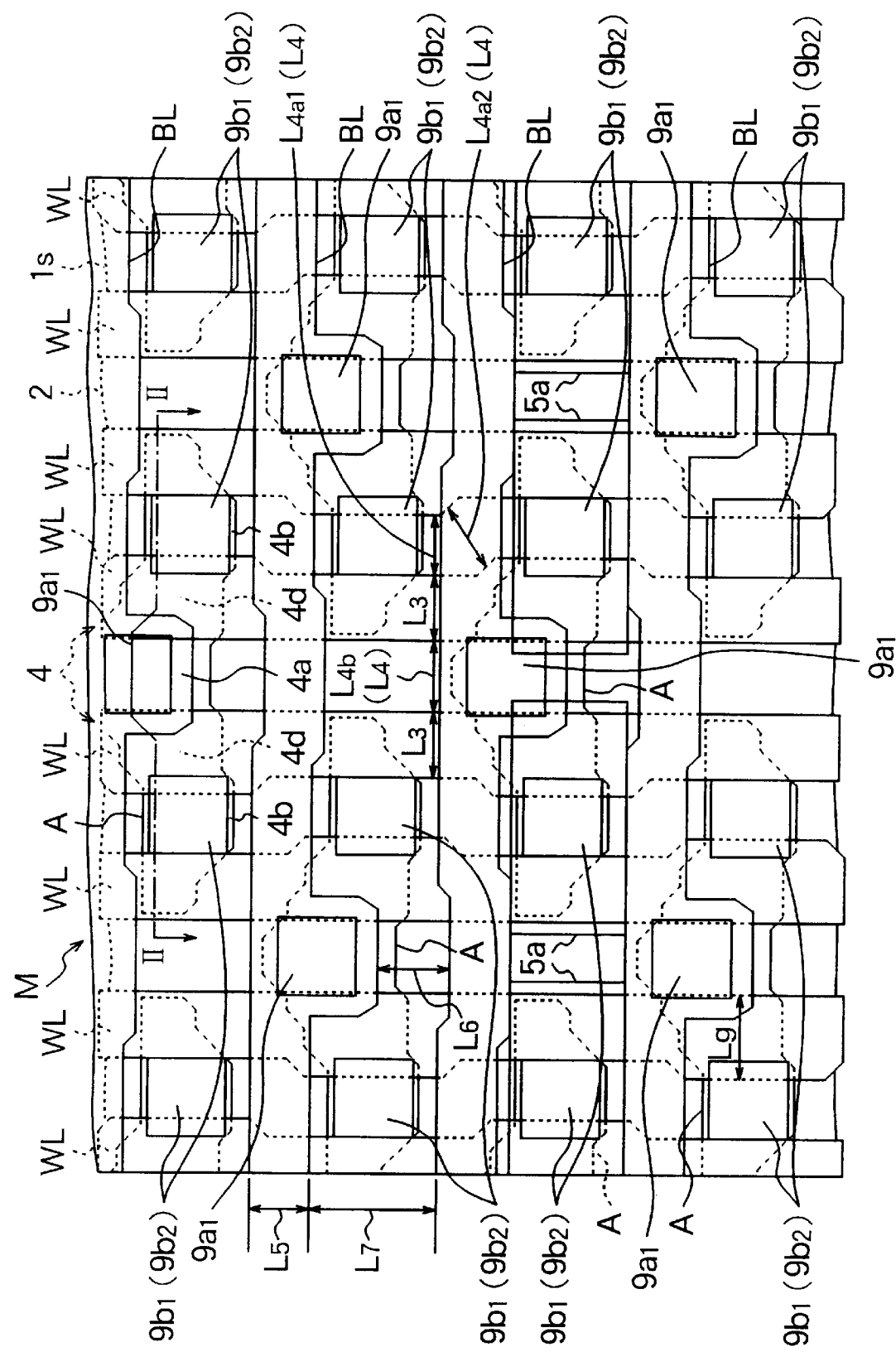
FIG. 6 is a top view of a principal portion of a first capacitor electrode of the memory cell section illustrated in FIG. 2.
Figure 7:
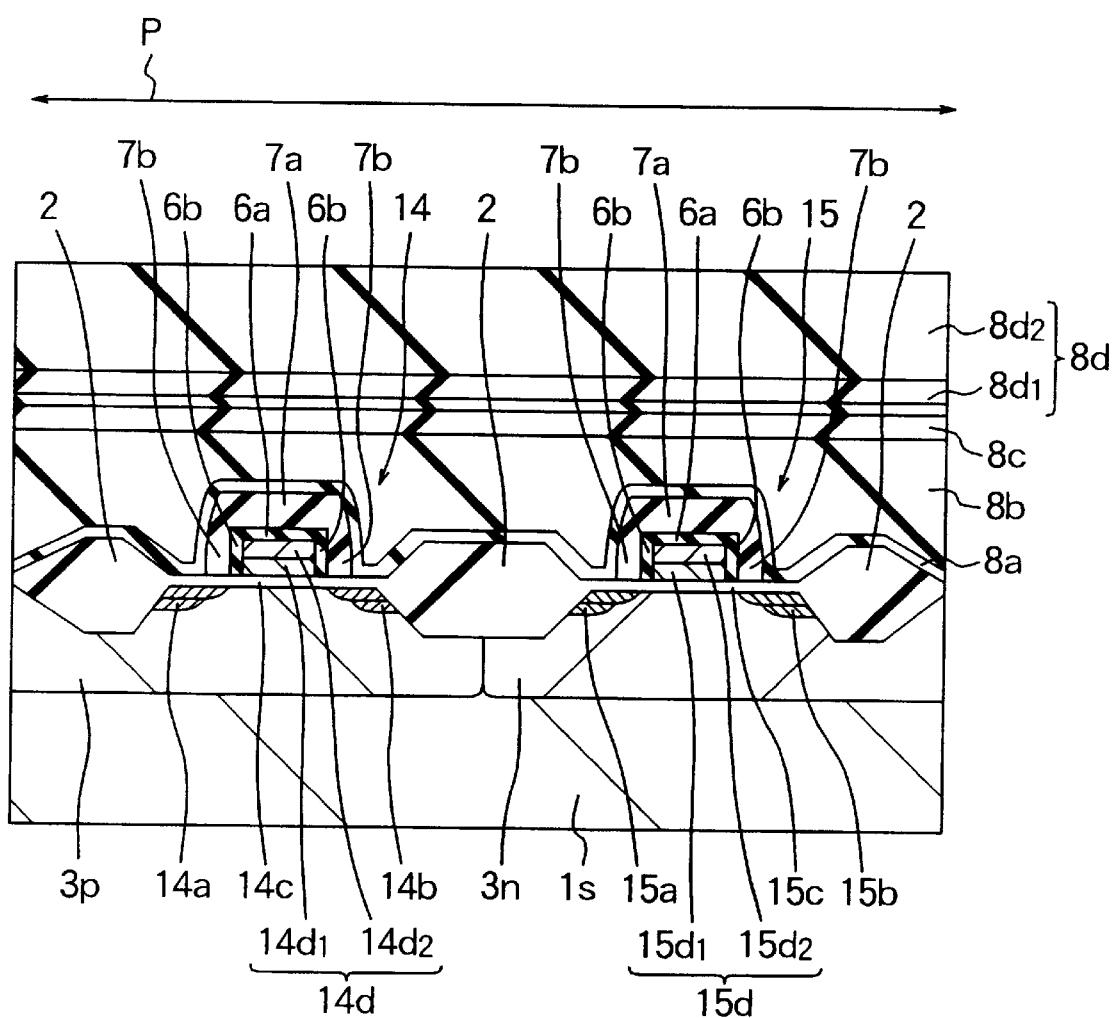
FIG. 7 is a sectional view of a principal portion of a peripheral circuit section of the semiconductor circuit device illustrated in FIG. 1.

A top view of the first electrodes 5a (only shown for one line for simplicity's sake) of the capacitor 5 and the contact holes 9b1 and 9b2 for the capacitor 5 is shown in FIG. 6. One first electrode 5a is disposed on each side of the contact hole 9a1 for the bit line BL. Each of the first electrodes 5a is formed to take the shape of a rectangle so as to stride over preferably two adjacent word lines WL. Preferably, the length of the first electrode 5a in the lateral direction is approximately 14 μm. Preferably, the length of the first electrode 5a in the longitudinal direction is approximately 0.56 μm.

The capacitor insulating film 5b is preferably formed by forming a $SiO_2$ film on a silicon nitride film. The second electrode 5c is preferably made of low-resistance poly-silicon, and it is electrically connected to predetermined wiring conductors.

A mask film (third mask film) 10c located under the first electrode 5a of the capacitor 5 is a film which was used as the mask when the contact hole 9b2 was opened. The mask film 10c is made of low-resistance poly-silicon, and it is a part of the first electrode 5a of the capacitor 5.

With reference to FIG. 7, the p-well 3p and an n-well 3n are formed on the semiconductor substrate 1s in a peripheral circuit section P. Into the p-well 3p, preferably boron functioning as a p-type impurity has been introduced. Into the n-well 3n, phosphorus or As functioning as an n-type impurity has been introduced. On the p-well 3p and the n-well 3n, preferably an nMOS 14 and a pMOS 15 are formed.

By these nMOS 14 and pMOS15, peripheral circuits of the DRAM such as a sense amplifier circuit, colomn decoder circuit, column driver circuit, row decoder circuit, row driver circuit, I/O selector circuit, data input buffer circuit, data output buffer circuit and power supply circuit are formed.

The nMOS 14 has one pair of semiconductor regions 14a and 14b formed on the p-well 3p so as to be spaced apart from each other, a gate insulating film 14c formed on the resulting semiconductor substrate 1s, and a gate electrode 14d formed on the gate insulating film 14c.

The semiconductor regions 14a and 14b are regions for forming the source region and drain region of the nMOS 14, respectively. In the semiconductor regions 14a and 14b, preferably phosphorus or As functioning as an n-type impurity has been introduced. Between the semiconductor regions 14a and 14b, the channel region of the nMOS 14 is formed.

The gate insulating film 14c is preferably made of $SiO_2$. The gate electrode 14d is formed preferably by forming a conductor film 14d2 made of $WSi_2$ on a conductor film 14d1 made of low-resistance poly-silicon. The gate electrode 14d may be preferably formed by a single substance film of low-resistance silicon or may be formed by metal.

On the upper and side surfaces of the gate electrode 14d, a cap insulating film 7a and side walls 7b are formed via insulating films 6a and 6b. The insulating films 6a and 6b have the same function as the insulating films 6a and 6b of the above described memory cell section M do, and they are preferably made of $SiO_2$.

The cap insulating film 7a and the side walls 7b are preferably made of silicon nitride. In this case, however, the side wall 7b is a film for mainly forming a LDD (Lightly Doped Drain) structure.

The pMOS 15 has one pair of semiconductor regions 15a and 15b formed on the n-well 3n so as to be spaced apart from each other, a gate insulating film 15c formed on the resulting semiconductor substrate 1s, and a gate electrode 15d formed on the gate insulating film 15c.

The semiconductor regions 15a and 15b are regions for forming the source region and drain region of the pMOS 15, respectively. Into the semiconductor regions 15a and 15b, preferably phosphorus functioning as a p-type impurity has been introduced. Between the semiconductor regions 15a and 15b, the channel region of the pMOS 15 is formed.

The gate insulating film 15c is preferably made of $SiO_2$. The gate electrode 15d is formed preferably by forming a conductor film 15d2 made of $WSi_2$ on a conductor film 15d1 made of low-resistance poly-silicon. The gate electrode 15d may be formed by a single substance film or may be formed by metal.

On the upper and side surfaces of the gate electrode 15d, a cap insulating film 7a and side walls 7b are formed via an insulating film 6a and insulating films 6b. The insulating films 6a and 6b have the same function as the insulating films 6a and 6b of the above described memory cell section M do, and they are preferably made of $SiO_2$.

The cap insulating film 7a and the side walls 7b are preferably made of silicon nitride. In this case, however, the side wall 7b is a film for mainly forming the LDD structure.

The nMOS 14 and the pMOS 15 are covered with the above described inter-layer insulating films 8a through 8c. On the inter-layer insulating film 8c, the above described insulating film 12 is formed. In the memory cell section M and the peripheral circuit section P, an inter-layer insulating film 8d is formed on the insulating film 12. The second electrode 5c of the capacitor 5 is covered with the inter-layer insulating film 8d.

The inter-layer insulating film 8d is formed by forming an insulating film 8d2 preferably made of BPSG on an insulating film 8d1 preferably made of $SiO_2$. The insulating film 8d1 functions to prevent boron or phosphorus contained in the inter-layer insulating film 8d2 located on the film 8d1 from being diffused toward the second electrode 5c of the capacitor 5.

A photomask (including a reticle) used in an exposure process which is a process for manufacturing a semiconductor integrated circuit device of the present embodiment will now be described by referring to FIGS. 8 through 21. In FIGS. 8, 10, 13, 15 and 19, opaque areas are represented by oblique lines and areas in which a phase shifter is disposed are shaded with dots for legibility of the drawing. Each of the opaque areas is formed preferably by using a chrome (Cr) film. The mask substrate is formed preferably by using synthetic quartz.

Figure 8:
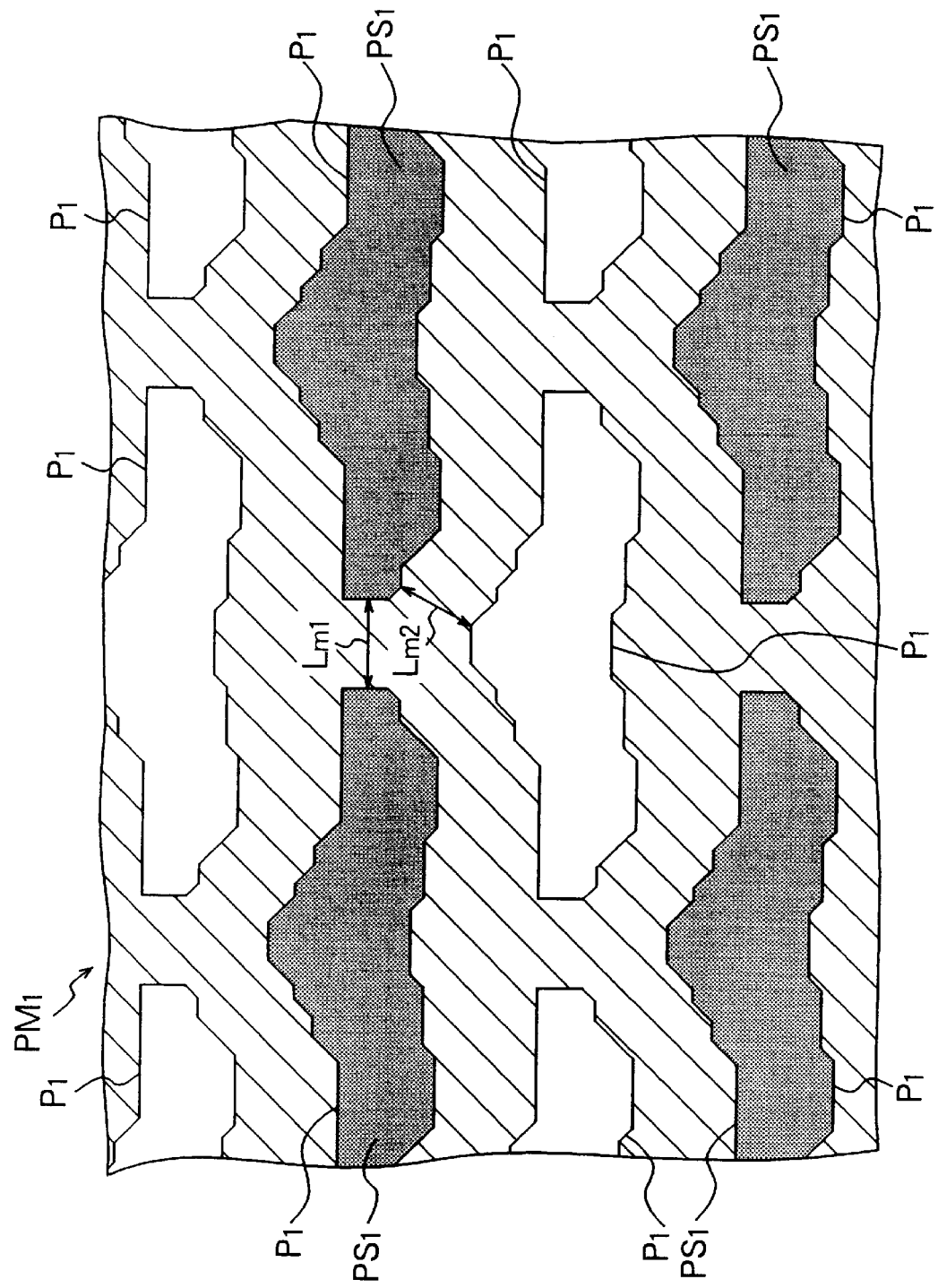
FIG. 8 is a top view of a principal portion of a photomask used in an exposure process in manufacturing a semiconductor integrated circuit device according to an embodiment of the present invention.

FIG. 8 is a top view of a principal portion of a photomask PM1 used to form the field insulating film 2 and the unit active areas (see FIGS. 2 and 3) in the memory cell section M of the above described DRAM.

In the photomask PM1, a plurality of transparent areas P1 each preferably taking the shape of a planar inverted V are arranged regularly. The transparent areas P1 are arranged with a predetermined distance Lm1 between in the lateral direction of FIG. 8. However, transparent areas which are adjacent to each other in the longitudinal direction of FIG. 8 are arranged so that respective centers will be displaced relatively in the lateral direction of FIG. 8 by half of the lateral length. Preferably, the distance Lm1 is approximately 2 µm. Preferably, the minimum distance Lm2 between adjacent areas P1 is approximately 1.75 µm.

In the row of transparent areas P1 arranged in the longitudinal direction of FIG. 8, phase shifters PS1 are arranged every other row so as to be superimposed on transparent areas P1. Each of the phase shifters PS1 functions to change the phase of the transmitted light (e.g., a substantially 180° phase shift may be effected). Each of the phase shifters PS1 is formed by forming a transparent insulating film preferably made of silicon dioxide on the photomask PM1 preferably by using the SOG method and thereafter patterning the insulating film by using the photolithography technique and the dry etching technique.

Figure 9:
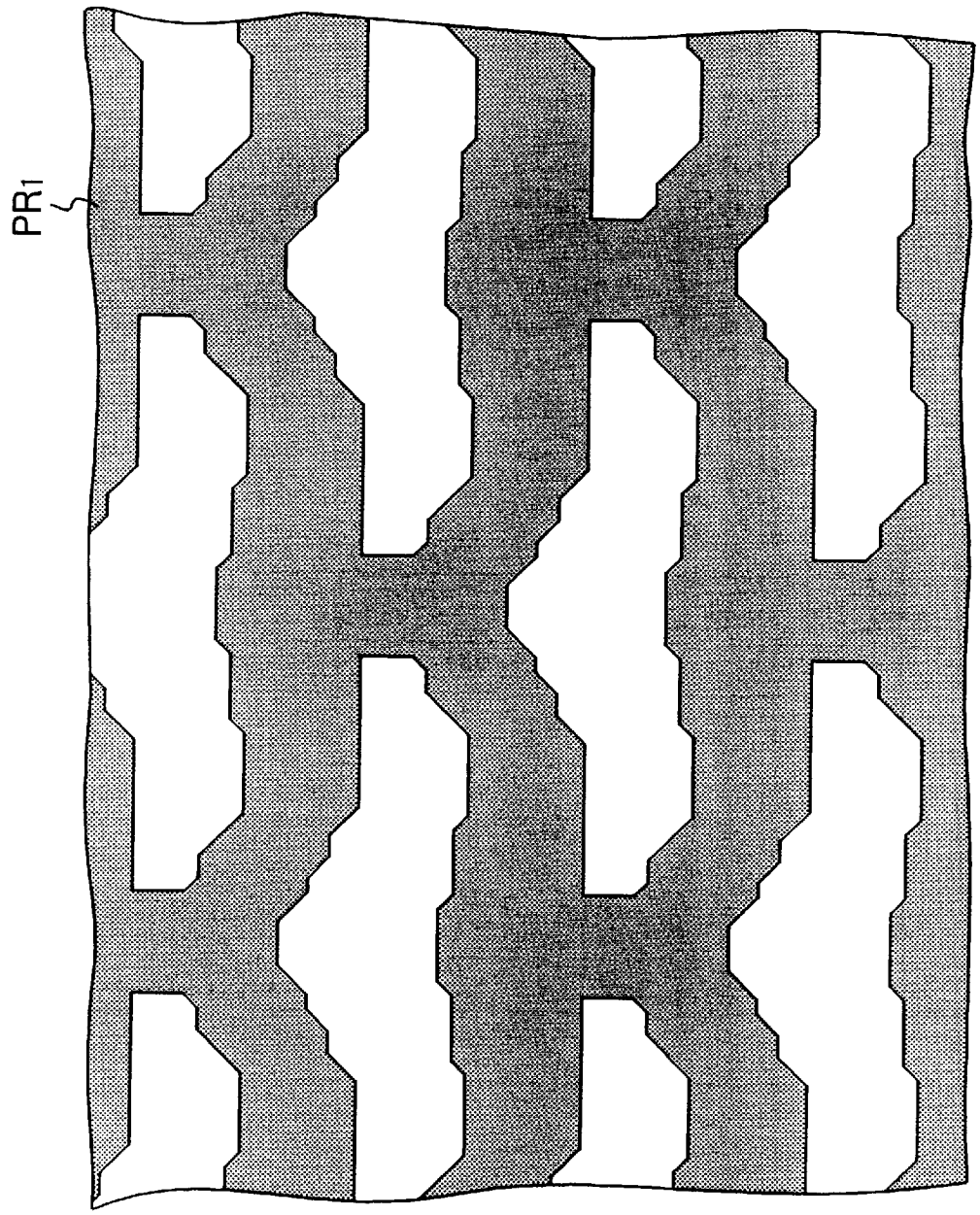
FIG. 9 is a top view of a pattern transferred by using the photomask illustrated in FIG. 8.

A pattern transferred onto a positive-type photoresist film by using such a photomask PM1 is shown in FIG. 9. Shaded portions with dots represent portions in which a photoresist film PR1 is left. Clear portions represent portions from which the photoresist film PR1 has been removed. Alternatively, the photoresist film may be left in clear portions of FIG. 9 by making the photoresist film PR1 negative type.

Figure 10:
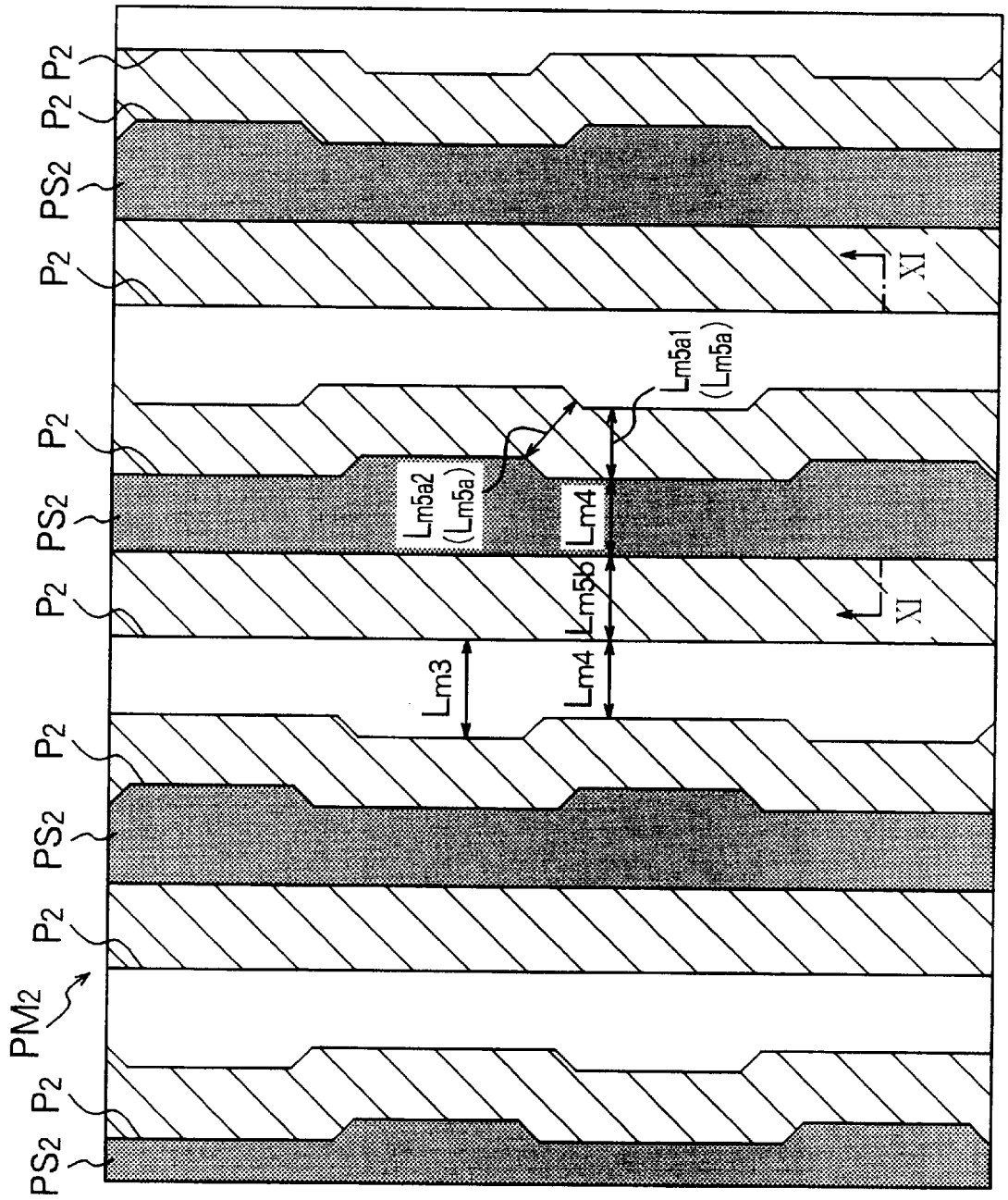
FIG. 10 is a top view of a principal portion of a photomask used to transfer a word line pattern in an exposure process in manufacturing a semiconductor integrated circuit device according to an embodiment of the present invention.
Figure 11:
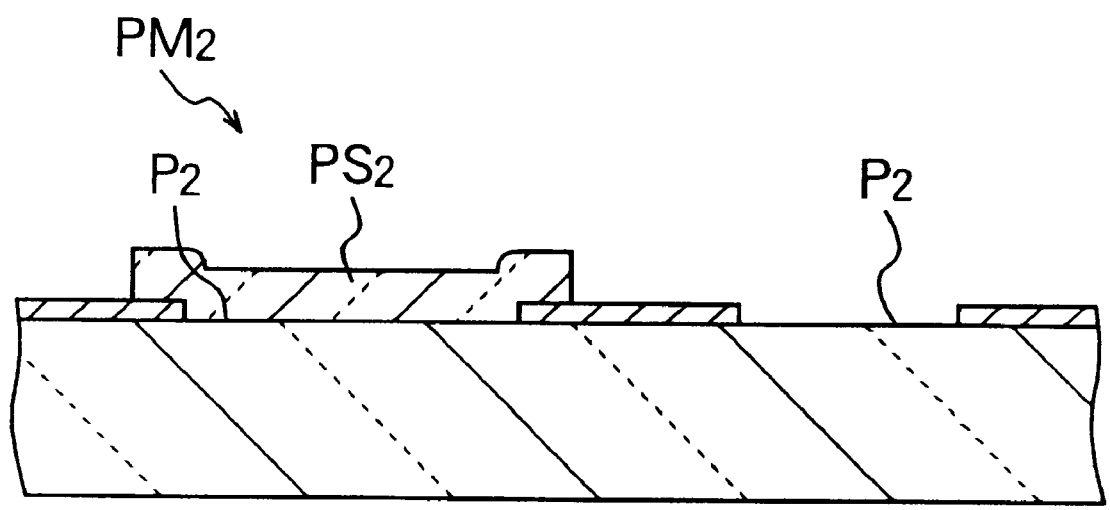
FIG. 11 is a sectional view taken along a XI—XI line of FIG. 10.

FIG. 10 is a top view of a principal portion of a photomask PM2 used to form the word lines WL (see FIGS. 2 and 4) in the memory cell section M of the above described DRAM. FIG. 11 is a sectional view taken along a XI—XI line of FIG. 10.

In the photomask PM2, a plurality of transparent areas P2 corresponding to word lines WL each taking the shape of, for example, a generally straight line are arranged or juxtaposed regularly along the lateral direction of FIG. 10. Namely, four successive transparent areas P2 and four opaque areas adjacent thereto are considered to form an arrangement unit, and such arrangement units are periodically juxtaposed with a fine interval Lm5b. In the column of transparent areas P2 arranged in the lateral direction of FIG. 10, phase shifters PS2 are arranged every other column so as to be superimposed on the transparent areas P2. The function, material, and forming method of the phase shifters PS2 are the same as those of the above described phase shifters PS1 (see FIG. 8).

In the transparent area P2, areas each having a projection from one side face into the lateral direction of FIG. 10 and having a wider width than other portions are formed at predetermined intervals in the extension direction of the transparent area P2. As for transparent areas P2 which are adjacent to each other in the lateral direction of FIG. 10, they are arranged so as to have positions of projected areas displaced from each other in the longitudinal direction of FIG. 10. Each of the wide areas of the transparent areas P2 has a width Lm3 which is preferably equivalent to approximately 2.2 µm, and each of the narrow areas has a width Lm4 which is preferably equivalent to approximately 1.5 µm.

In the present embodiment, the space (Lm5a (Lm5a1, Lm5a2)) between transparent areas P2 which are disposed adjacent to each other so that projections will face each other is substantially constant along the length direction and is set to be substantially 1.5 µm.

The space Lm5b between transparent areas P2 which are disposed adjacent to each other so that sides having no projections will face each other is also substantially constant along the length direction. For example, the space Lm5b is set to be substantially 1.5 µm.

In the present embodiment, the spaces Lm5a and Lm5b between transparent areas P2 adjacent to each other are constant along the respective length directions. While the spaces Lm5a and Lm5b between transparent areas P2 adjacent to each other are set equal to a width Lm4 of narrow areas of the transparent areas P2, the spaces Lm5a and Lm5b may be different from the width Lm4.

Owing to them, it becomes possible to conduct phase difference operation on light beams transmitted through transparent areas P2 adjacent to each other in the whole area between those transparent areas P2 well substantially according to the design. As a result, it becomes possible to form the shape and dimensions of a transfer pattern substantially according to the design.

Figure 12:
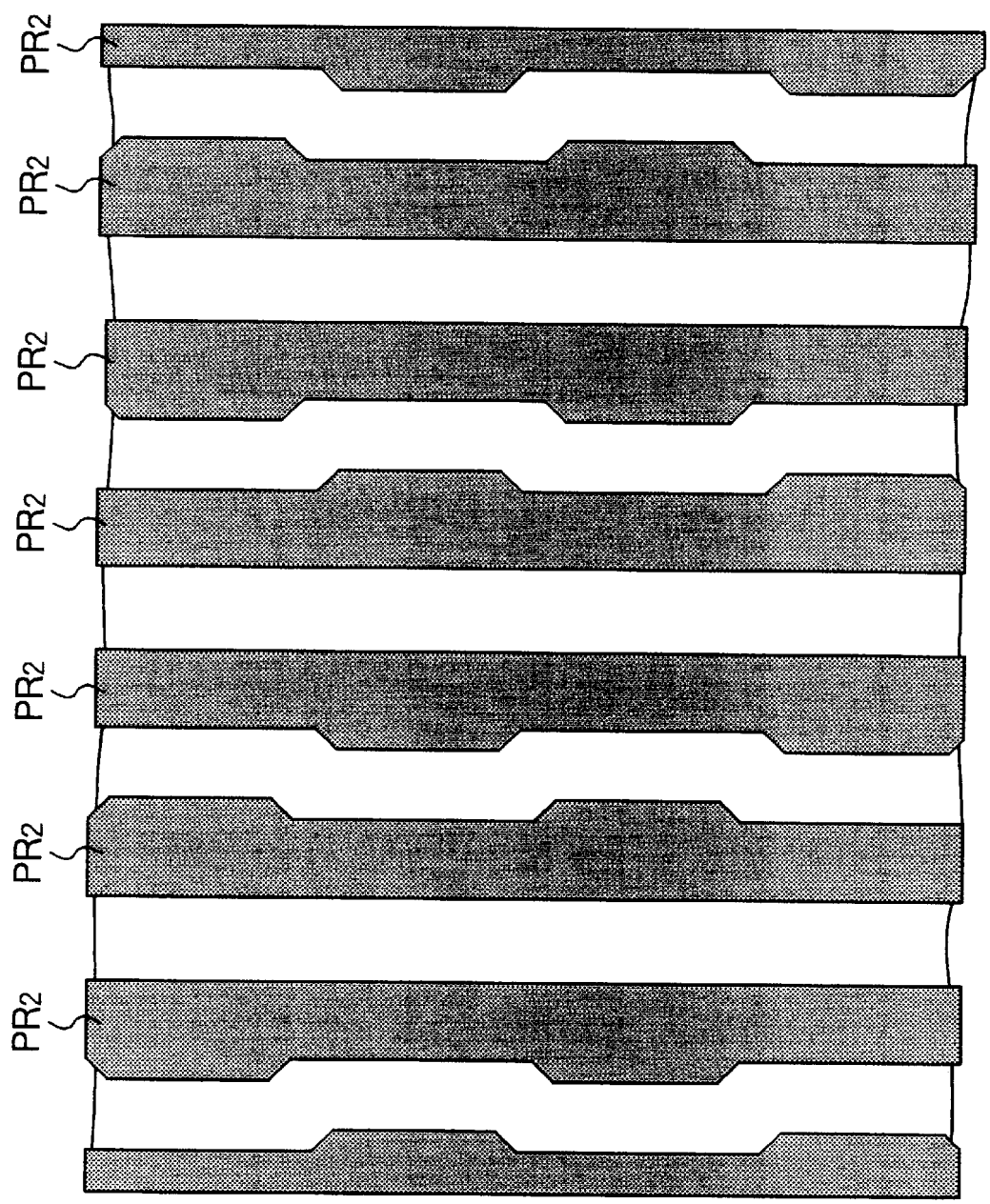
FIG. 12 is a top view of a pattern transferred by using the photomask illustrated in FIG. 10.

A pattern transferred onto a negative-type photoresist film by using such a photomask PM2 is shown in FIG. 12. In shaded portions with dots, the photoresist film PR2 is left. A pattern of the photoresist film PR2 taking the shape of a straight line and having wide-width areas with a predetermined space between is formed.

Clear portions are portions from which the photoresist film has been removed. Alternatively, the photoresist film may be left in the clear portions of FIG. 12 by making the photoresist film PR2 a positive type.

Figure 13:
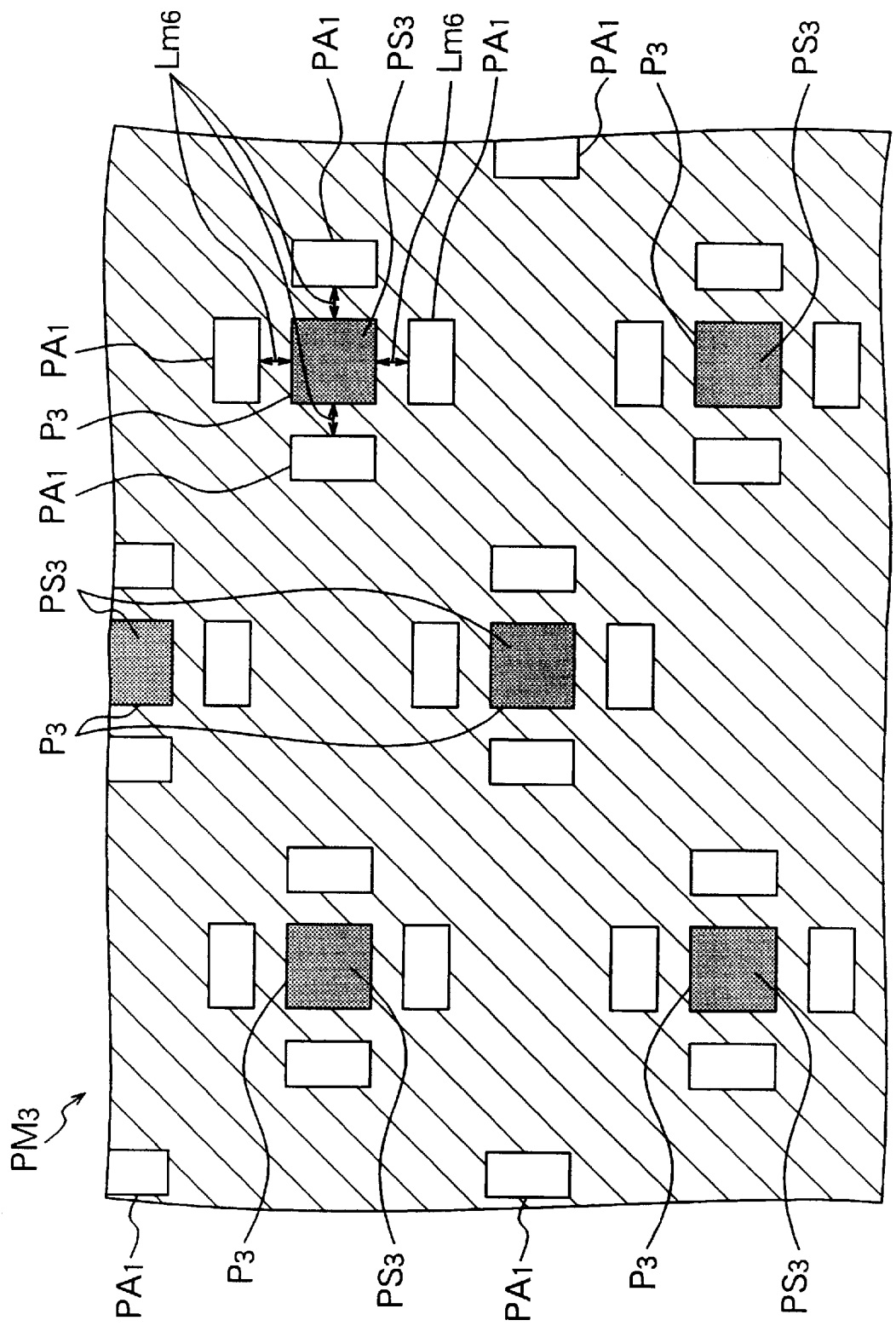
FIG. 13 is a top view of a principal portion of a photomask used to transfer a bit line contact hole pattern in an exposure process in manufacturing a semiconductor integrated circuit device.

FIG. 13 is a top view of a principal portion of a photomask PM3 used to form the bit line contact holes 9a1 (see FIGS. 2 and 5) in the memory cell section M of the above described DRAM. This photomask is the same as the photomask disclosed in previous U.S. patent application U.S. Ser. No. 08/600736 (filed on Feb. 13, 1996) assigned to Hitachi Ltd. which is one of assignees of the present application.

In the photomask PM3, a plurality of transparent areas P3 each preferably taking the shape of a square are arranged regularly. Preferably, each transparent area P3 is approximately 1.8 $\mu$m by 1.8 $\mu$m in dimensions.

In each transparent area P3, a phase shifter PS3 is disposed so as to be superimposed thereon. The function, material, and forming method of the phase shifters PS2 are the same as those of the above described phase shifters PS1 (see FIG. 8).

Near each of four sides of each of the transparent areas P3, an auxiliary pattern segment PA1 is disposed. The auxiliary pattern segment PA1 functions to generate a phase difference between light transmitted through the transparent area P3 and light transmitted through the auxiliary pattern segment PA1 and thereby enhance the edge contrast of the transfer pattern and transfer a favorable pattern. The auxiliary pattern segment has a transparent area preferably taking the shape of a rectangle.

Spaces Lm6 between the transparent area P3 and auxiliary pattern segments PA1 respectively located near four sides of the transparent area P3 are made equal and are set equal to preferably 0.8 $\mu$m. All of the auxiliary pattern segments PA1 have equal sizes. Preferably, the auxiliary pattern segments are approximately 1.0 $\mu$m by 1.7 $\mu$m in size.

Figure 14:
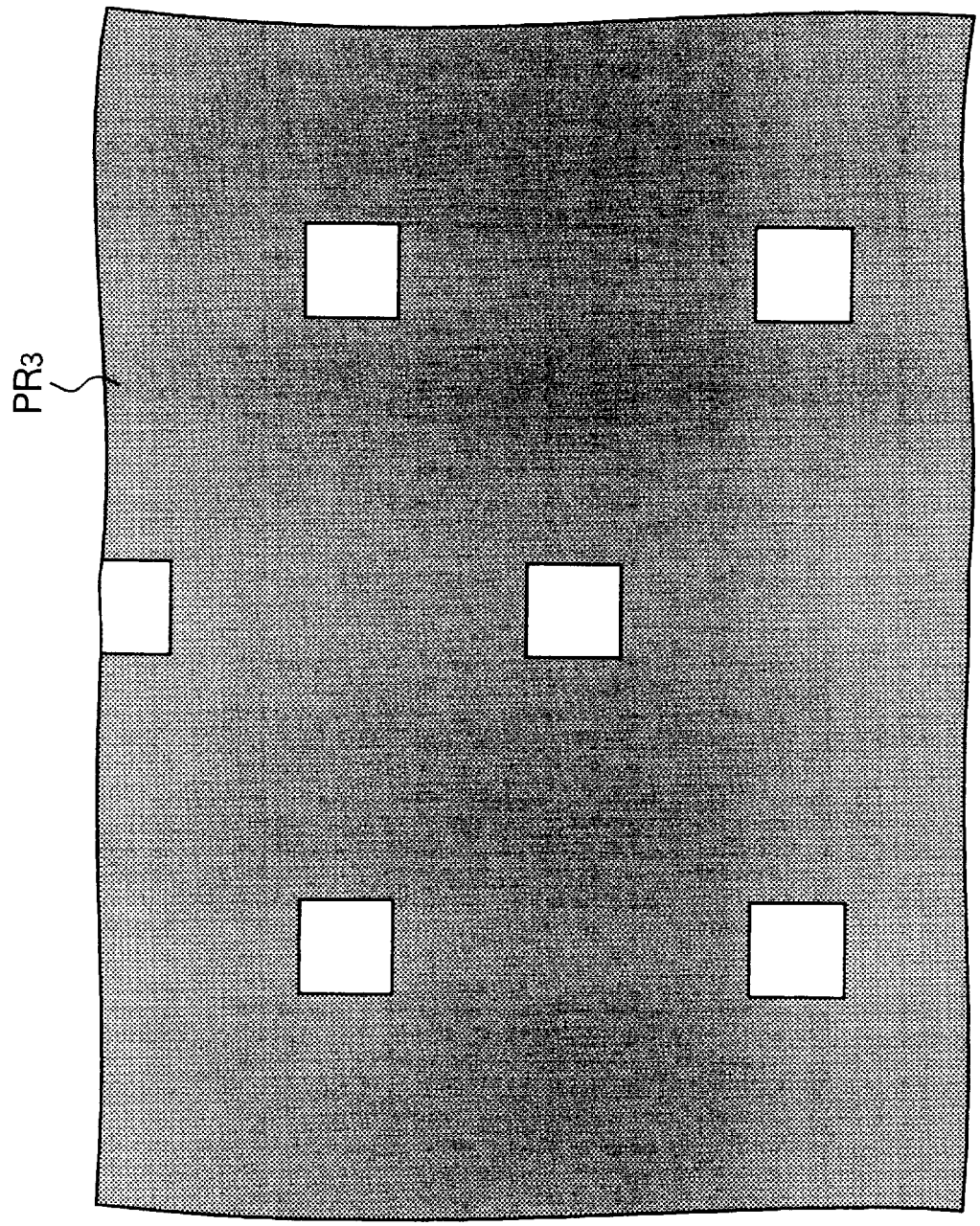
FIG. 14 is a top view of a pattern transferred by using the photomask illustrated in FIG. 13.

A pattern transferred onto a positive-type photoresist film by such a photomask PM3 is shown in FIG. 14. Shaded portions with dots represent portions in which a photoresist film PR3 is left. Square clear portions represent portions in which the photoresist film has been removed. Alternatively, the photoresist film may be left in clear portions of FIG. 14 by making the photoresist film PR3 negative type.

Figure 15:
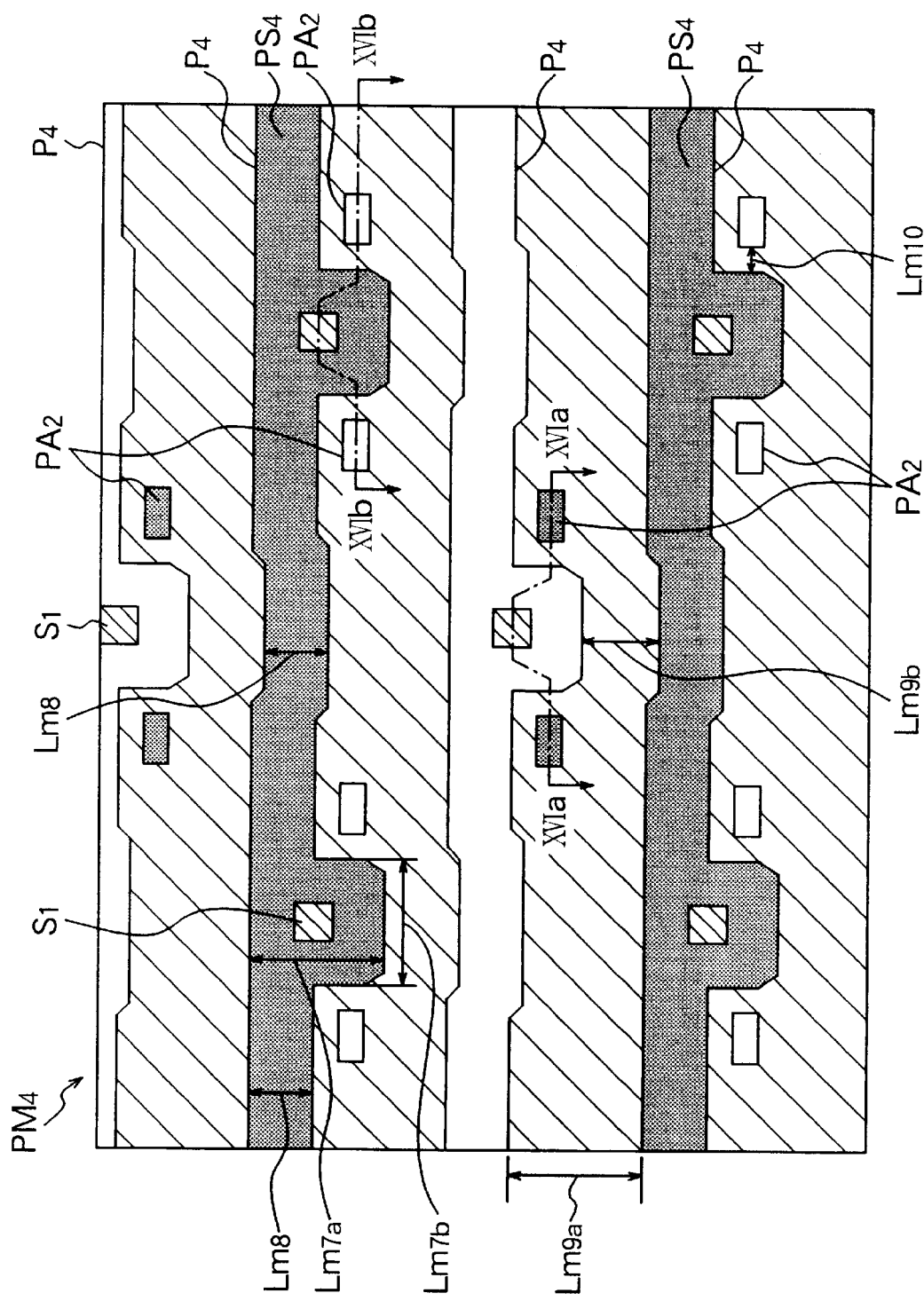
FIG. 15 is a top view of a principal portion of a photomask used to transfer a bit line pattern in an exposure process in manufacturing a semiconductor integrated circuit device according to an embodiment of the present invention.
Figure 16A:
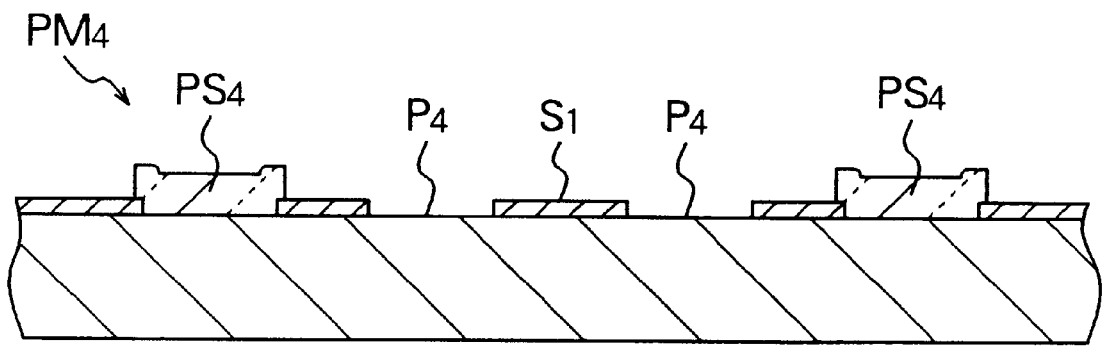
FIGS. 16a and 16b are sectional views taken along XVIa—XVIa and XVIb—XVIb lines of FIG. 15, respectively.
Figure 16B:
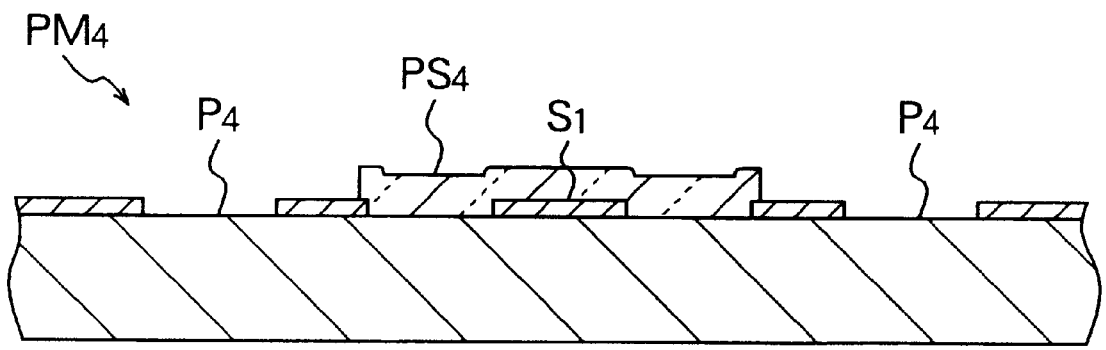

FIG. 15 is a top view of a principal portion of a photomask PM4 used to form the bit lines BL (see FIGS. 2 and 5) in the memory cell section M of the above described DRAM. FIGS. 16a and 16b are sectional views taken along a XVIa—XVIa line and a XVIb—XVIb line of FIG. 15, respectively.

In the photomask PM4, a plurality of transparent areas P4 corresponding to bit lines BL each taking the shape of, for example, a generally straight line are arranged or juxtaposed regularly along the lateral direction of FIG. 15. Namely, two successive transparent areas P4 and two opaque areas adjacent thereto are considered to form an arrangement unit, and such arrangement units are periodically juxtaposed with a fine interval Lm9a. In the column of transparent areas P4 arranged in the lateral direction of FIG. 15, phase shifters PS4 are arranged every other column so as to be superimposed on the transparent areas P4. The function, material, and forming method of the phase shifters PS4 are the same as those of the above described phase shifters PS1 (see FIG. 8).

In each transparent area P4, expanded portions are formed at predetermined intervals. Each expanded portion of each of the transparent areas P4 has a width Lm7a in the bit line width direction and a width Lm7b in the bit line length direction. Preferably, the width Lm7a is approximately 2.95 $\mu$m and the width Lm7b is approximately 3 $\mu$m. Each of narrow portions has a width Lm8. Preferably, the width Lm8 is approximately 1.4 $\mu$m. Preferably, the space Lm9a between bit lines is approximately 2.9 $\mu$m. Preferably, the space Lm9b between each expanded portion of a bit line and its adjacent bit line is approximately 1.5 $\mu$m.

In the present embodiment, an auxiliary opaque area S1 preferably taking the shape of a square is disposed in each of expanded portions of the transparent areas P4. Preferably, the auxiliary opaque area is approximately 0.2 $\mu$m by 0.2 $\mu$m in dimensions. The auxiliary opaque area is located preferably at a distance of approximately 1 $\mu$m from each of ends (three peripheries). The auxiliary opaque area S1 is provided to restrict the strength of light transmitted through the expanded portion of the transparent area P4 so as not to produce a large difference as compared with the strength of light transmitted through other portions of the area P4. The auxiliary opaque areas have shapes and dimensions lower than a resolution limit of an exposure apparatus in use.

Auxiliary pattern segments (auxiliary transparent areas) PA2 are disposed in an opaque area around the expanded portion of each transparent area P4. This auxiliary pattern segment PA2 is provided to prevent a transfer pattern portion located between the expanded portion and the narrow-width portion being made thinner by a large difference in area between the expanded portion and the narrow-width portion. In other words, the segment PA2 functions to make the strength of transmitted light nearly uniform over the whole length of the transparent area P4 in cooperation with the area S1. The segment PA2 is formed by a transparent area preferably taking the shape of a rectangle.

The transparent area P4 and the auxiliary pattern segment PA2 located near it are adapted so that light beams transmitted through them will have nearly opposite phases. In other words, in an auxiliary pattern segment PA2 located near a transparent area P4 having a phase shifter PS4 disposed therein, a phase shifter PS4 is not disposed. In an auxiliary pattern segment PA2 located near a transparent area P4 having no phase shifters PS4 therein, a phase shifter PS4 is disposed.

Preferably, each auxiliary pattern segment PA2 is approximately 0.1 $\mu$m by 0.2 $\mu$m in dimensions. As for a space Lm10 in the bit line length direction between each auxiliary pattern segment PA2 and the expanded portion of the transparent area P4, the space Lm10 on the left side of the expanded portion is made equal to that on the right side of the expanded portion in order to manipulate the phase of the transmitted light favorably. Preferably, the space Lm10 is set equal to approximately 0.1 $\mu$m. The area and shape of each of the auxiliary opaque area S1 and the auxiliary pattern segment PA2 are determined so as not to exceed the resolution limit of the exposure apparatus in use.

Figure 17:
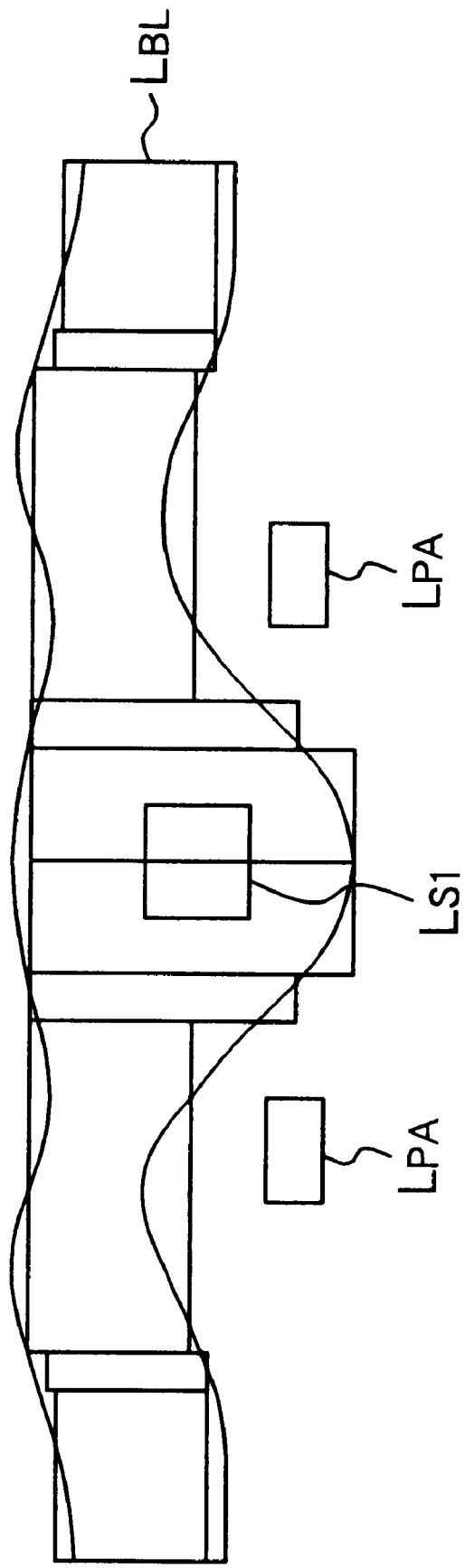
FIG. 17 is a diagram illustrating the distribution of transmitted light in the case where the photomask illustrated in FIG. 15 is used.

The strength distribution of light transmitted through such a photomask PM4 is shown in FIG. 17. A rectangle LBL indicates the bit line BL (see FIG. 5) in the layout design stage. Rectangles LPA indicate the auxiliary pattern segments PA2 (see FIG. 15) in the layout design stage. A rectangle LS1 indicates the opaque area S1 (see FIG. 15) in the layout design stage. Curves indicate the strength distribution of transmitted light.

Figure 18:
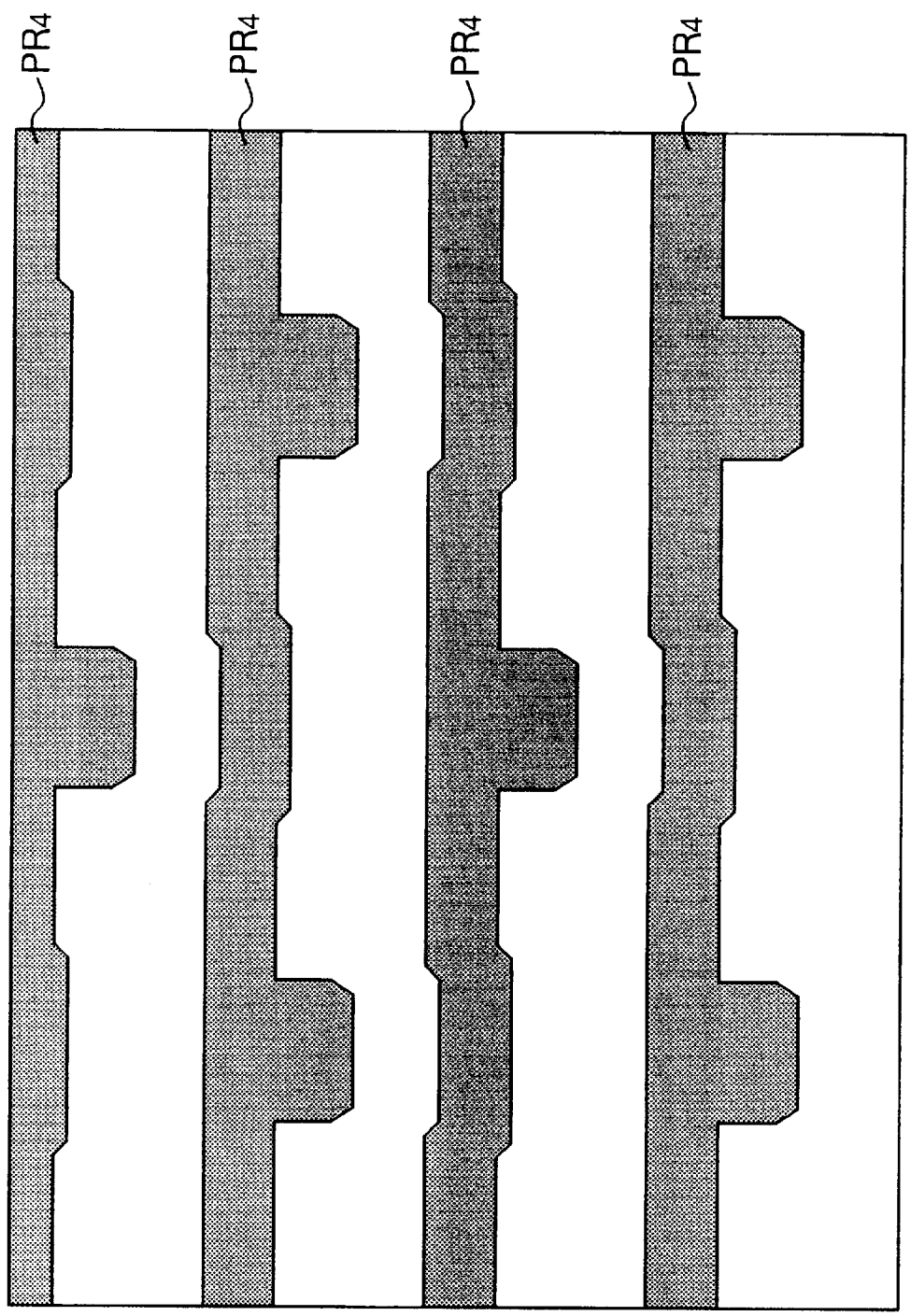
FIG. 18 is a top view of a pattern transferred by using the photomask illustrated in FIG. 15.

A pattern transferred onto a negative-type photoresist film by using such a photomask PM4 is shown in FIG. 18. In shaded portions with dots, the photoresist film PR4 is left.

In the present embodiment, the expanded portions and narrow-width portions of the transparent area P4 (see FIG. 15) are transferred in favorable shapes. In other words, it becomes possible to improve the forming state of the bit lines BL (see FIG. 5) which especially requires high alignment precision and pattern formation faithful to the design pattern.

Clear portions are portions in which the photoresist film PR4 has been removed. Alternatively, the photoresist film may be left in the clear portions of FIG. 17 by making the photoresist film PR4 a positive type.

Figure 19:
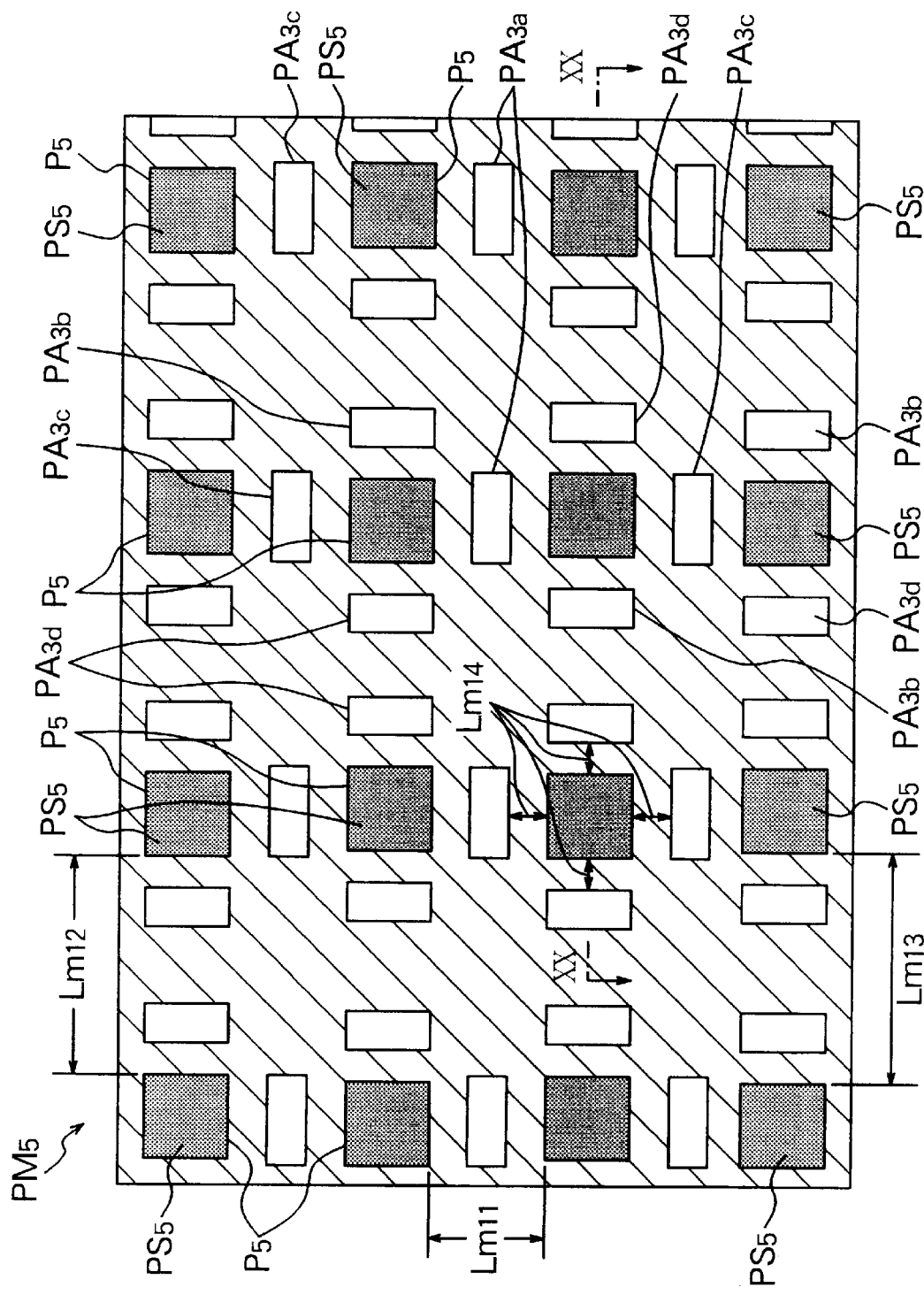
FIG. 19 is a top view of a principal portion of a photomask used to transfer a capacitor contact hole pattern in an exposure process in manufacturing a semiconductor integrated circuit device according to an embodiment of the present invention.
Figure 20:
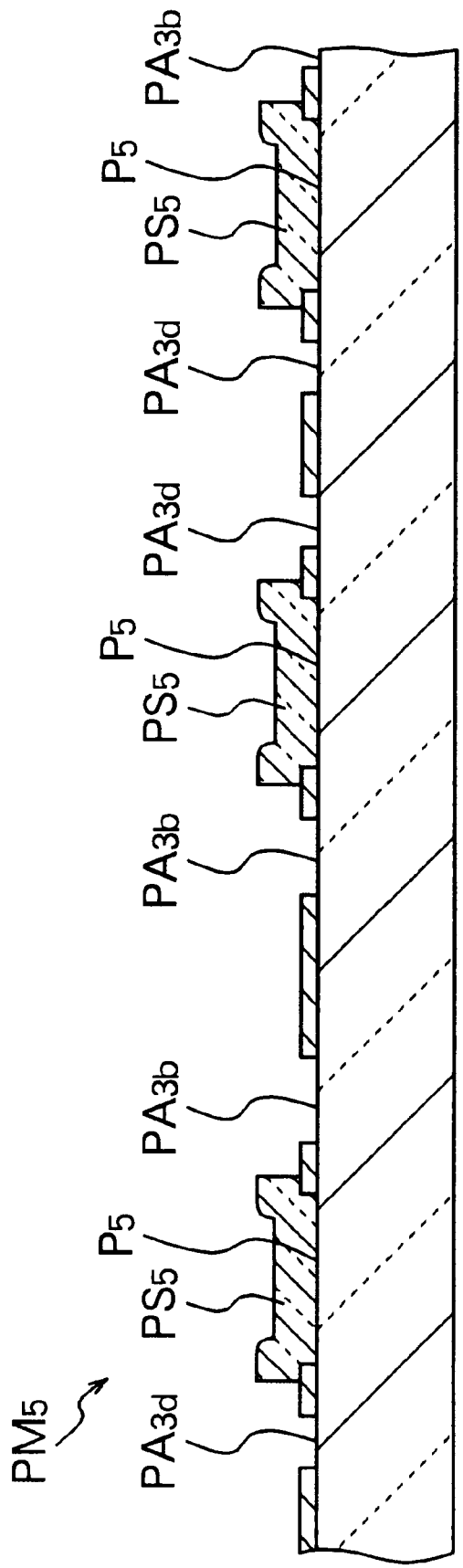
FIG. 20 is a sectional view taken along a XX—XX line of FIG. 19.

FIG. 19 is a top view of a principal portion of a photomask PM5 used to form the capacitor contact holes 9$b$1 and 9$b$2 (see FIGS. 2 and 6) in the memory cell section M of the above described DRAM. FIG. 20 is a sectional view taken along a XX—XX line of FIG. 19.

In the photomask PM5, a plurality of main transparent areas P5 corresponding to contact holes 9$b$1 each taking the shape of, for example, a square are arranged regularly. Preferably, each transparent area P5 is approximately 1.8 $\mu$m by 1.8 $\mu$m in dimensions.

In each transparent area PS, a phase shifter PS5 is disposed so as to be superimposed thereon. The function, material, and forming method of the phase shifters PS5 are the same as those of the above described phase shifters PS3 (see FIG. 13).

In the opaque area around each of the transparent areas PS5 (near the four sides of each transparent area in this embodiment), auxiliary pattern segments (auxiliary transparent areas) PA3$a$ through PA3$d$ are disposed, respectively. The auxiliary pattern segments PA3$a$ through PA3$d$ function to generate a phase difference between a light beam transmitted through the main transparent areas P5 and light beams transmitted through the auxiliary pattern segments PA3$a$ through PA3$d$ and thereby enhance the contrast of edge portions of the transfer pattern and favorably transfer a pattern. Each of the auxiliary pattern segments has a transparent area preferably taking the shape of a rectangle.

However, each of auxiliary pattern segments PA3$a$ and PA3$c$ located between transparent areas P5 which are adjacent to each other in the longitudinal direction of FIG. 19 becomes a pattern segment common to both transparent areas P5 adjacent thereto. Preferably, a space Lm 11 between the transparent areas P5 which are adjacent to each other in the longitudinal direction of FIG. 19 is approximately 0.5 $\mu$m. Preferably, the auxiliary pattern segments PA3$a$ and PA3$c$ are approximately 0.22 $\mu$m by 0.4 $\mu$m in dimensions.

A space Lm12 and a space Lm13 between transparent areas P5 which are adjacent in the lateral direction of FIG. 19 are different in length from each other. The space Lm13 is larger than the space Lm12. For example, the smaller space Lm12 is approximately 0.92 $\mu$m. For example, the larger space Lm13 is approximately 1.04 $\mu$m. These larger and smaller spaces Lm12 and Lm13 are substantially periodically (alternately in this embodiment) set in the vertical direction.

An auxiliary pattern segment PA3$d$ disposed in the space Lm12 which is relatively narrow one of the spaces Lm12 and Lm13 is different in size from an auxiliary pattern segment PA3$b$ disposed in the Lm13 which is relatively wide one. The auxiliary pattern segment PA3$d$ is smaller in size than the auxiliary pattern segment PA3$b$.

For example, the auxiliary pattern segment PA3$d$ which is relatively small is approximately 0.32 $\mu$m by 0.16 $\mu$m in dimensions. For example, the auxiliary pattern segment PA3$b$ which is relatively large is approximately 0.36 $\mu$m by 0.2 $\mu$m in dimensions. Thus, the common auxiliary pattern segments PA3$a$ and PA3$c$ are smaller than the relatively smaller pattern segments PA3$d$.

If the auxiliary pattern segment PA3$b$ which is larger in dimensions is disposed in the narrower space Lm12, then interference of light beams transmitted through adjacent auxiliary pattern segments PA3$b$ causes a useless pattern to be formed in an area which is located between adjacent auxiliary patterns PA3$b$ and in which originally a pattern should not be formed. Such a disadvantage is prevented. The auxiliary pattern segments (auxiliary transparent areas) PA3$a$–PA3$d$ have shapes and dimensions smaller than a resolution limit of an exposure apparatus in use.

In the present embodiment, the auxiliary pattern segments PA3$a$ through PA3$d$ disposed near four sides of the transparent area P5 are shared and the dimensions are changed according to the disposition state of the transparent area P5. Without transferring a useless pattern, therefore, the transparent area P5 can be transferred. And the shape and dimensions of the contact holes for the capacitor 5 can be formed substantially according to the design.

All of spaces Lm14 between the transparent area P5 and the auxiliary pattern segments PA3$a$ through PA3$d$ are set equal to equivalent values, and preferably they are approximately 0.14 $\mu$m.

In the present embodiment as well, the area and shape of each of the auxiliary pattern segments PA3$a$ through PA3$d$ are determined so as not to exceed the resolution limit of the exposure apparatus in use. In FIG. 19, two capacitor contact holes included in the unit active area A (FIG. 6) are defined by two transparent areas P5 having two adjacent segments 3$b$ put between.

Figure 21:
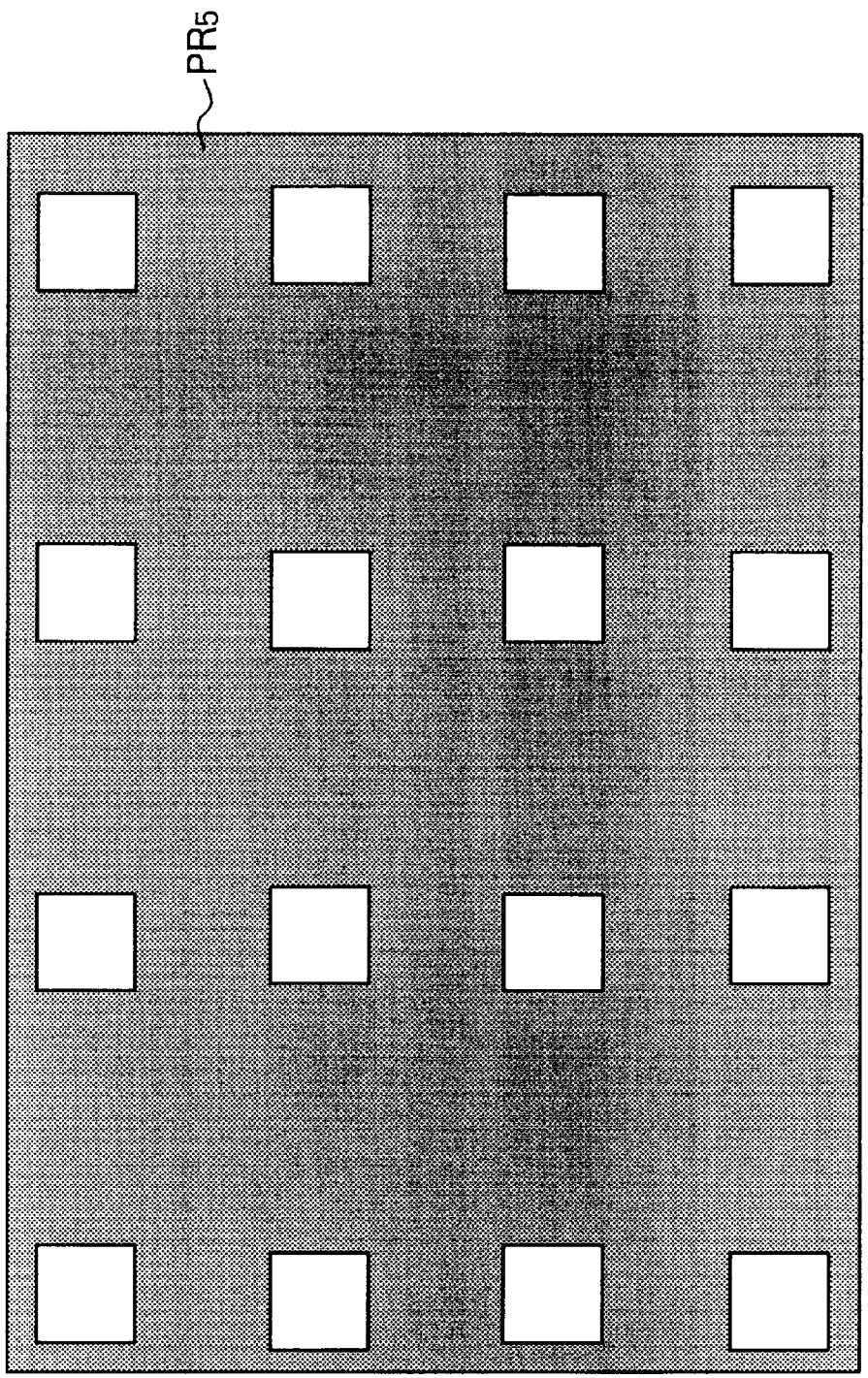
FIG. 21 is a top view of a pattern transferred by using the photomask illustrated in FIG. 19.

A pattern transferred onto a positive-type photoresist film by using such a photomask PM5 is shown in FIG. 21. Shaded portions with dots represent portions in which a photoresist film PR5 is left. Square clear portions represent portions from which the photoresist film has been removed. Alternatively, the photoresist film may be left in clear portions of FIG. 21 by making the photoresist film negative type.

Figure 22:
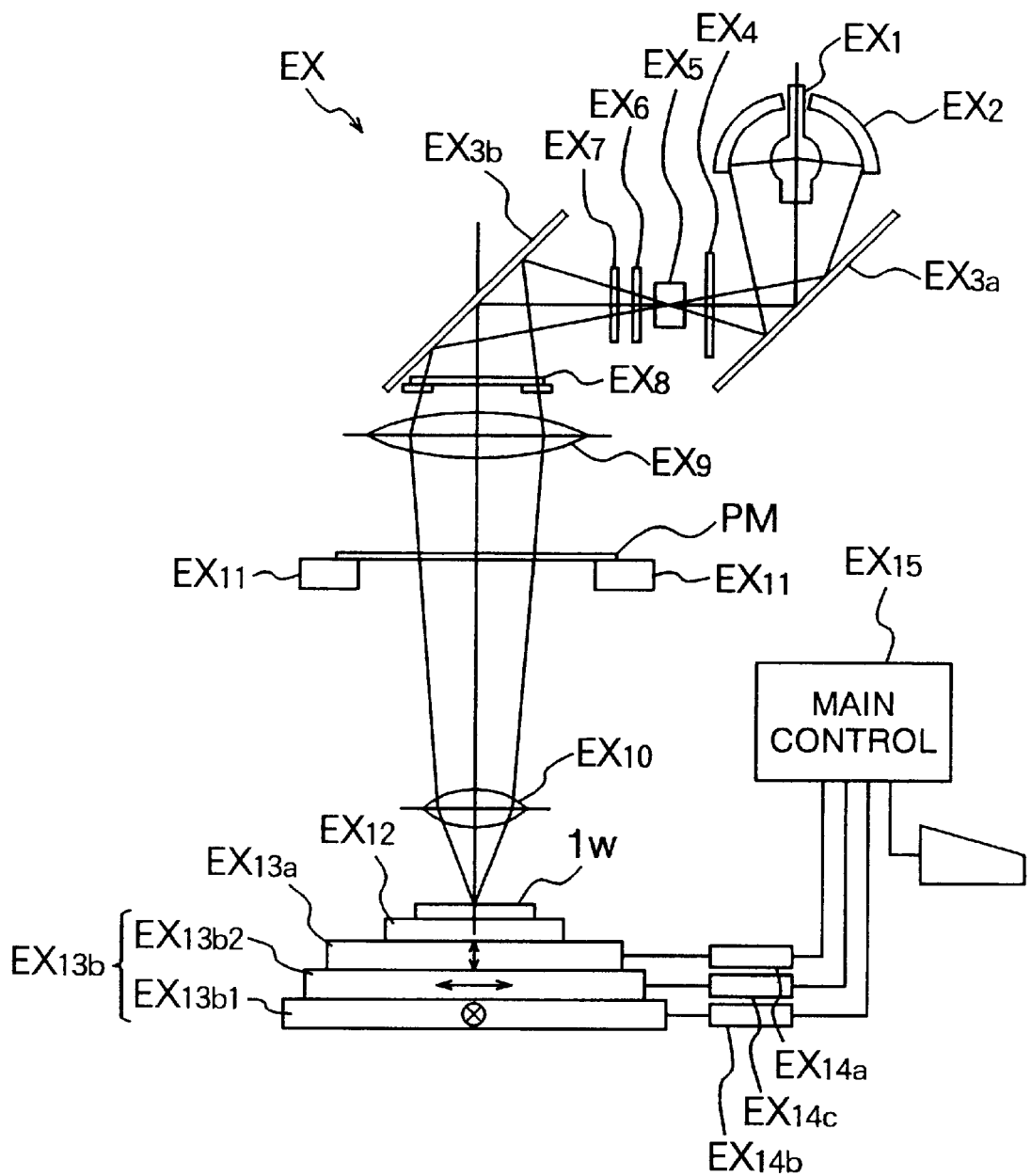
FIG. 22 is a diagram illustrating an example of configuration of an exposure apparatus which can be used in manufacturing processes of semiconductor integrated circuit devices according to an embodiment of the present invention.

An example of an exposure apparatus used in an exposure process which is a process for manufacturing a semiconductor integrated circuit device of the present embodiment will now be described by referring to FIG. 22.

An exposure apparatus EX of the present embodiment is preferably a 5:1 reduction projection exposure apparatus of lens step and repeat type. It is formed preferably on the basis of an i-line stepper NRS-1755i7A (preferably NA=0.5, exposure area=17.5 square) produced by Nikon.

As an exposure light source EX1, preferably a hgih pressure mercury lamp is used. Exposure light radiated from the exposure light source EX1 is focused by a focusing mirror EX2 and it is applied to a first plane reflecting mirror EX3$a$.

The exposure light applied to the first plane reflecting mirror EX3$a$ is applied to a second plane reflecting mirror EX3$b$ via a shutter EX4, a fly eye lens EX5, an aperture EX6, and a shortcut filter EX7.

The aperture EX6 is a component for adjusting the coherence factor σ. In the present embodiment, preferably σ is determined as σ=0.3. The shortcut filter EX7 is a filter for cutting far ultraviolet rays having shorter wavelengths than the i-line in the case where the i-line (365 nm) is used as the exposure light.

Exposure light applied to the second plane reflecting mirror EX3b is applied to a semiconductor wafer 1w via a mask blind EX8, a condenser lens EX9, a photomask PM, and a reduction projection lens (projection optical system) EX10.

The mask blind EX8 is a component for setting the range of the transfer area. The mask blind EX8 is easily mountable and distachable. The condenser lens EX10 is a lens for forming Koehler lighting.

The photomask PM is one of the above described photomasks PM1 through PM5 (illustrated in FIGS. 8, 10, 13, 15 and 19) and ordinary photomasks having no phase shifters thereon. This photomask PM is placed on a mask mount table EX11 so as to be mountable and detachable.

The reduction projection lens EX10 is a bitelecentric lens including a large number of lenses. The semiconductor wafer 1w is made of a Si single crystal having a diameter which is preferably in the range of approximately 5 to 8 inch. The semiconductor wafer 1w is placed on a wafer absorption table EX12.

Under the wafer absorption table EX12, a Z-axis transfer table EX13a is installed. The Z-axis transfer table EX13a is a transfer table for moving the semiconductor wafer 1w in the height direction. The Z-axis transfer table EX13a is mechanically connected to a driver EX14a so that moving operation will be conducted by the driver EX14a.

Under the Z-axis transfer table EX13a, an XY stage EX13b is installed. The X-Y stage EX13b includes an X-axis transfer table 13b1 and a Y-axis transfer table 13b2. The X-axis transfer table 13b1 is a transfer table for horizontally moving the semiconductor wafer 1w in the lateral direction of FIG. 22. The Y-axis transfer table 13b2 is a transfer table for horizontally moving the semiconductor wafer 1w in the backward and forward direction of FIG. 22. The X-axis transfer table EX13b1 and the Y-axis transfer table EX13b2 are mechanically connected to drivers EX14b and EX14c, respectively. Moving operation is conducted by the drivers EX14b and EX14c.

The drivers EX14a through EX14c are electrically connected to a main controller EX15. Operations of the drivers EX14a through EX14c are controlled by the main controller EX15. The main controller EX15 is a component for controlling the operation of the exposure apparatus EX as a whole.

A method for manufacturing the semiconductor integrated device of the present embodiment will now be described by referring to FIGS. 23a through 23z and FIG. 24.

Figure 23A:
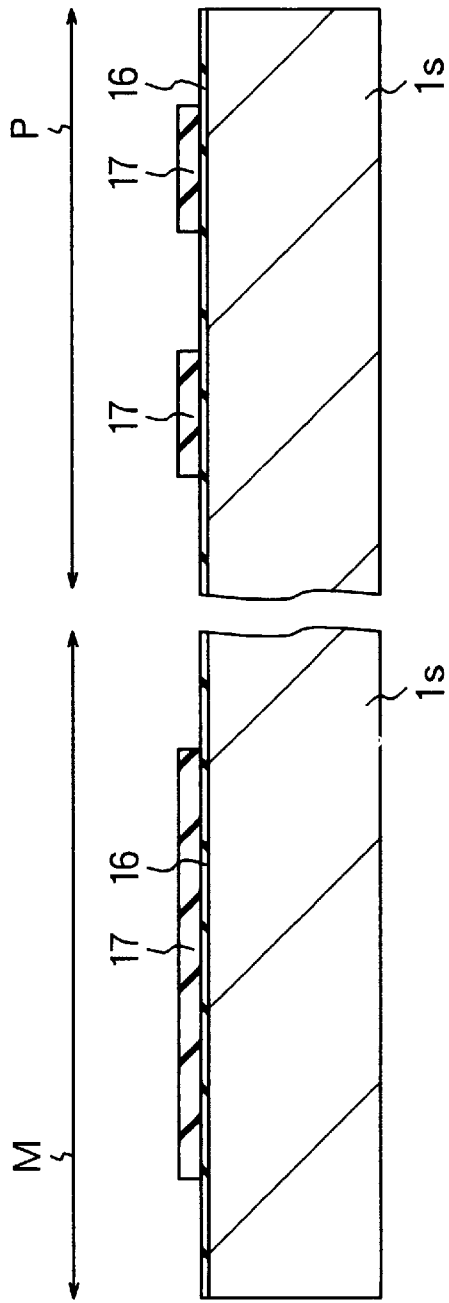
FIGS. 23a–23z are sectional views of principal portions of a semiconductor integrated circuit device in various stages of a method of manufacturing the semiconductor integrated circuit device according to an embodiment of the present invention.

As shown in FIG. 23a, the surface of the semiconductor substrate 1s made of a p-type Si single crystal is subjected to hot oxidation processing. An insulating film 16 preferably having a thickness of approximately 135 Å and made of $SiO_2$ is thus formed. On the upper surface of the insulating film 16, an insulating film 17 preferably having a thickness of approximately 1400 Å made of silicon nitride is then formed by means of a CVD method.

Subsequently, by removing a portion of the insulating film 17 located in the isolation region by means of the photolithography technique and dry etching technique, the insulating film 17 is patterned. In this photolithography process, the photomask PM1 shown in FIG. 8 is used.

Figure 23B:
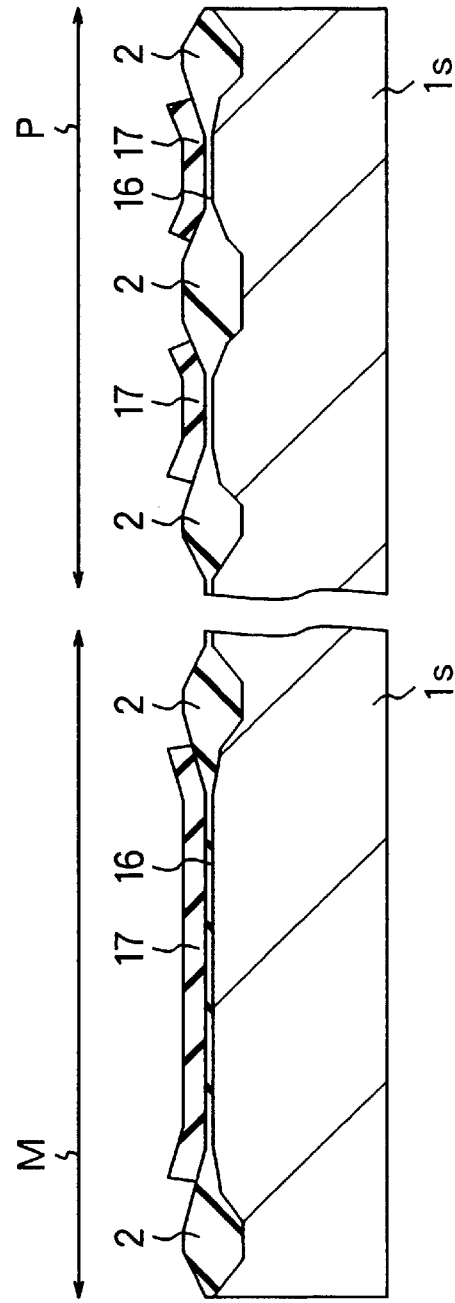

Thereafter, selective oxidation processing is conducted by using the patterned insulating film 17 as a mask. Thereby, an isolating field insulating film 2 is formed on the main surface of the semiconductor substrate 1s as shown in FIG. 23b. The field insulating film 2 is preferably made of $SiO_2$ and has a film thickness of approximately 4000 Å.

A top view of the memory cell section M after this processing is shown in FIG. 3.

Subsequently, the insulating film 17 is removed by hot phosphoric acid solution. By using a photoresist as a mask, preferably boron functioning as a p-type impurity is then introduced into a predetermined position of the semiconductor substrate 1s by ion implantation. After the photoresist has been removed, the semiconductor substrate 1s is subjected to thermal diffusion processing and consequently the p-well 3p is formed as shown in FIG. 23c.

By using a photoresist as a mask, preferably phosphorus functioning as an n-type impurity is introduced into a predetermined position of the semiconductor substrate 1s by ion implantation. After the photoresist has been removed, the semiconductor substrate 1s is subjected to thermal diffusion processing and consequently the n-well 3n is formed as shown in FIG. 23c.

Subsequently, the insulating film 16 located on the surface of the semiconductor substrate 1s is etched and removed by fluoric acid solution. Thereafter, on the surface of the semiconductor substrate 1s, an insulating film (not illustrated) preferably having a thickness of approximately 100 Å and made of $SiO_2$ is formed.

In order to optimize the impurity concentration in the channel region and obtain the threshold voltage of each MOS, predetermined impurity ions are implanted on the main surface of the active region.

As shown in FIG. 23c, the insulating film located on the surface of the resulting semiconductor substrate 1s is etched and removed by means of fluoric acid solution. On the surface of the resulting semiconductor substrate 1s, the gate insulating film 4c of the selection MOS and the gate insulating films 14c and 15c of the MOS forming the peripheral circuit are formed. The gate insulating film 4c is formed by using the thermal oxidation method. The film thickness of the gate insulating film 4c is approximately 90 Å.

Subsequently, on the upper surface of the resulting semiconductor substrate 1s, a conductor film 18d1 preferably made of low-resistance poly-silicon with phosphorus introduced therein and a conductor film 18d2 made of $WSi_2$ are formed in order as shown in FIG. 23d. The conductor films 18d1 and 18d2 are formed preferably by using the CVD method. The conductor films 18d1 and 18d2 are preferably 700 Å and 1500 Å in thickness, respectively.

On the upper conductor film 18d2, the insulating film 6a preferably made of $SiO_2$ and the insulating film 7a made of silicon nitride are then formed in order. The insulating film 6a and the cap insulating film 7a are formed preferably by using the CVD method.

In forming the cap insulating film 7a, the insulating film 6a functions to prevent the inside of the film forming apparatus from polluted with the metal contained in the conductor film 18d2. The thickness of the insulating film 6a is preferably in the range of approximately 100 to 500 Å.

The cap insulating film 7a functions as an etching stopper in a contact hole forming process which will be described later. Preferably, the cap insulating film has a thickness of approximately 2000 Å.

Figure 23E:
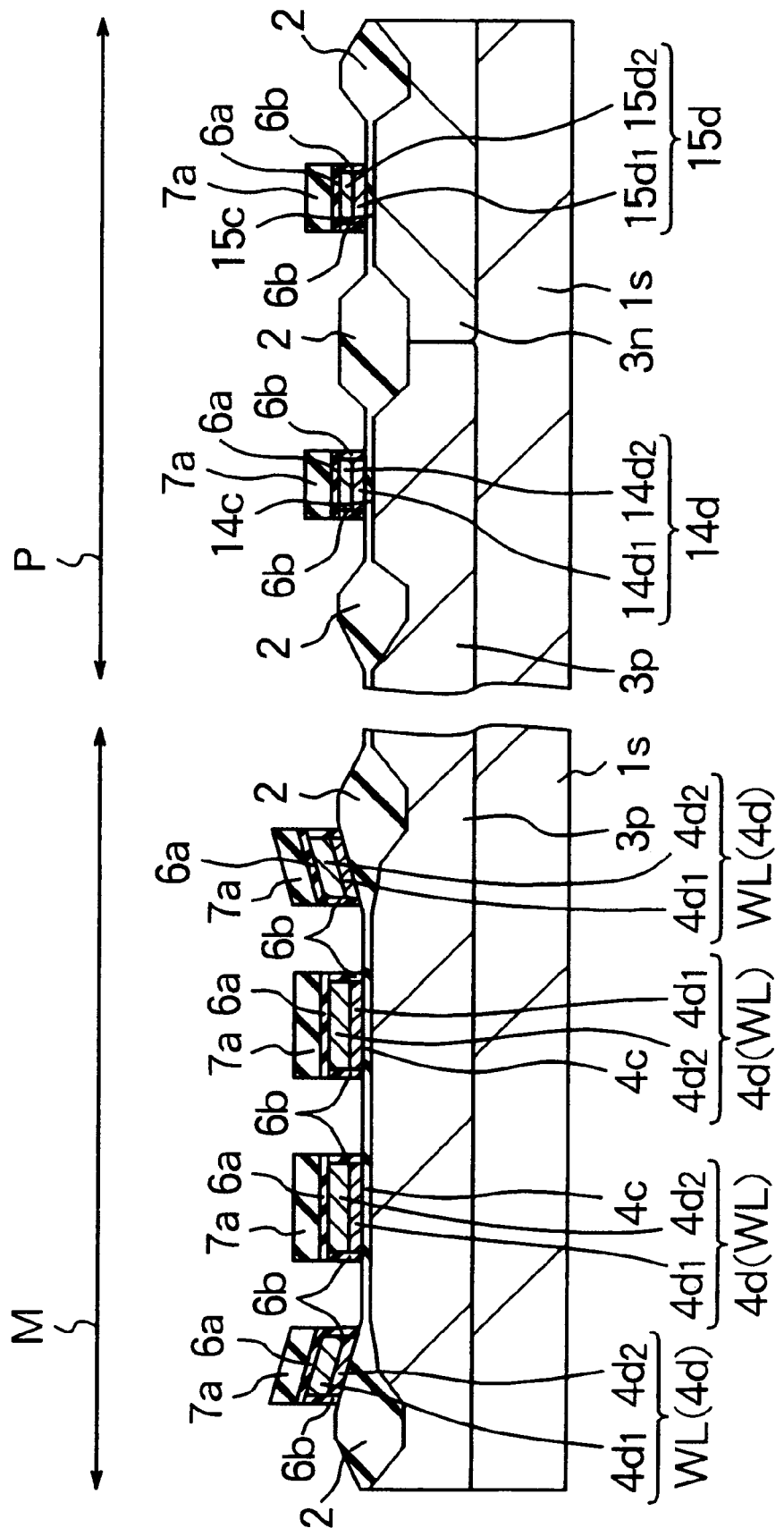

Subsequently, by using a photoresist as a mask, the cap insulating film 7a, the insulating film 6a, and the conductor films 18d1 and 18d2 exposed from the photoresist are etched and removed in order as shown in FIG. 23e. Thereby, the gate electrodes 4d (word line WL), 14d and 15d are formed in the memory cell section M and the peripheral circuit section P.

In this photolithography process, the photomask PM2 shown in FIG. 10 is used. A top view of the memory cell section M after this processing is shown in FIG. 4.

Subsequently, the above described photoresist is removed. Thereafter, the resulting semiconductor substrate 1s is subjected to thermal oxidation processing. Thereby, the thin insulating film 6b preferably made of SiO2 is formed on side surfaces of the gate electrodes 4d, 14d and 15d.

Figure 23F:
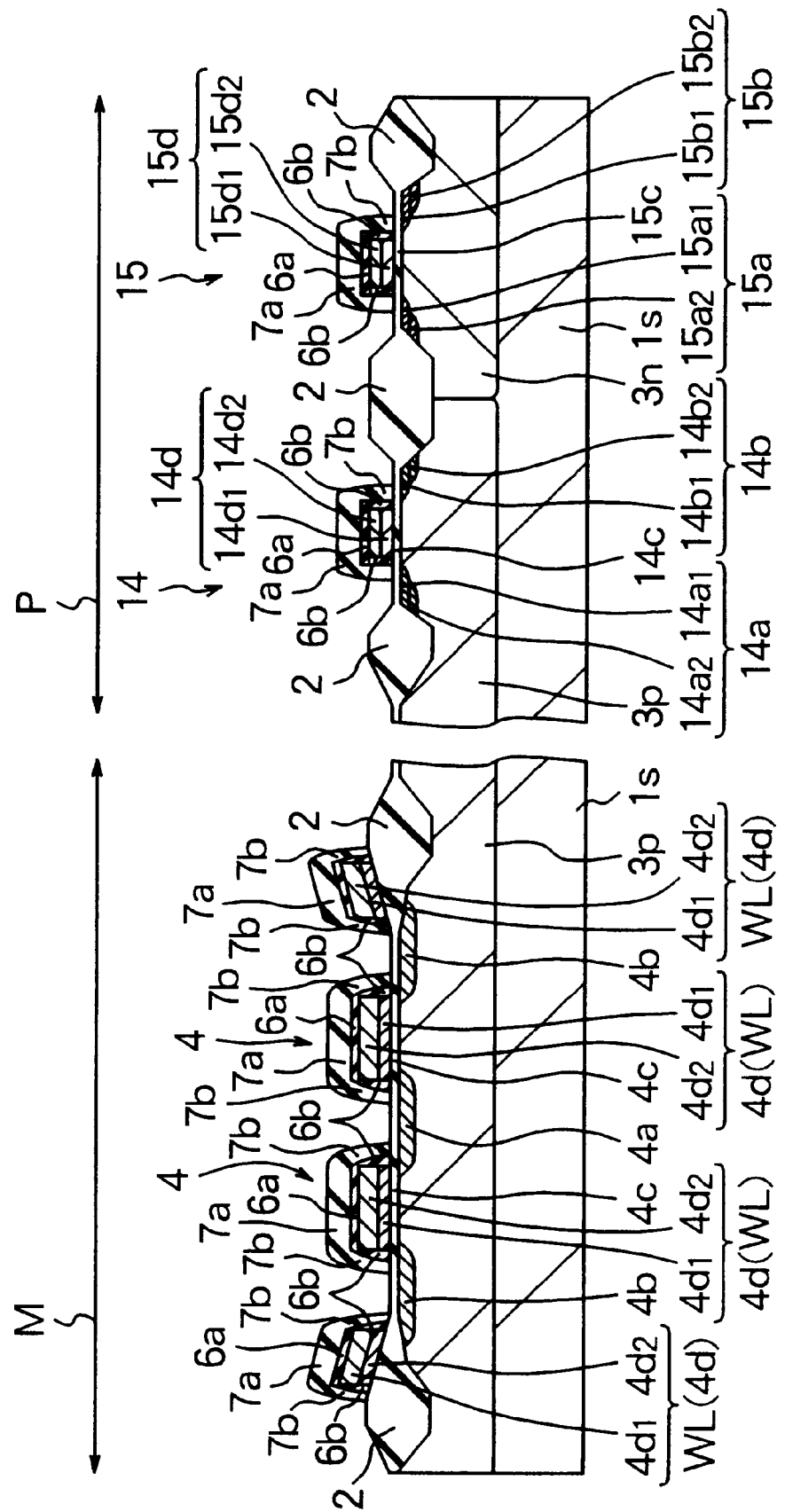

By using the gate electrodes 14d and 15d as masks, phosphorus ions functioning as an n-type impurity and boron ions functioning as a p-type impurity are then implanted respectively in the nMOS forming region and the pMOS forming region of the peripheral circuit section as shown in FIG. 23f. Thereby, semiconductor regions 14a1, 14b1, 15a1 and 15b1 having low impurity concentration values are formed.

Subsequently, phosphorus ions functioning as an n-type impurity are implanted in the selection MOS forming region of the memory cell section M. The n-type impurity are subjected to extension diffusion. Thereby, the semiconductor regions 4a and 4b forming the source region and the drain region of the selection MOS 4 are formed. To the semiconductor regions 4a and 4b, a bit line and a capacitor are later connected, respectively.

Subsequently, an insulating film preferably made of silicon nitride is formed on the resulting semiconductor substrate 1s by using the CVD method. Thereafter, the insulating film is etched back by using an anisotropic dry etching method such as reactive ion etching (RIE). Thereby, the side walls 7b are formed on the side surfaces of the gate electrodes 4d, 14d and 15d.

The source region and the drain region of the selection MOS 4 may be formed in a LDD (Lightly Doped Drain) structure by forming such side walls 7b and then implanting arsenic (As) ions in the main surface of the p-well 3p with a concentration higher than the above described phosphorus functioning as an n-type impurity.

By using the gate electrodes 14d and 15d covered with the cap insulating film 7a and the side walls 7b as a mask, phosphorus ions functioning as an n-type impurity and boron ions functioning as a p-type impurity are then implanted respectively in the nMOS forming region and the pMOS forming region of the peripheral circuit section P. Thereby, semiconductor regions 14a2, 14b2, 15a2 and 15b2 having high impurity concentration values are formed. As a result, the semiconductor regions 14a, 14b, 15a and 15b of the nMOS 14 and pMOS 15 in the peripheral circuit section P are formed.

Subsequently, on the resulting semiconductor substrate 1s, the inter-layer insulating film 8a preferably made of SiO$_2$ is formed by using the CVD method as shown in FIG. 23g. Thereafter, on the inter-layer insulating film 8a, the inter-layer insulating film 8b preferably made of BPSG is formed by using the CVD method. As a result, the cap insulating film 7a and the side walls 7b each made of a nitride film and located on at least the gate electrode 4d are in contact with the insulating film 8a made of an oxide film and are covered therewith.

Subsequently, the upper surface of the inter-layer insulating film 8b is flattened by using the CMP (Chemical Mechanical Polishing) method. Thereafter, on the inter-layer insulating film 8b, a mask film (first mask film) 10a preferably made of low-resistance poly-silicon with phosphorus introduced therein is formed by using the CVD method.

Thereafter, by using a photoresist as a mask, the mask film 10a is patterned by using the dry etching method. Thereby, such a pattern of the mask film 10a that the upper surface of the one semiconductor region 4b of the selection MOS 4 has an opening is formed.

In the present embodiment, the upper surface of the inter-layer insulating film 8b underlying the mask film 10a is flattened. Therefore, a sufficient photolithography margin can be secured, and favorable pattern transfer onto the film 8b is possible. In this photolithography process, the photomask PM5 shown in FIG. 19 is used. In the peripheral circuit section P, the entire upper surface of the inter-layer insulating film 8b is covered with the mask layer 10a.

The reason why low-resistance poly-silicon is used as the mask film 10a will hereafter be described. First, the etching selection ratio with respect to the silicon oxide films 8a and 8b, through which contact holes for the capacitor 5 are opened as described below, can be increased. Secondly, since the material embedded in the contact hole is low-resistance poly-silicon, the mask film 10a which is the lower layer can be simultaneously removed in etch-back processing of the low-resistance poly-silicon conductor film formed at the time of embedding the material.

However, the constituent material of the mask film 10a is not limited to poly-silicon, but can be changed diversely. For example, the constituent material may be silicon nitride.

Figure 23H:
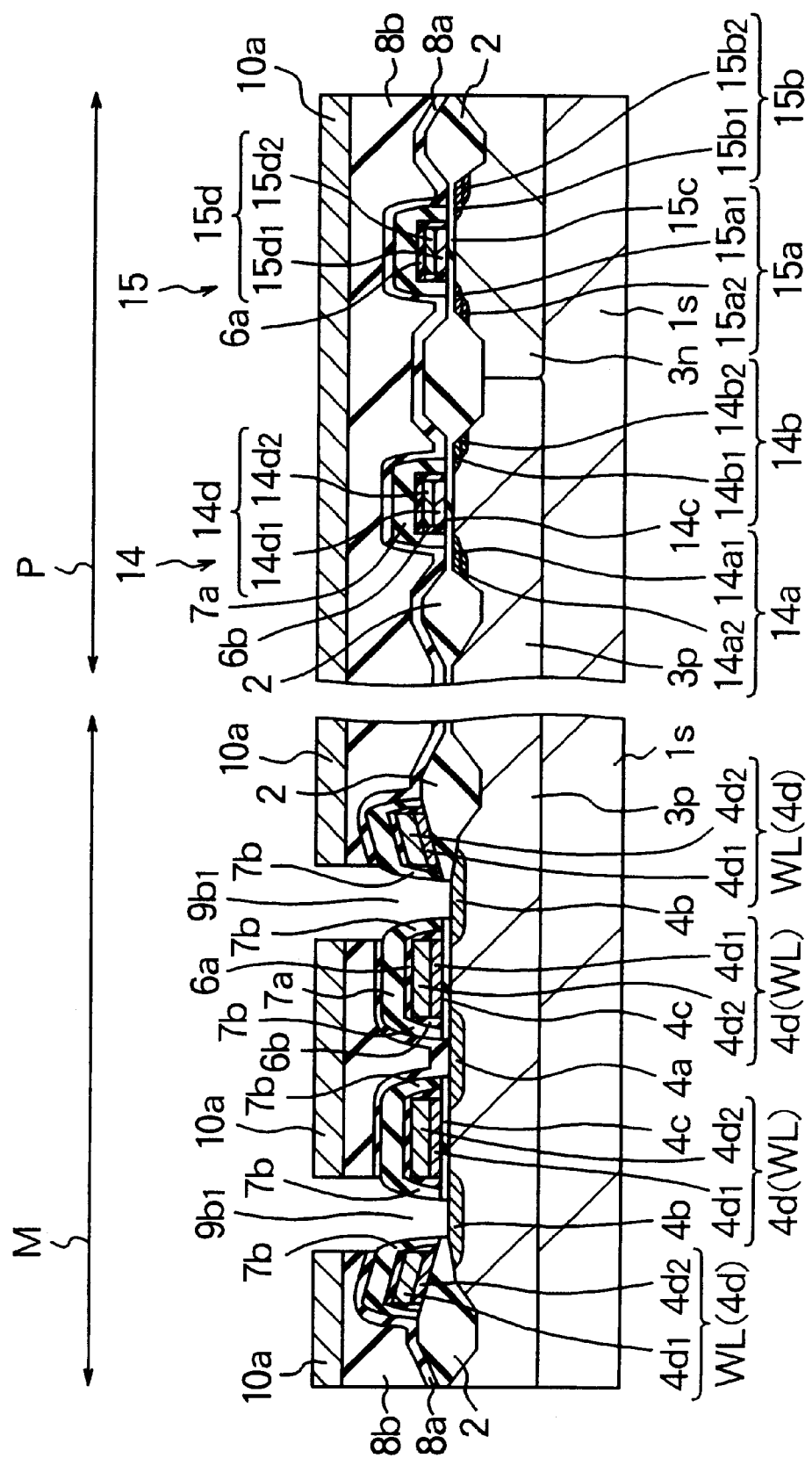

By using the mask film 10a as an etching mask, the inter-layer insulating films 8a and 8b exposed from the mask film 10a are then removed preferably by using the dry etching method. Thereby, the contact hole (lower contact hole for capacitor) 9b1 is formed so as to expose the semiconductor region 4b of the selection MOS 4 as shown in FIG. 23h. Preferably, the contact hole 9b1 has a diameter of approximately 0.36 µm.

In the present embodiment, the cap insulating film 7a and the side walls 7b brought into contact with and covered with the insulating films 8a and 8b, through which the contact hole 9b1 is formed, are formed by silicon nitride. Therefore, the selection ratio of the insulating films 8a and 8b with respect to silicon nitride in dry etching processing is high. As a result, the cap insulating film 7a and the side walls 7b function as etching stoppers. Accordingly, the minute contact hole 9b1 can be formed in a self-aligned manner with a high alignment precision.

Even if the position of the opening of the mask film 10a, for example, is somewhat deviated in the width direction (lateral direction in FIG. 23h) of the word line WL, the cap insulating film 7a and the side walls 7b are made of silicon nitride and function as etching stoppers and consequently a part of the word line WL is not exposed from the contact hole formed by using the mask film as an etching mask.

Furthermore, even if the position of the opening of the mask film 10a is deviated in a direction of extension of the word line WL, the underlying field insulating film 2 has a sufficiently large thickness and consequently the contact hole formed by using the mask film as an etching mask does not reach the upper part of the resulting semiconductor substrate 1s.

In the present embodiment, therefore, the alignment margin of the contact hole 9b1 set equal to a larger value by considering the mis-alignment can be reduced. Therefore, the area of the memory cell section M can be reduced.

The dry etching conditions at this time will now be exemplified. The selection ratio between the inter-layer insulating films 8a and 8b and the cap insulating film 7a and the side walls 7b is preferably in the range of approximately 10 to 15. The reaction gas is preferably $C_4F_8/CF_4/CO/Ar$ gas preferably with approximately 3/5/200/550 sccm, respectively. Preferably, the pressure is approximately 100 mTorr. Preferably, the RF power is approximately 1000 watts. Preferably, the processing temperature of the etching system is approximately 20/60/−10° C. on the upper electrode/wall surface/lower electrode, respectively.

Figure 23J:
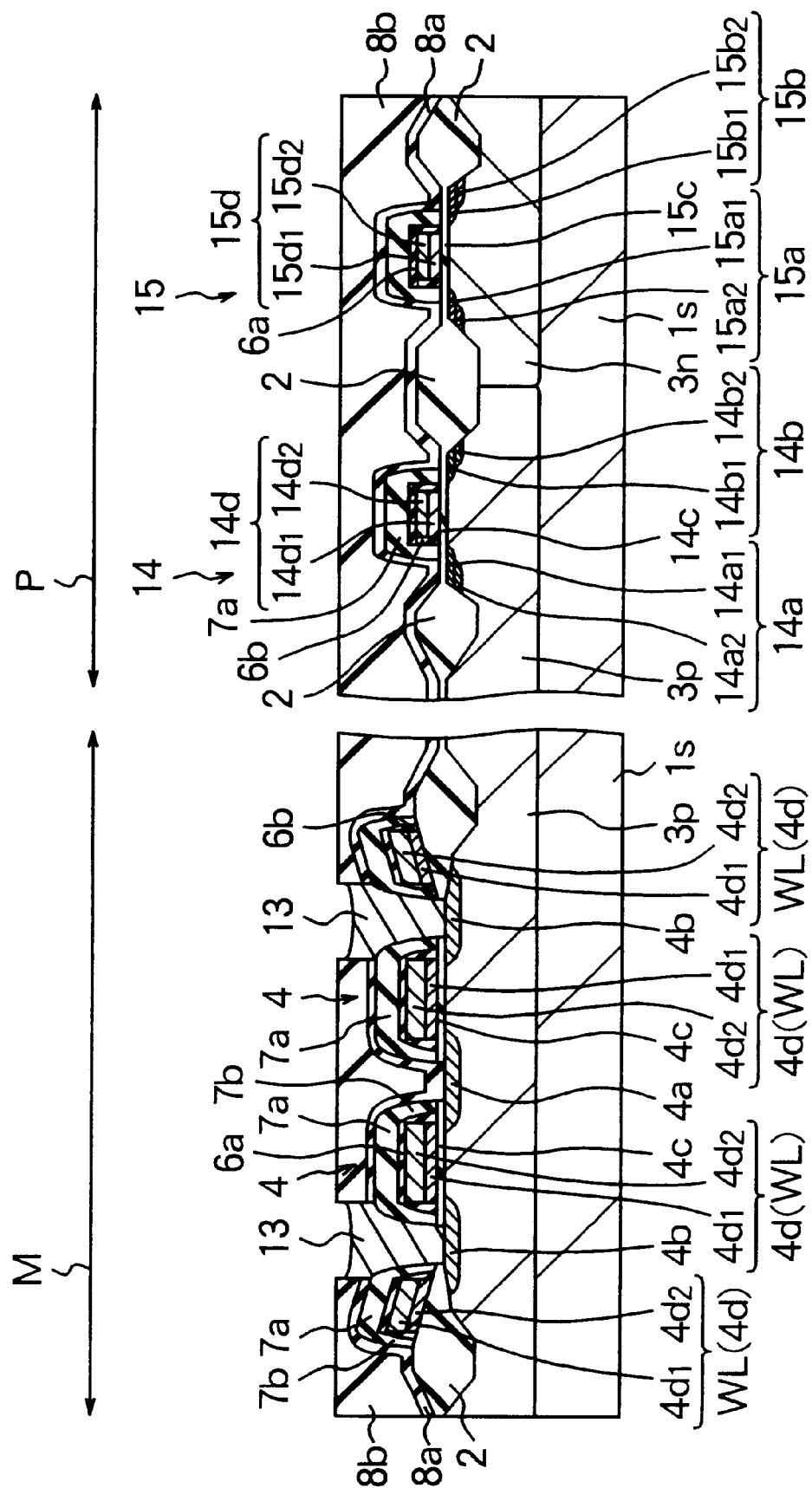
Figure 23K:
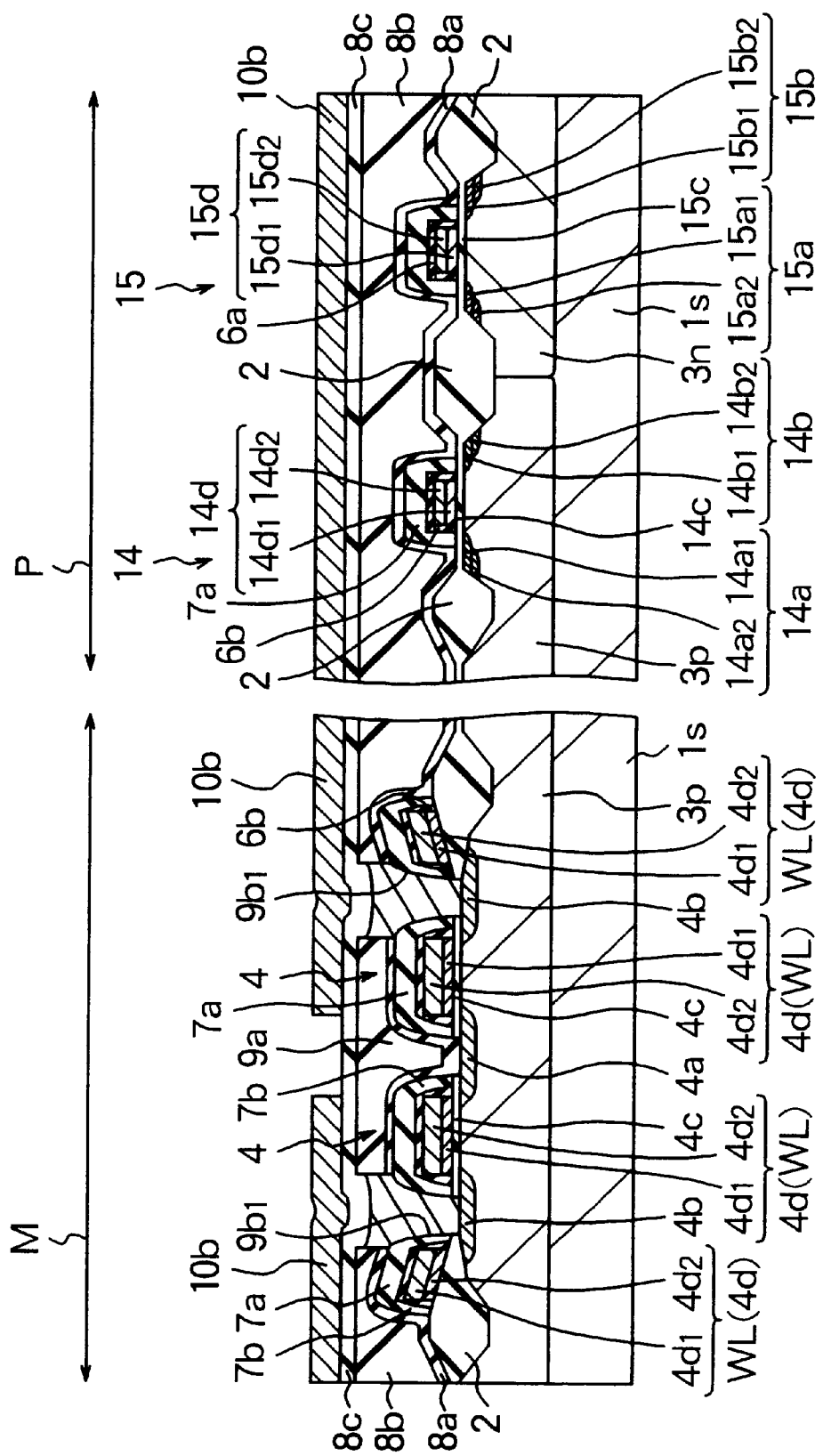
Figure 23I:
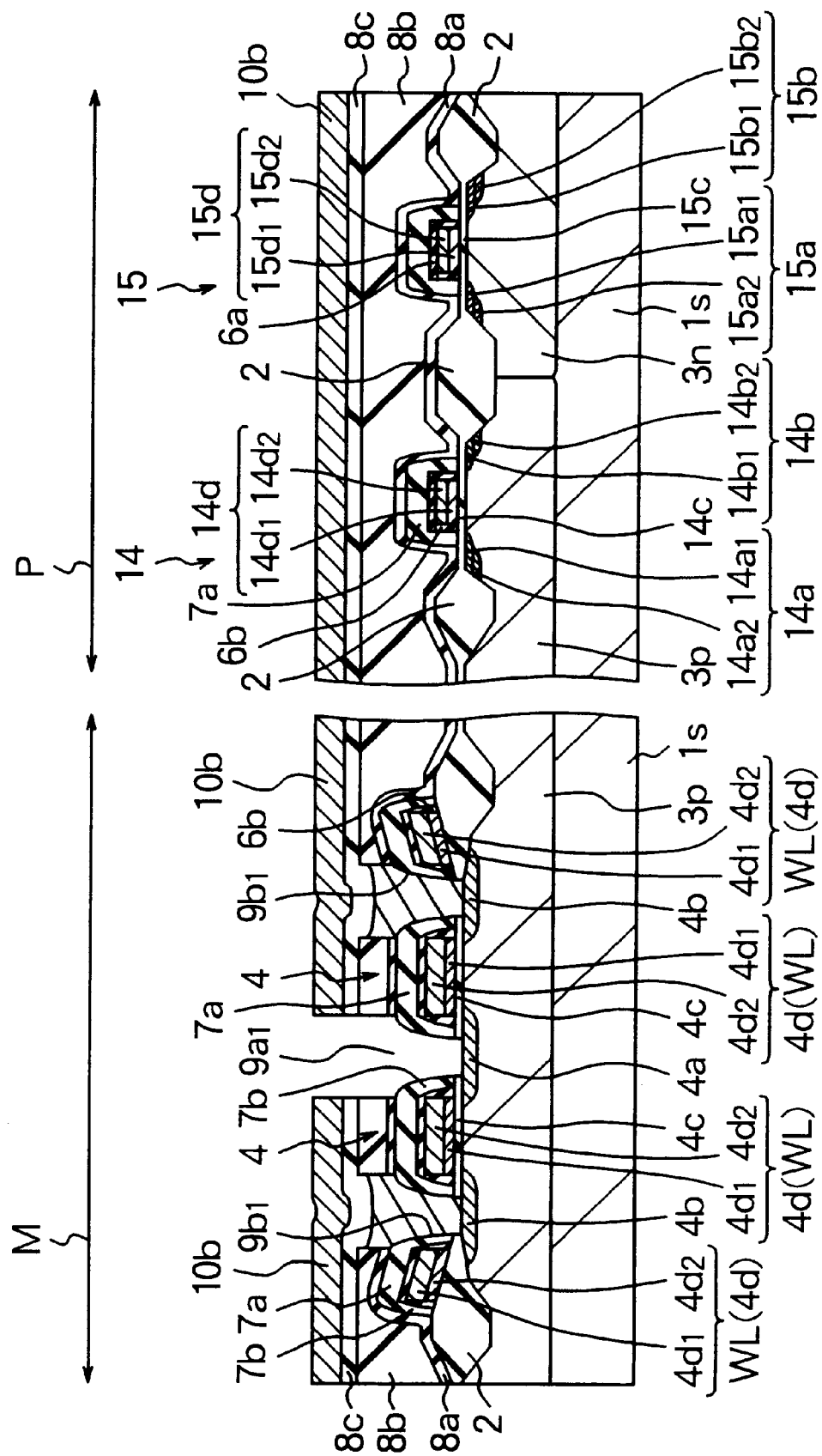

Subsequently, on the resulting semiconductor substrate 1s, the conductor film 13 made of low-resistance poly-silicon with phosphorus introduced therein is formed by using the CVD method as shown in FIG. 23i. Thereafter, the conductor film 13 is etched back by using the dry etching method. Thereby, the conductor film 13 is embedded in only the contact hole 9b1 as shown in FIG. 23j. At the time of this etch-back processing, the mask film 10a of the lower layer (see FIG. 23i) is also removed.

Thereafter, on the conductor film 13 and the insulating film 8b, the insulating film 8c preferably made of $SiO_2$ is formed by using the CVD method as shown in FIG. 23k. The inter-layer insulating film 8c has a thickness preferably in the range of approximately 500 to 1000 Å.

Subsequently, on the inter-layer insulating film 8c, the mask film 10b preferably made of low-resistance poly-silicon is formed by using the CVD method. The thickness of the mask film 10b is preferably in the range of 3000 to 6000 Å.

Subsequently, by using a photoresist as a mask, the mask film 10b is subjected to patterning using dry etching processing. As for the photomask used in this lithography process, the PM3 shown in FIG. 13 is used.

Over the semiconductor region 4a, an opening is thus formed in the mask film 10b. Thereafter, the inter-layer insulating films 8a through 8c in the region exposed from the opening are etched and removed by using dry etching processing.

Thereby, the contact hole (bit line contact hole) 9a1 is formed so as to expose the semiconductor region 4a of the selection MOS 4 as shown in FIG. 23l. Preferably, the contact hole 9a1 has a diameter of approximately 0.36 µm.

In the present embodiment, the cap insulating film 7a and the side walls 7b brought into contact with and covered with the insulating films 8a and 8b, through which the contact hole 9a1 is formed, are formed by silicon nitride. Therefore, the selection ratio of the insulating films 8a and 8b with respect to silicon nitride in dry etching processing is high. As a result, the cap insulating film 7a and the side walls 7b function as etching stoppers. Accordingly, the minute contact hole 9a1 can be formed in a self-aligned manner with a high alignment precision.

Even if the position of the opening of the mask film 10b, for example, is somewhat deviated in the width direction (lateral direction in FIG. 23l) of the word line WL, the cap insulating film 7a and the side walls 7b are made of silicon nitride and function as etching stoppers and consequently a part of the word line WL is not exposed from the contact hole formed by using the mask film as an etching mask.

Furthermore, even if the position of the opening of the mask film 10a is deviated in a direction of extension of the word line WL, the underlying field insulating film 2 has a sufficiently large thickness and consequently the contact hole formed by using the mask film as an etching mask does not reach the upper part of the resulting semiconductor substrate 1s.

In the present embodiment, therefore, the alignment margin of the contact hole 9a1 set equal to a larger value by considering the mis-alignment can be reduced. Therefore, the area of the memory cell section M can be reduced.

The dry etching conditions at this time will now be exemplified. The selection ratio between the inter-layer insulating films 8a and 8b and the cap insulating film 7a and the side walls 7b is preferably in the range of approximately 10 to 15. The reaction gas is preferably $C_4F_8/CF_4/CO/Ar$ gas preferably with approximately 3/5/200/550 sccm, respectively. Preferably, the pressure is approximately 100 mTorr. Preferably, the RF power is approximately 1000 watts. Preferably, the processing temperature of the etching system is approximately 20/60/−10° C. on the upper electrode/wall surface/lower electrode, respectively.

Figure 23M:
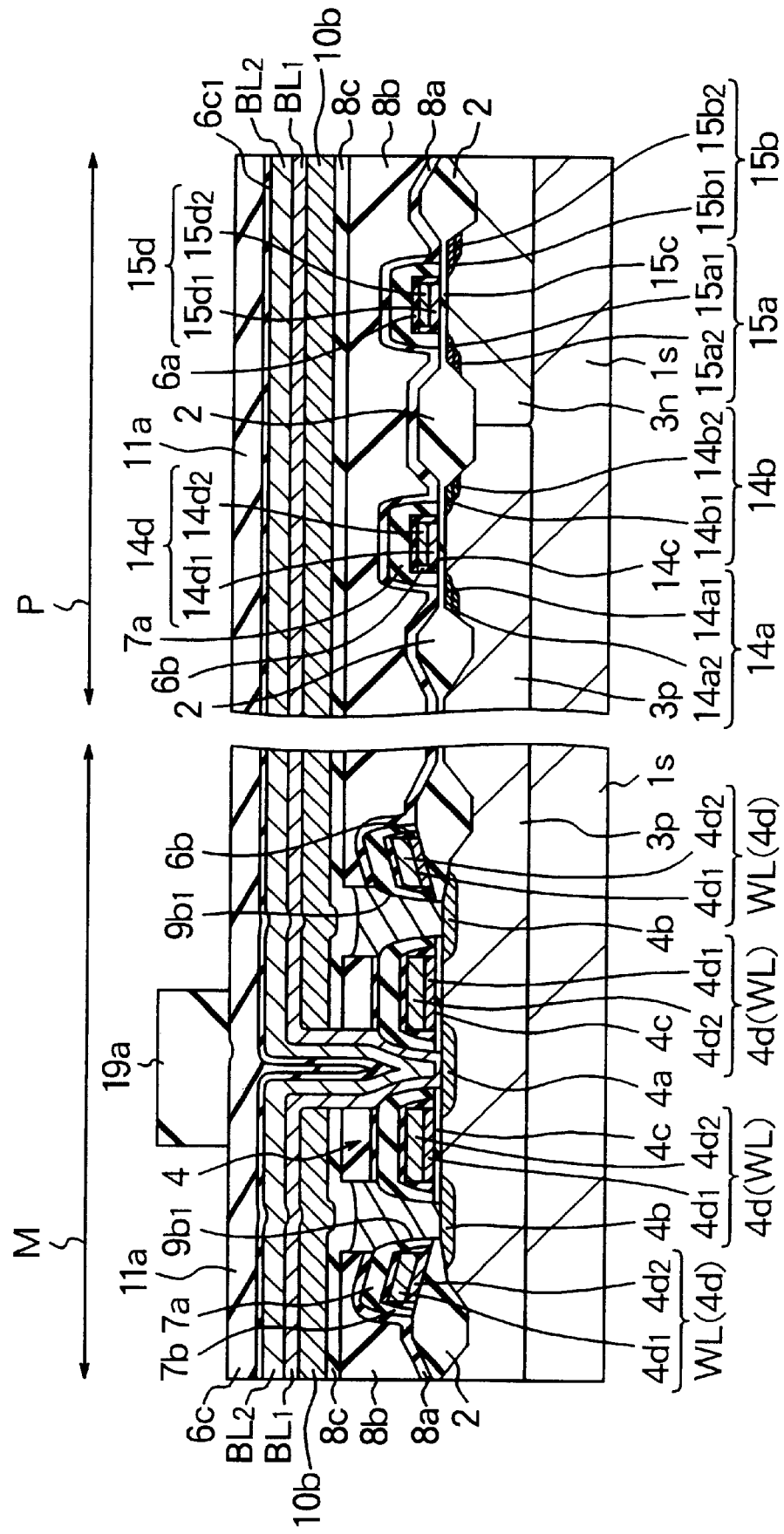

Subsequently, on the resulting semiconductor substrate 1s including the semiconductor region 4a exposed to the contact hole 9a1, the conductor film BL1 made of low-resistance poly-silicon with phosphorus introduced therein and the conductor film BL2 made of $WSi_2$ are formed in order by using the CVD method as shown in FIG. 23m. Subsequently, on the conductor film BL2, the insulating film 6c made of $SiO_2$ and the cap insulating film 11a made of silicon nitride are formed in order by using the CVD method. Preferably, the cap insulating film 11a has a thickness of approximately 2000 Å.

Subsequently, on the cap insulating film 11a, a photoresist 19a is formed so as to cover the bit line forming region. As for the mask used in this lithography process, the above described photomask PM4 shown in FIG. 15 is used.

By using the photoresist 19a as an etching mask, the cap insulating film 11a, the insulating film 6c, the conductor films BL2 and BL1, and the mask film 10b exposed from the mask are then etched and removed in order.

Figure 23N:
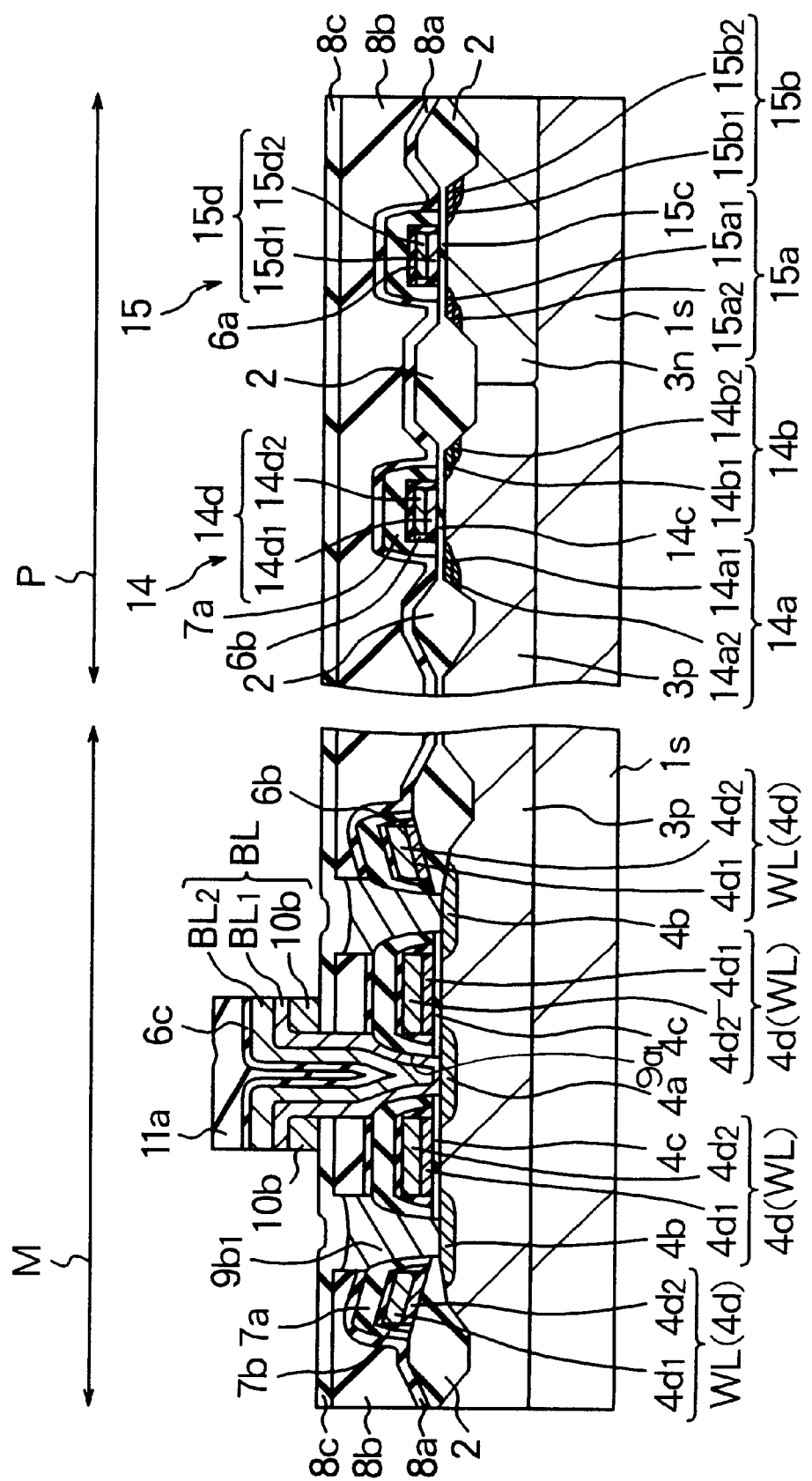

Thereby, the bit line BL including the conductor films BL1 and BL2 and the mask film 10b is formed as shown in FIG. 23n. The bit line BL is electrically connected to one semiconductor region 4a of the selection MOS 4 through the contact hole 9a1. The top view of the memory cell section M after this processing is FIG. 5.

Figure 23O:
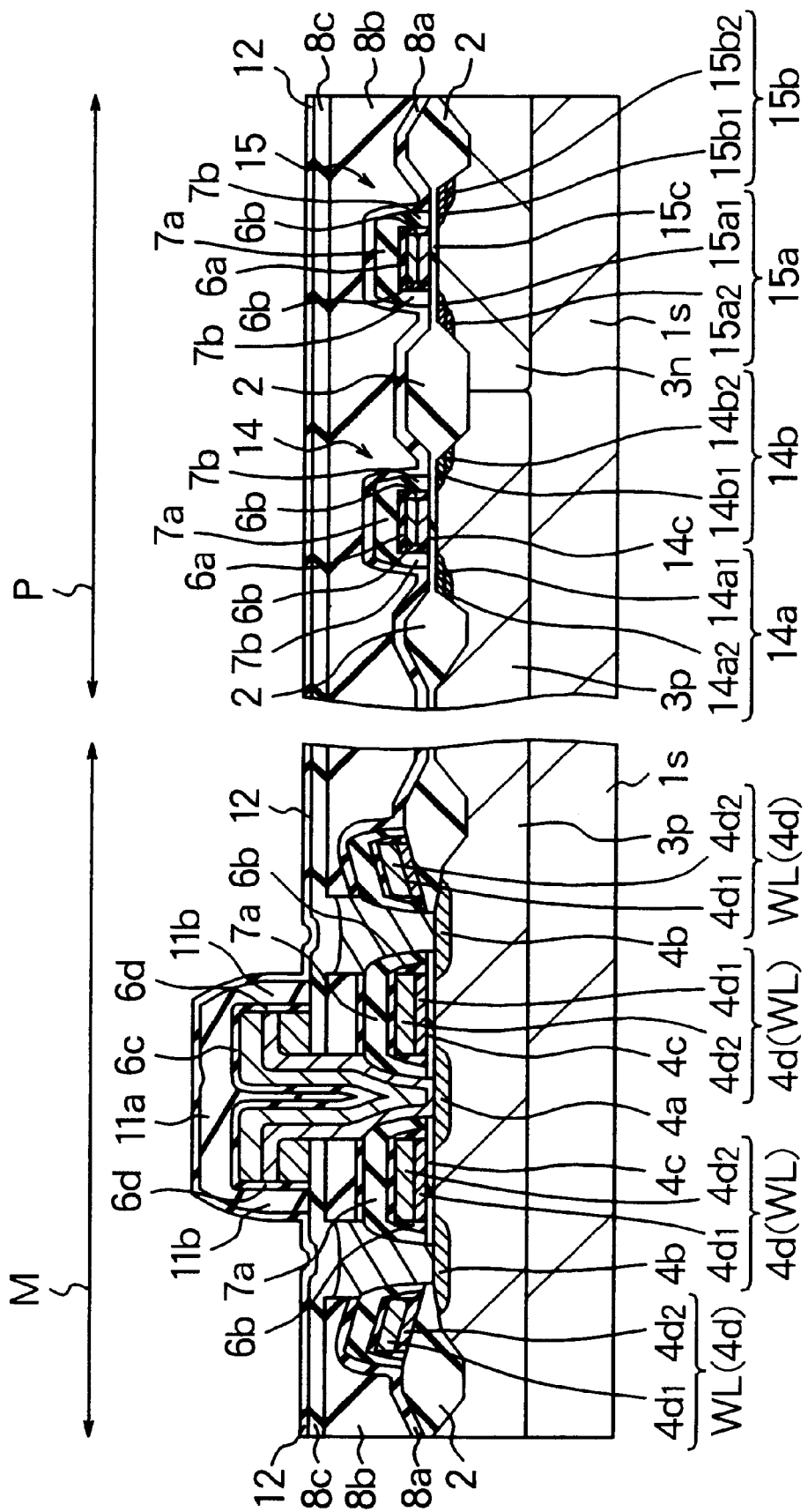

Subsequently, the photoresist 19a (see FIG. 23m) is removed. Thereafter, the resulting semiconductor substrate 1 is subjected to thermal oxidation processing. Thereby, the thin insulating film 6d preferably made of $SiO_2$ is formed on the side surfaces of the conductor films BL1 and BL2 and the mask film 10b included in the bit line BL as shown in FIG. 23o.

Thereafter, on the resulting semiconductor substrate 1s, an insulating film preferably made of silicon nitride is formed by using the CVD method. Thereafter, the insulating film is etched and removed by using an anisotropic dry etching method such as the RIE. As a result, the side walls 11b are formed on the side surfaces of the bit line BL.

Subsequently, on the resulting semiconductor substrate 1s, the insulating film 12 made of silicon nitride and preferably having a thickness in the range of approximately 100 to 500 Å, more preferably having a thickness of approximately 250 Å is formed by using the CVD method. The insulating film 12 functions as an etching stopper in a wet etching removal process of the underlying insulating subsequent to the capacitor forming processing which will be described later.

Figure 23P:
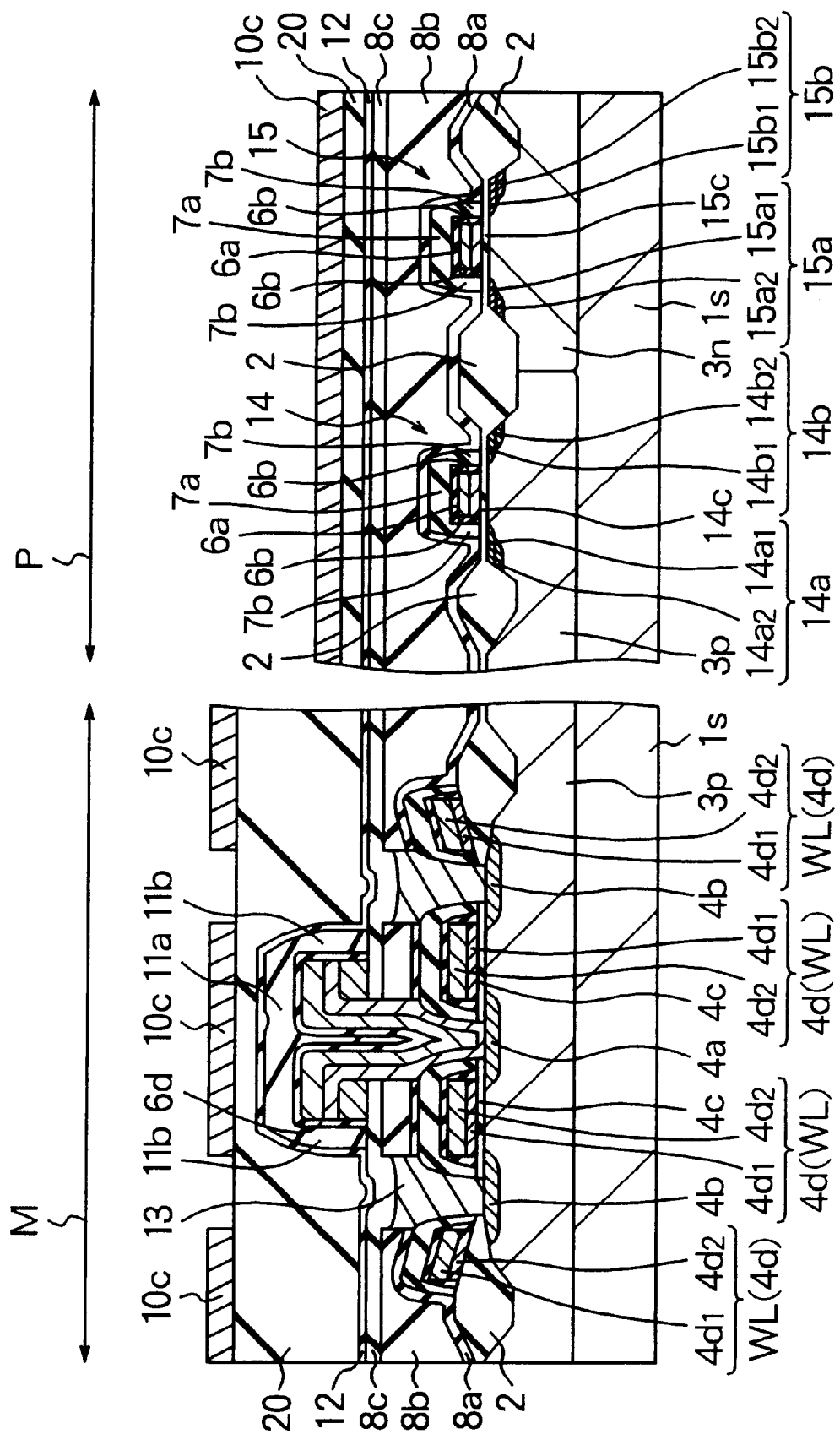

Subsequently, on the insulating film 12, an insulating film 20 preferably made of $SiO_2$ is formed by using the CVD method so as to contact the film 12 with the film 20 and cover the film 12 with the film 20 as shown in FIG. 23p. Thereafter, the upper surface of the insulating film 20 is flattened preferably by the CMP method.

Thereafter, on the resulting semiconductor substrate 1s, a mask film 10c preferably made of low-resistance poly-silicon with phosphorus introduced therein is formed by using the CVD method. In this case, the mask film 10c has a thickness in the range of approximately 500 to 2000 Å.

Subsequently, in the mask film 10c, an opening is formed in the capacitor contact hole forming region by using the photolithography technique and the dry etching technique. The mask used in this processing is the above described photomask PM5 shown in FIG. 18.

Figure 23Q:
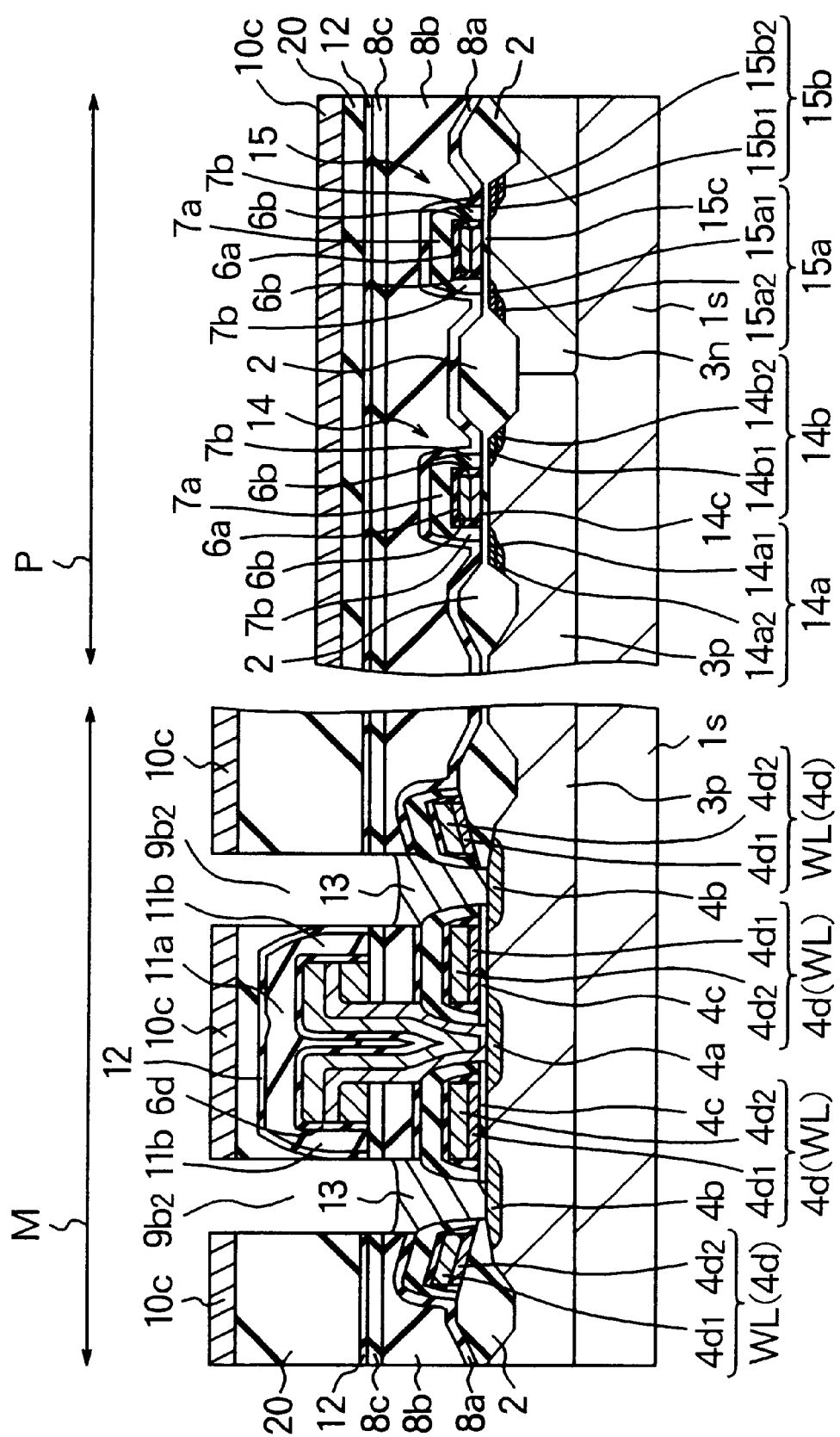

By using the mask film 10c as an etching mask, the insulating film 20, the insulating film 12 and the inter-layer insulating film 8c in the region exposed from the mask film 10c are then etched and removed. Thereby, the contact hole (upper contact hole or extension contact hole) 9b2 is formed so as to reach the conductor film 13 as shown in FIG. 23q. Preferably, the contact hole 9b2 has a diameter of approximately 0.36 m.

In the present embodiment, the cap insulating film 11a and the side walls 11b covered with the insulating films 20 and 12 and covering the bit line BL, through which the contact hole 9b2 is formed, are formed by using silicon nitride. Therefore, the selection ratio of the insulating film 20 with respect to silicon nitride in dry etching processing is high. As a result, the cap insulating film 11a and the side walls 11b function as etching stoppers. Accordingly, the minute contact hole (second capacitor contact hole) 9b2 can be formed in a self-aligned manner with a high alignment precision.

Figure 24:
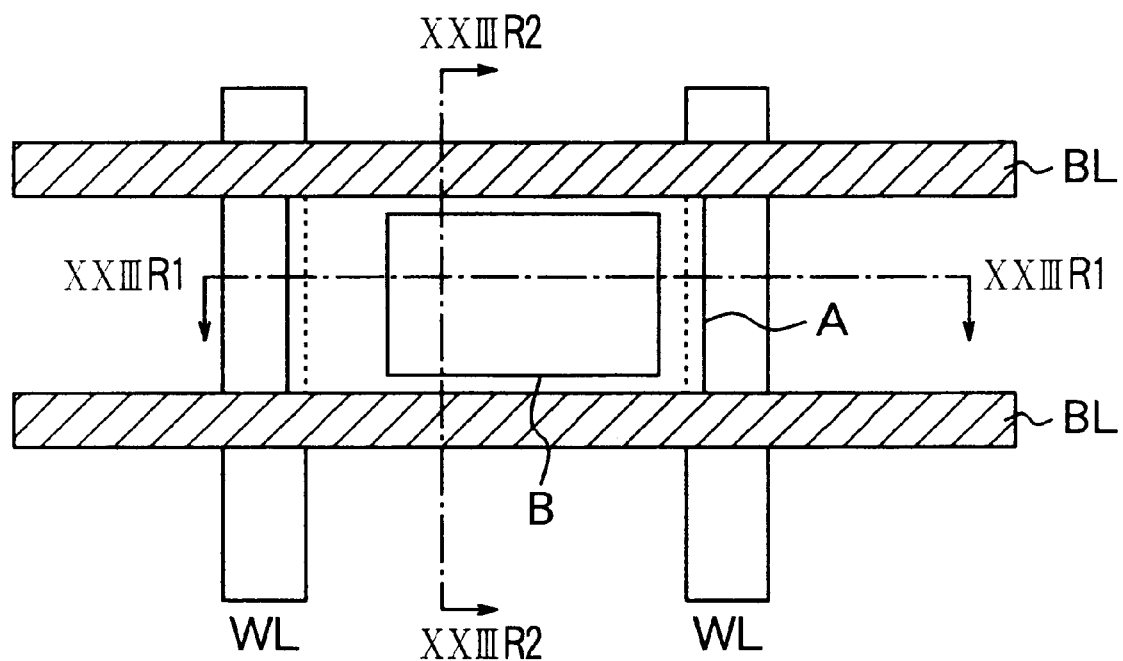
FIG. 24 is a sectional view of a principal portion of a device in the stage illustrated in FIG. 23g.

A simplified top view of a principle part of the memory cell section M at this stage is shown in FIG. 24. Sectional views thereof taken along lines XXIIIR1—XXIIIR1 and XXIIIR2—XXIIIR2 are shown in FIGS. 23r1 and 23r2, respectively.

Even if the position of the opening of the mask film 10c, for example, is somewhat deviated in the width direction (vertical direction in FIG. 24) of the bit line BL, the cap insulating film 11a and the side walls 11b are made of silicon nitride and function as etching stoppers as understood from FIG. 23r2 and consequently a part of the bit line BL is not exposed from the contact hole formed by using the mask film as an etching mask.

Furthermore, even if the position of the opening of the mask film 10c is deviated in the direction of extension (lateral direction in FIG. 24) of the bit line BL, the cap insulating film 7a and the side walls 7b covering the underlying word line WL are made of silicon nitride and function as etching stoppers as understood from FIG. 23r1 and consequently a part of the word line WL is not exposed from the contact hole formed by using the mask film as an etching mask.

In other words, the capacitor contact holes 9b1 and 9b2 (see FIG. 23q) are formed so as to be positioned within the range of a region A surrounded by the word lines WL and the bit lines BL in the present embodiment as shown in FIG. 24. By the way, the region B of FIG. 24 indicates the forming range of the contact holes 9b1 and 9b2 with due regard to another alignment tolerance such as the alignment tolerance range considering the alignment with respect to the isolation region.

The dry etching conditions at this time will now be exemplified. The selection ratio between the insulating films 20 and the cap insulating film 11a and the side walls 11b is preferably in the range of approximately 10 to 15. The reaction gas is preferably $C_4F_8/CF_4/CO/Ar$ gas preferably with approximately 3/5/200/550 sccm, respectively. Preferably, the pressure is approximately 100 mTorr. Preferably, the RF power is approximately 1000 watts. Preferably, the processing temperature of the etching system is approximately 20/60/–10° C. on the upper electrode/wall surface/lower electrode, respectively.

Subsequently, on the mask layer 10c, the conductor film 5a having a thickness in the range of approximately 500 to 1000 Å preferably made of low-resistance poly-silicon with phosphorus introduced therein is formed. On the upper surface of the conductor film 5a, an insulating film 21 having a thickness in the range of approximately 3000 to 6000 Å preferably made of $SiO_2$ is then formed by using the plasma CVD method.

The conductor film 5a is formed in the contact holes 9b1 and 9b2 as well and electrically connected to the other semiconductor region 4b of the selection MOS 4 through the conductor film 13.

The insulating film 21 is made of an insulating film having a higher etch rate in wet etching processing than that of the underlying insulating film 20 made of the BPSG. The reason will now be described. It is now assumed that the etching rate of the insulating film 21 is lower than that of the insulating film 20. The insulating film 21 is embedded also in a narrow hollow located at the center of the first electrode 5a. In simultaneously removing the insulating film 21 and the insulating film 20 in a subsequent process, therefore, the insulating film 20 is removed before the insulating film 21 is sufficiently removed. If the etching rate of the insulating film 21 is lower than that of the insulating film 20, therefore, a bad influence is exerted upon underlying devices in some cases.

Figure 23S:
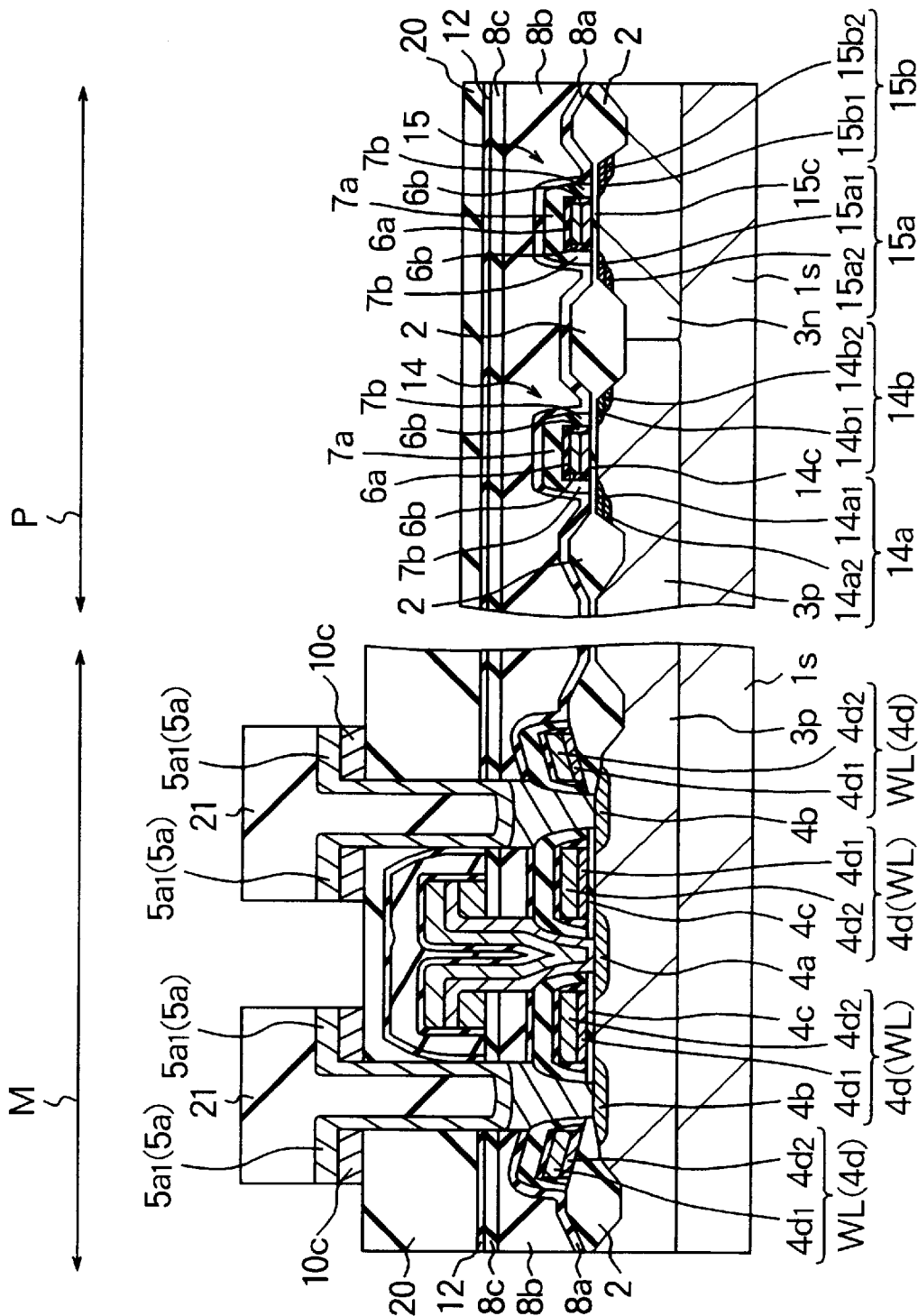

Subsequently, in the insulating film 21, the conductor film 5a and the mask layer 10c, portions exposed from the photoresist are etched and removed by using the dry etching method. Thereby, a lower portion 5a1 of the first electrode 5a of the capacitor and the insulating film 21 are formed as shown in FIG. 23s.

Figure 23T:
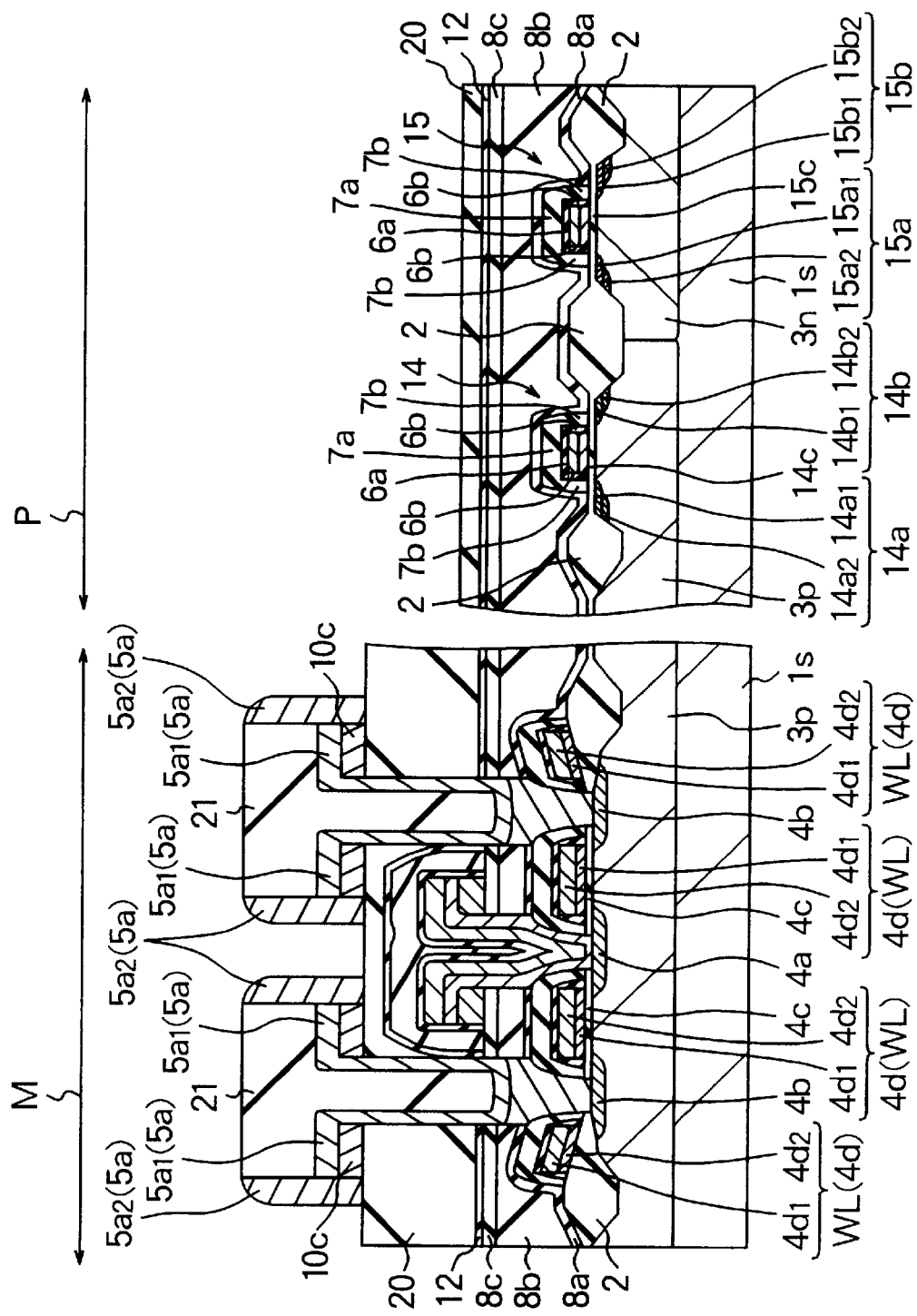

Thereafter, on the resulting semiconductor substrate 1s, a conductor film made of low-resistance poly-silicon is formed by using the CVD method. Thereafter, the conductor film is etched back by using an anisotropic dry etching method such as the RIE. Thereby, side portions 5a2 of the first electrode 5a of the capacitor are formed on side surfaces of the insulating film 21 as shown in FIG. 23t.

Subsequently, the insulating films 20 and 21 are removed by wet etching preferably using a fluoric acid solution. Thereby, the first electrode 5a of a cylindrical capacitor is formed as shown in FIG. 23u. At this time, the insulating film 12 formed on the inter-layer insulating film 8c functions as the stopper for the wet etching and consequently the underlying inter-layer insulating film 8c is not removed.

Subseuently, on the resulting semiconductor substrate 1s, a silicon nitride film (not illustrated) is formed by using the CVD method. Thereafter, the silicon nitride film is subjected to oxidation processing. Thereby, a $SiO_2$ film is formed on the surface of the silicon nitride film, and the capacitor insulating film 5b including the silicon nitride film and the $SiO_2$ film is formed as shown in FIG. 23v.

Thereafter, a conductor film preferably made of low-resistance poly-silicon is formed on the resulting semiconductor substrate 1s by using the CVD method. By using a photoresist as a mask, this conductor film is etched. Thereby the second electrode 5c of the capacitor 5 is formed, and the capacitor 5 is formed.

Subsequently, on the resulting semiconductor substrate 1s, the insulating film preferably made of $SiO_2$ is formed by using the CVD method. Thereafter, on the insulating film 8d1, the insulating film 8d2 preferably made of BPSG is formed. The upper surface of the insulating film 8d2 is flattened preferably by using the CMP method.

Subsequently, transition to wiring conductor forming process is conducted. The wiring conductor forming process will now be described by referring to FIGS. 23w through 23z. Although FIGS. 23w through 23z show sectional views of a portion different from that of FIGS. 23a through 23v to explain the wiring conductor forming process, FIGS. 23w through 23z are sectional views of the same DRAM.

Figure 23W:
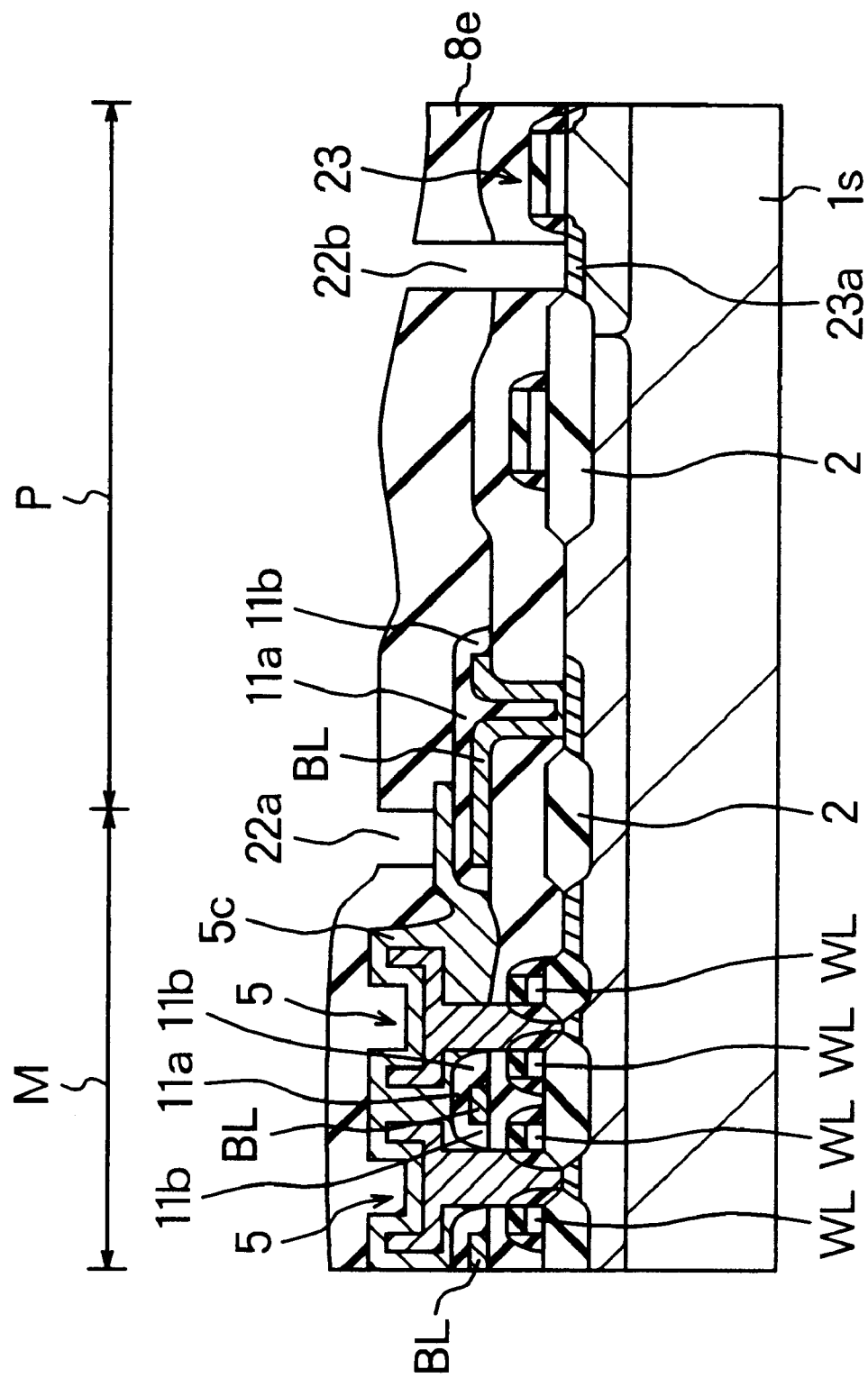

First of all, an inter-layer insulating film 8e preferably made of $SiO_2$ is formed on the resulting semicondutor substrate by using the CVD method as shown in FIG. 23w. Thereby the capacitor 5 is covered.

By using a photoresist as a mask, a contact hole 22a is formed in the inter-layer insulating film 8e so as to expose a pad portion of the second electrode 5c of the capacitor 5. Together therewith, a contact hole 22b is formed by using dry etching processing so as to expose one semiconductor region 23a of a MOSFET 23 in the peripheral circuit section P.

Thereafter, on the resulting semiconductor substrate 1s, a conductor film preferably made of titanium (Ti) is formed by the sputtering method. On the upper surface of the conductor film, a conductor film preferably made of tungsten is then formed by using the CVD method. On the upper surface of the conductor film preferably made of tungsten, a conductor film preferably made of titanium nitride (TiN) is formed by using the sputtering method.

Figure 23X:
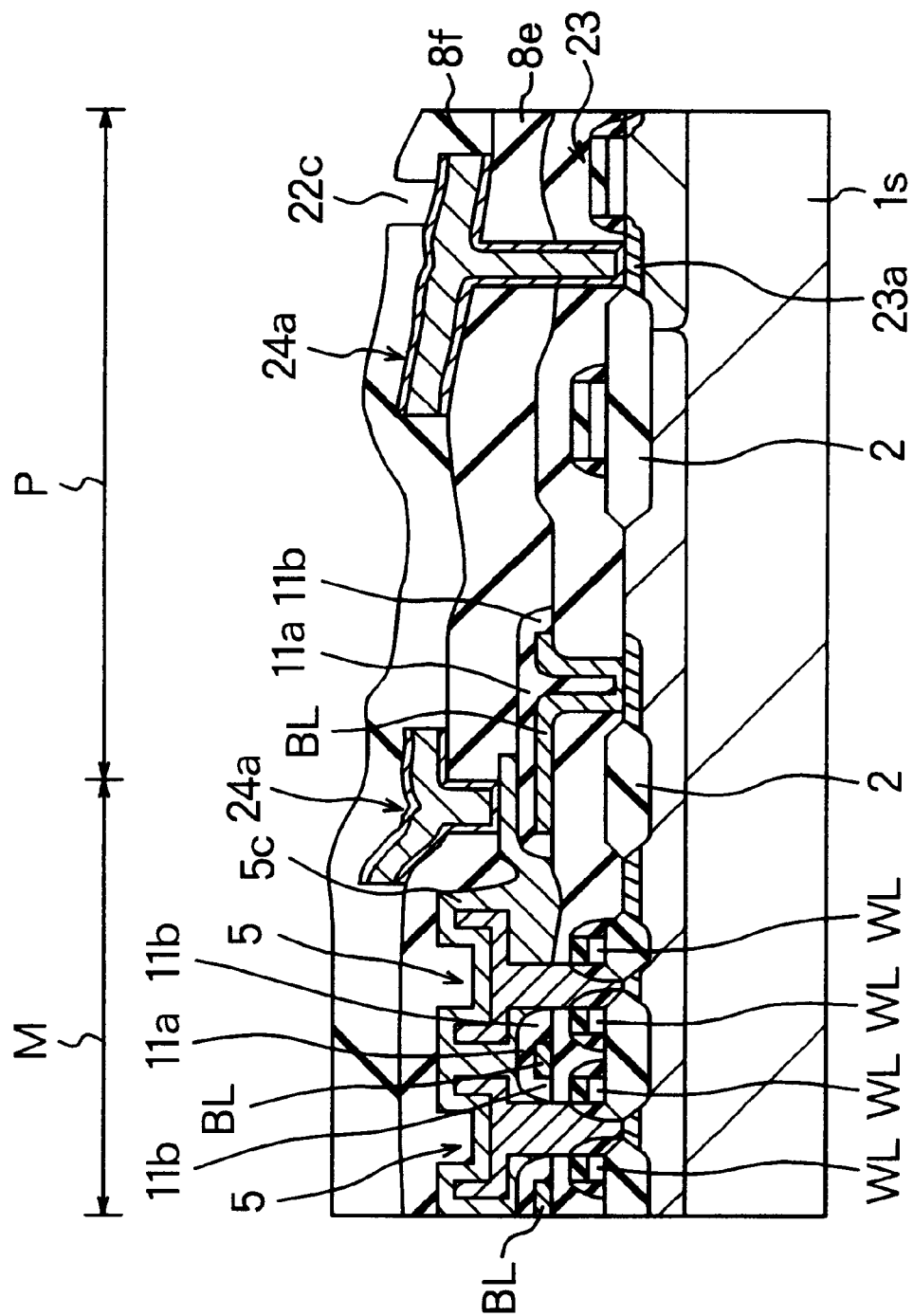

Subsequently, with a photoresist used as a mask, the laminated conductor film is subjected to patterning by using the dry etching method. Thereby, a first level interconnection 24a is formed as shown in FIG. 23x.

Subsequently, on the resulting semiconductor substrate 1s, an inter-layer insulating film 8f preferably made of $SiO_2$ is formed by using the CVD method so as to cover the first level interconnection 24a. Thereafter, the inter-layer insulating film 8f is subjected to dry etching processing by using a photoresist as a mask. Thereby, a contact hole 22c is formed so as to expose a part of the first level interconnection 24a.

Figure 23Y:
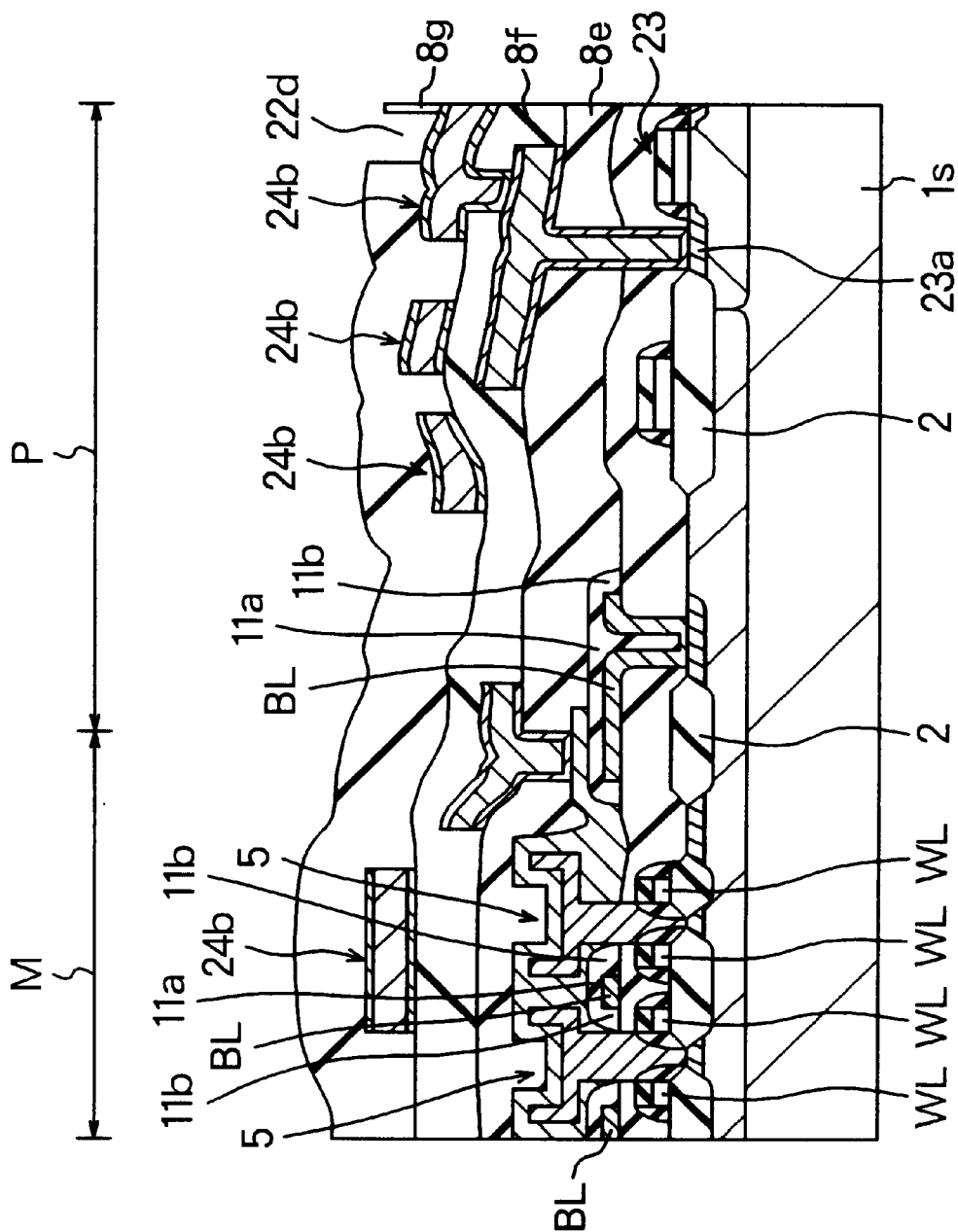

Thereafter, a second level interconnection 24b is formed on the inter-layer insulating film 8f as shown in FIG. 23y. The second level interconnection 24b is formed preferably as described below.

First of all, a conductor film preferably made of tungsten is formed by using the CVD method. On the upper surface of the conductor film, a conductor film preferably made of aluminum (Al) is formed by using the sputtering method. Furthermore, on the upper surface of the conductor film preferably made of aluminum, a conductor film preferably made of TiN is formed by using the sputtering method. Thereafter, the laminated conductor film is subjected to patterning in the same way as the first level interconnection 24a. The second level interconnection 24b is thus formed.

Subsequently, on the inter-layer insulating film 8f, an inter-layer insulating film 8g preferably made of $SiO_2$ is formed to cover the second level interconnection 24b by using the CVD method. Therafter, by using a photoresist as a mask, the inter-layer insulating film 8g is subjected to dry etching processing. Thereby, a contact hole 22d is formed so as to expose the second level interconnection 24b.

Figure 23Z:
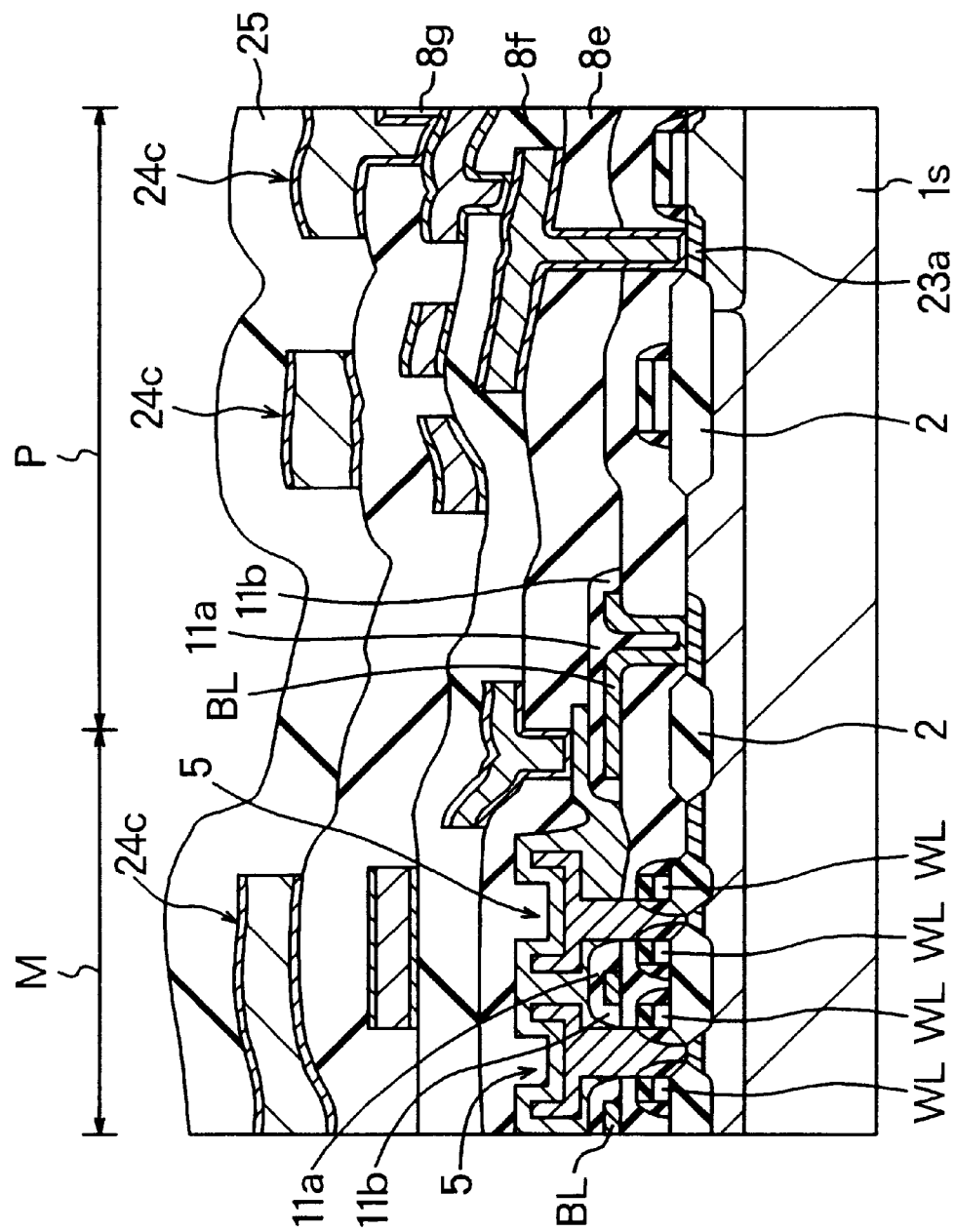

Subsequently, a third level interconnection 24c is formed on the inter-layer insulating film 8g as shown in FIG. 23z.

The third level interconnection 24c may be formed by the same material and the same method as the second level interconnection 24b uses.

Finally, on the resulting semiconductor substrate 1s, a surface protection film 25 preferably made of $SiO_2$ is formed to cover the third level interconnection 24c by using the CVD method. Thereby, the wafer process of the DRAM in the present embodiment is finished.

Owing to the present embodiment, the following effects can thus be obtained.

(1) The space between transparent areas P2 for word line transfer which are adjacent to each other is made constant in each space line. Thereby, the phase difference manipulation on light beams transmitted through the transparent areas P2 which are adjacent to each other can be conducted favorably substantially according to the design in the whole area between both transparent areas P2. As a result, the shape and dimensions of the transfer pattern (word lines WL) can be formed substantially according to the design.

(2) The space between transparent areas P2 for word line transfer which are adjacent to each other and the width of narrow portions of the transparent areas P2 are made identical. Thereby, phase difference manipulation on light beams transmitted through transparent areas P2 which are adjacent to each other can be further improved. As a result, the fidelity of the shape and dimensions of the transfer pattern (word lines WL) can be improved.

(3) A minute opaque area S1 is disposed in the expanded portion of each transparent area P4 for forming bit lines. In the neighboring opaque area, the auxiliary pattern segment PA2 is disposed near the boundary between the expanded portion and the narrow-width portion of the transparent area P4. Thereby, it is possible to suppress significant lack of uniformity caused in the strength of transmitted light by a difference in area ratio between the expanded portion and the narrow-width portion of the transparent area P4. Therefore, the expanded portion and the narrow-width portion of the transparent area P4 can be transferred favorably substantially according to the design. As a result, it becomes possible to form the shape and dimensions of the transfer pattern (bit lines BL) substantially according to the design.

(4) According to the disposition state of the transparent area P5 for forming contact holes for the capacitor 5, the auxiliary pattern segments PA3a through PA3d disposed near four sides of the transparent area P5 are shared and the dimensions are changed. Without transferring a useless pattern, therefore, the transparent area P5 can be transferred favorably. And the shape and dimensions of the contact holes 9b1 and 9b2 for the capacitor 5 can be formed substantially according to the design.

(5) Because of the above described (1) through (4), alignment tolerance between predetermined layers can be made small. Therefore, dimensions of the semiconductor chip forming a semiconductor integrated circuit device can be reduced.

(6) Because of the above described (1) through (4), the alignment precision between predetermined layers can be improved. Therefore, the yield and reliability of semiconductor integrated circuit devices can be improved.

Figure 25:
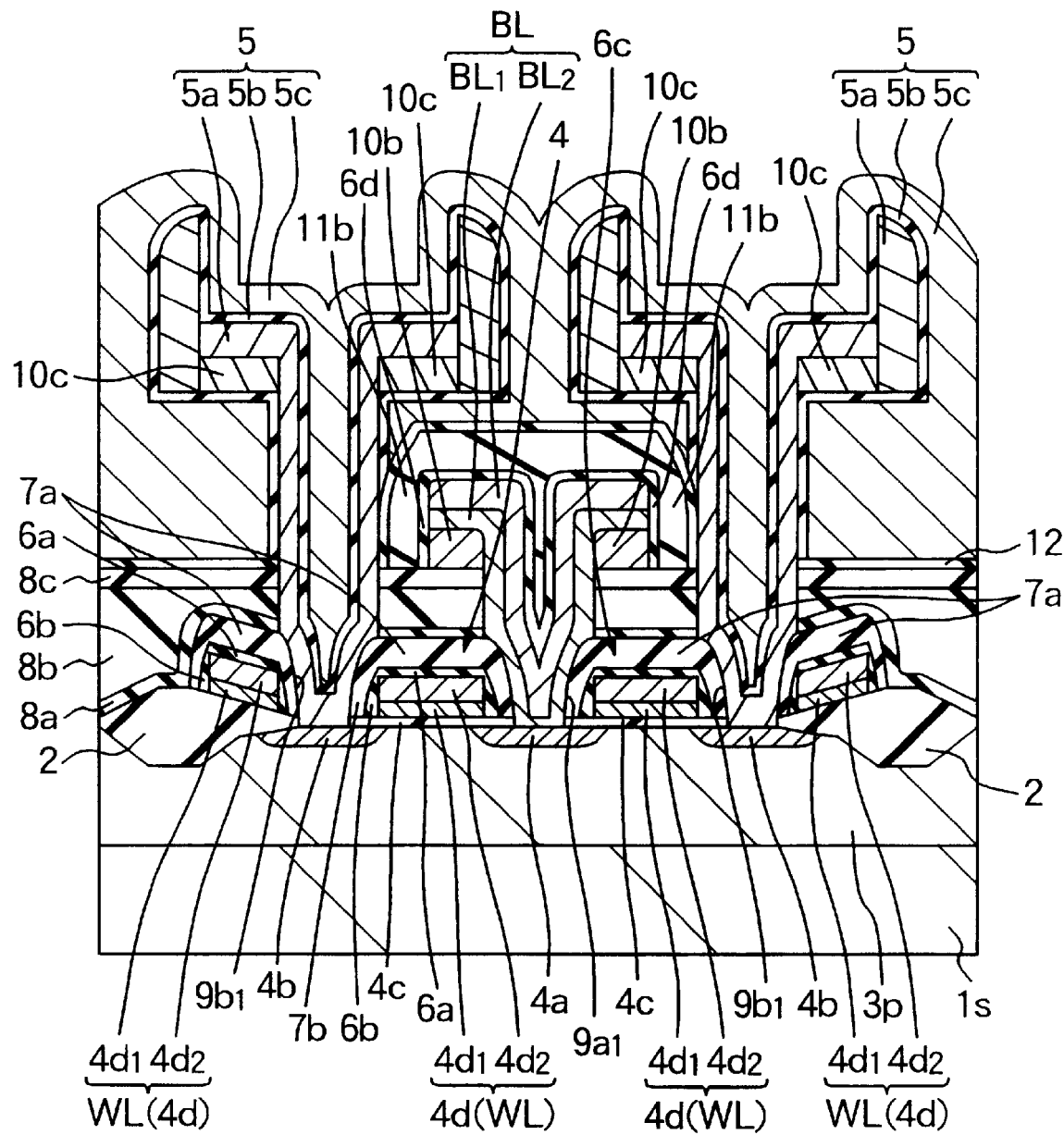
FIG. 25 is a sectional view of a principal portion of a memory cell section included in a semiconductor integrated circuit device according to an embodiment of the present invention.

FIG. 25 is a sectional view of a principal part of the memory cell section of another embodiment of a semiconductor integrated circuit device according to the present invention.

In the semiconductor integrated circuit device of the second embodiment shown in FIG. 25, the conductor film 13 to be embedded as described with reference to the first embodiment is not provided in the contact hole 9b1 for the capacitor 5.

In this case, the contact hole 9b1 is formed preferably as hereafter described. A transition from the stage of FIG. 23f in the first embodiment described before to the stage of FIG. 23l is effected. Furthermore, in the same way as the procedures shown in FIGS. 23m through 23o, the bit line BL, the insulating films 6c and 6d covering the bit line BL, the cap insulating film 11a, the side walls 11b, and the the insulating film 12 are formed.

Subsequently, the insulating film 12 is covered with the insulating film 20 in the same way as the procedure shown in FIG. 23p. Thereafter, the upper surface of the insulating film 20 is flattened. Thereafter, the mask film 10c preferably made of low-resistance poly-silicon is formed on the insulating film 20.

Thereafter, the mask film 10c is patterned in the same way as the first embodiment. As for the photomask used at this time, the photomask PM5 in FIG. 19 is used.

By using the patterned mask film 10c as a mask, the contact hole 9b is formed in the insulating film 20, the insulating film 12 and the inter-layer insulating films 8a through 8c so as to expose the semiconductor region 4b located on the resulting semiconductor substrate 1s by using the dry etching method in the same way as the procedure shown in FIG. 23q.

In the present embodiment as well, the contact hole 9b can be formed in a self-aligned manner at this time by forming the cap insulating film 7a and the side walls 7b covering the word line WL and the cap insulating film 11a and the side walls 11b covering the bit line BL by using silicon nitride.

Therefore, the same effects as the first embodiment provides can be obtained in the manufacturing method of a semiconductor integrated circuit device of the present embodiment as well.

Heretofore, the invention made by the present inventors has been described concretely on the basis of preferred embodiments. As a matter of course, however, the present invention is not limited to the above described embodiments, but the present invention can be modified diversely without departing from the spirit of the present invention.

By referring to the above described embodiments, the case where an exposure apparatus of step and repeat type is used has been described. However, the exposure apparatus is not limited to this, but an exposure apparatus of so-called step and scan type, for example, may be used. In the exposure apparatus of step and scan type, an exposure area is stepped to be located under a reduction optical system by moving an exposure stage, and thereafter scanning is conducted while moving the mask (reticle) and the exposure stage with a predetermined speed ratio.

By referring to the above described embodiments, the case where the memory cell has a cylindrical capacitor has been described. However, the shape of the capacitor is not limited to this, but it can be modified diversely and the capacitor may take the shape of a fin.

By referring to the above described embodiments, the case where the bit line is formed by disposing a silicide layer on low-resistance poly-silicon has been described. However, the structure of the bit line is not limited to this. For example, the bit line may be formed by using the silicide layer alone. In this case, the bit line BL can be made thin.

Heretofore, the case where the invention made by the present inventors is applied to DRAMs forming its background field has been principally described. However, application is not limited to this, but the present invention can be applied to various fields. For example, the present invention can be applied to ordinary RAMs having capacitors under bit lines, SRAMs (Static RAMs), ROMs (Read Only Memories), logic circuits, or other semiconductor devices having a semiconductor memory circuit and a logic circuit disposed on the same semiconductor substrate.

We claim:

1. A method of manufacturing a semiconductor integrated circuit device, said semiconductor integrated circuit device including generally linear conductor strips having varying widths and extending in a first direction, at least two generally linear conductor strips being juxtaposed in a second direction substantially perpendicular to said first direction to form a conductor strip unit in a manner such that widths of the conductor strips as viewed in said second direction are substantially periodically changed, said conductor strips forming said conductor strip units being repetitively juxtaposed with a fine interval in said second direction in a conductor strip forming order, said method comprising the steps of:

(a) preparing a semiconductor substrate having a main surface;

(b) forming a photoresist film on said main surface of said semiconductor substrate;

(c) conducting pattern transference onto said photoresist film by use of a phase shifting mask of the type having a pattern including a plurality of generally linear transparent areas and a plurality of generally linear opaque areas, said plurality of generally linear transparent areas corresponding to said conductor strips, phases of light beams transmitted through adjacent transparent areas being substantially opposite to each other, wherein, in said phase shifting mask,
   arrangement units each including a plurality of generally linear transparent areas and a plurality of generally linear opaque areas are repetitively juxtaposed with said fine interval, said arrangement units corresponding to said conductor strip units,
   an interval between the linear transparent areas within each of said arrangement units is substantially constant over a length of the linear transparent transparent areas, and
   an interval between said arrangement units is substantially constant over a length of the linear transparent areas; and (d) developing said pattern and forming said linear conductor strips having varying widths by use of said pattern.

2. A method of manufacturing a semiconductor integrated circuit device according to claim 1, wherein said photoresist is of a negative type.

3. A method of manufacturing a semiconductor integrated circuit device according to claim 1, wherein said linear strips having varying widths constitute a plurality of word lines of a DRAM (Dynamic Random Access Memory).

4. A method of manufacturing a semiconductor integrated circuit device according to claim 1, further comprising, after said step (d), the step of forming contact holes between adjacent generally linear strips in a self-aligned manner.

5. A method of manufacturing a semiconductor integrated circuit device according to claim 4, further comprising the steps of forming a plurality of bit lines and information storage capacitors over above the bit lines for said DRAM.

6. A method of manufacturing a semiconductor integrated circuit device having a DRAM, said DRAM including a plurality of word line conductors disposed so as to extend in a first direction, a plurality of bit line conductors formed above those word line conductors and disposed so as to extend in a second direction substantially perpendicular to said first direction, and information storage capacitors formed above those bit line conductors, the method comprising the steps of:

(a) preparing a semiconductor substrate having a main surface;

(b) forming a photoresist film on said main surface of said semiconductor substrate;

(c) conducting pattern transference onto said photoresist film by use of a phase shifting mask of the type having a pattern including a plurality of generally linear transparent areas and a plurality of generally linear opaque areas, said plurality of generally linear transparent areas corresponding to said word line conductors, phases of light beams transmitted through adjacent transparent areas being substantially opposite to each other, wherein in said phase shifting mask, arrangement units each including a plurality of generally linear transparent areas and a plurality of generally linear opaque areas are repetitively juxtaposed with a fine interval, said arrangement units corresponding to said word line conductors, an interval between the linear transparent areas within each of said arrangement units is substantially constant over a length of the linear transparent transparent areas, and an interval between said arrangement units is substantially constant over a length of the linear transparent areas;

(d) developing said pattern and forming said plurality of word line conductors by use of said pattern;

(e) forming a first insulating film on upper and side surfaces of said word line conductors;

(f) forming a second insulating film on a resulting semiconductor substrate, said second insulating film having a larger etching rate than said first insulating film, said first insulating film being contacted with and covered with said second insulating film;

(g) flattening an upper surface of said second insulating film; and (h) forming contact holes between adjacent word line conductors in a self-aligned manner by etching through said second insulating film.

7. A method of manufacturing a semiconductor integrated circuit device comprising the step of:

transferring, onto an integrated circuit wafer, a circuit pattern carried on a phase shifting mask by a reduction-type projection printing;

said circuit pattern on said phase shifting mask having a phase arrangement such that exposure light having passed through alternate transparent areas of said circuit pattern are phase-inverted with respect to each other, said circuit pattern including a periodic structure in which a unit pattern is periodically repeated plural times, wherein said unit pattern includes:

(a) a first generally linear transparent area having a width not uniform;

(b) a first generally linear opaque area contiguous to said first generally linear transparent area and having a width substantially uniform; and (c) a second generally linear transparent area contiguous to said first generally linear opaque area and having a width not uniform, and light having passed through said second generally linear transparent area being phase-inverted with respect to light having passed through said first generally linear transparent area.

8. A method according to claim 7, wherein said first generally linear transparent area and said second generally linear transparent area correspond to word lines of a memory circuit.

9. A method according to claim 8, wherein said memory circuit has at least a portion of an information storage capacitor arranged above a bit line.

10. A method of manufacturing a semiconductor integrated circuit random access memory device in which at least a portion of an information storage capacitor is arranged above a bit line, said method comprising the step of:

transferring, onto an integrated circuit wafer, a circuit pattern carried on a phase shifting mask by a reduction-type projection printing;

said circuit pattern on the phase shifting mask having a phase arrangement such that exposure light having passed through alternate transparent areas of said circuit pattern are phase-inverted with respect to each other, said circuit pattern including a periodic structure in which a unit pattern is periodically repeated plural times, wherein said unit pattern includes:

(a) a first generally linear transparent area;

(b) a first generally linear opaque area contiguous to said first generally linear transparent area and having a width substantially uniform;

(c) a second generally linear transparent area contiguous to said first generally linear opaque area, light having passed through said second generally linear transparent area being phase-inverted with respect to light having passed through said first generally linear transparent area; and (d) a second generally linear opaque area contiguous to said second generally linear transparent area and having a width substantially uniform and substantially equal to that of said first generally linear opaque area.

11. A method according to claim 10, wherein said first generally linear transparent area and said second generally linear transparent area correspond to word lines of a memory circuit.

12. A method of manufacturing a semiconductor integrated circuit device comprising the step of:

transferring, onto an integrated circuit wafer, a circuit pattern carried on a phase shifting mask by a reduction-type projection printing;

said circuit pattern on the phase shifting mask having a phase arrangement such that exposure light having passed through alternate transparent areas of said circuit pattern are phase-inverted with respect to each other, said circuit pattern including a periodic structure in which a unit pattern is periodically repeated plural times, wherein said unit pattern includes:

(a) a first generally linear transparent area which includes a first narrow transparent portion having a first width and includes a first expanded transparent portion having a second width larger than said first width;

(b) a first generally linear opaque area which includes a first narrow opaque portion contiguous to said first expanded transparent portion and having a third width and includes a first wide opaque portion contiguous to said first narrow transparent portion and having a fourth width larger than said third width;

(c) a second generally linear transparent area which is contiguous to said first generally linear opaque area and which includes a second narrow transparent portion having said first width and includes a second expanded transparent portion having said second width, light having passed through said second generally linear transparent area being phase-inverted with respect to light having passed through said first generally linear transparent area;

(d) a second generally linear opaque area which is contiguous to said second generally linear transparent area and which includes a second narrow opaque portion having said third width and includes a second wide opaque portion having said fourth width;

(e) a first fine opaque area provided in said first expanded transparent portion of said first generally linear transparent area, said first fine opaque area having dimensions too fine to be transferred so that no pattern corresponding thereto is formed on said integrated circuit wafer;

(f) a first fine transparent area provided in said first wide opaque portion of said first generally linear opague area, near said first expanded transparent portion and said first narrow transparent portion of said first generally linear transparent area, said first fine transparent area having dimensions too fine to be transferred so that no pattern corresponding thereto is formed on said integrated circuit wafer, light having passed through said first fine transparent area being phase-inverted with respect to light having passed through said first generally linear transparent area;

(g) a second fine opaque area provided in said second expanded transparent portion of said second generally linear transparent area, said second fine opaque area having dimensions too fine to be transferred so that no pattern corresponding thereto is formed on said integrated circuit wafer; and (h) a second fine transparent area provided in said second wide opaque portion of said second generally linear opaque area, near said second expanded transparent portion and said second narrow transparent portion of said second generally linear transparent area, said second fine transparent area having dimensions too fine to be transferred so that no pattern corresponding thereto is formed on said integrated circuit wafer, light having passed through said second fine transparent area being phase-inverted with respect to light having passed through said second generally linear transparent area.

13. A method according to claim 12, wherein said first generally linear transparent area and said second generally linear transparent area correspond to word lines of a memory circuit.

14. A method according to claim 13, wherein said memory circuit has at least a portion of an information storage capacitor arranged above a bit line.

15. A method of manufacturing a semiconductor integrated circuit device comprising the step of:

transferring, onto an integrated circuit wafer, a circuit pattern carried on a phase shifting mask by a reduction-type projection printing, said circuit pattern on the phase shifting mask having a phase arrangement such that exposure light having passed through alternate transparent areas of said circuit pattern are phase-inverted with respect to each other, said circuit pattern including a periodic structure in which a unit pattern is periodically repeated plural times, wherein said unit pattern includes:

(a) a first generally linear transparent area which includes a first narrow transparent portion having a first width and includes a first expanded transparent portion having a second width larger than said first width;

(b) a first generally linear opaque area which includes a first narrow opaque portion contiguous to said first expanded transparent portion and having a third width and includes a first wide opaque portion contiguous to said first narrow transparent portion and having a fourth width larger than said third width;

(c) a second generally linear transparent area which is contiguous to said first generally linear opaque area and which includes a second narrow transparent portion having said first width and includes a second expanded transparent portion having said second width, light having passed through said second generally linear transparent area being phase-inverted with respect to light having passed through said first generally linear transparent area;

(d) a second generally linear opaque area which is contiguous to said second generally linear transparent area and which includes a second narrow opaque portion having said third width and includes a second wide narrow portion having said fourth width;

(e) a first fine transparent area provided in said first wide opaque portion of said first generally linear opaque area, near said first expanded transparent portion and said first narrow transparent portion of said first generally linear transparent area, said first fine transparent area having dimensions too fine to be transferred so that no pattern corresponding thereto is formed on said integrated circuit wafer, light having passed through said first fine transparent area being phase-inverted with respect to light having passed through said first generally linear transparent area; and (f) a second fine transparent area provided in said second wide opaque portion of said second generally linear opaque area, near said second expanded transparent portion and said second narrow transparent portion of said second generally linear transparent area, said second fine transparent area having dimensions too fine to be transferred so that no pattern corresponding thereto is formed on said integrated circuit wafer, light having passed through said second fine transparent area being phase-inverted with respect to light having passed through said second generally linear transparent area.

16. A method according to claim 15, wherein said first generally linear transparent area and said second generally linear transparent area correspond to word lines of a memory circuit.

17. A method according to claim 16, wherein said memory circuit has at least a portion of an information storage capacitor arranged above a bit line.

18. A method of manufacturing a semiconductor integrated circuit device comprising the step of:

transferring, onto an integrated circuit wafer, a circuit pattern carried on a phase shifting mask by a reduction-type projection printing;

said circuit pattern on the phase shifting mask having a phase arrangement such that exposure light having passed through alternate transparent areas of said circuit pattern are phase-inverted with respect to each other, said circuit pattern including a periodic structure in which a unit pattern is periodically repeated plural times, wherein said unit pattern includes:

(a) a first generally linear transparent area which includes a first narrow transparent portion having a first width and includes a first expanded transparent portion having a second width larger than said first width;

(b) a first generally linear opaque area which includes a first narrow opaque portion contiguous to said first expanded transparent portion and having a third width and includes a first wide opaque portion contiguous to said first narrow transparent portion and having a fourth width larger than said third width;

(c) a second generally linear transparent area which is contiguous to said first generally linear opaque area and which includes a second narrow transparent portion having said first width and includes a second expanded transparent portion having said second width, light having passed through said second generally linear transparent area being phase-inverted with respect to light having passed through said first generally linear transparent area;

(d) a second generally linear opaque area which is contiguous to said second generally linear transparent area and which includes a second narrow opaque portion having said third width and includes a second wide opaque portion having said fourth width;

(e) a first fine opaque area provided in said first expanded transparent portion of said first generally linear transparent area, said first fine opaque area having dimensions too fine to be transferred so that no pattern corresponding thereto is formed on said integrated circuit wafer; and (f) a second fine opaque area provided in said second expanded transparent portion of said second generally linear transparent area, said second fine opaque area having dimensions too fine to be transferred so that no pattern corresponding thereto is formed on said integrated circuit wafer.

19. A method according to claim 18, wherein said first generally linear transparent area and said second generally linear transparent area correspond to bit lines of a memory circuit.

20. A method according to claim 19, wherein said memory circuit has at least a portion of an information storage capacitor arranged above a bit line.

21. A method of manufacturing a semiconductor integrated circuit device comprising the step of:

transferring, onto an integrated circuit wafer, a circuit pattern carried on a phase shifting mask by a reduction-type projection printing;

said circuit pattern on the phase shifting mask having a two-dimensional arrangement in which a unit transparent pattern is substantially periodically repeated plural times two dimensionally in a first direction and a second direction perpendicular to said first direction, respectively, said unit transparent pattern including a main transparent area and a plurality of auxiliary transparent areas provided at a periphery of said main transparent area, said auxiliary transparent areas having a phase arrangement such that exposure light having passed therethrough are phase-inverted with respect to light having passed through said main transparent area, said auxiliary transparent areas having dimensions too fine to be transferred so that no pattern corresponding thereto is formed on said integrated circuit wafer, said two-dimensional arrangement being such that:

(a) an arrangement pitch of said unit transparent pastern in said first direction is larger than that in said second direction;

(b) two auxiliary transparent areas are provided between any adjacent two main transparent areas in said first direction; and (c) one auxiliary transparent area is provided between any adjacent two main transparent areas in said second direction.

22. A method according to claim 21, wherein said auxiliary transparent areas provided between the main transparent areas in said second direction are larger than the auxiliary transparent areas provided between the main transparent areas in said first direction.

23. A method according to claim 22, wherein said arrangement pitch of said unit transparent pattern in said first direction alternately takes a first value smaller than an average value and a second value larger than said average value.

24. A method of manufacturing a semiconductor integrated circuit device comprising the step of:

transferring, onto an integrated circuit wafer, a circuit pattern carried on a phase shifting mask by a reduction-type projection printing;

said circuit pattern on the phase shifting mask having a two-dimensional arrangement in which a unit transparent pattern is substantially periodically repeated plural times two dimensionally in a first direction and a second direction perpendicular to said first direction, respectively, said unit transparent pattern including a main transparent area and a plurality of auxiliary transparent areas provided at a periphery of said main transparent area, said auxiliary transparent areas having a phase arrangement such that exposure light having passed therethrough are phase-inverted with respect to light having passed through said main transparent area, said auxiliary transparent areas having dimensions too fine to be transferred so that no pattern corresponding thereto is formed on said integrated circuit wafer, said two-dimensional arrangement being such that:

(a) said arrangement pitch of said unit transparent pattern in said first direction alternately takes a first value smaller than an average value and a second value larger than said average value.

25. A method according to claim 24, wherein auxiliary transparent areas provided between adjacent two main transparent areas of their associated unit transparent patterns in the arrangement pitch of said second value in said first direction are larger than auxiliary transparent areas provided between adjacent two main transparent areas of their associated unit transparent patterns in the arrangement pitch of said first value in said first direction.

26. A method according to claim 25, wherein deviations of said first and second values from said average value for said arrangement pitch are smaller than said average value.

* * * * *

UNITED STATES PATENT AND TRADEMARK OFFICE
CERTIFICATE OF CORRECTION

PATENT NO : 5,933,724
DATED : August 3, 1999
INVENTOR(S) : Toshihiro SEKIGUCHI, et al.

It is certified that error appears in the above-identified patent and that said Letters Patent is hereby corrected as shown below:

On title page, item 73, Assignees:
replace "Texas Instruments" with --Texas Instruments, Incorporated--.

Signed and Sealed this

Sixth Day of March, 2001

Attest:

NICHOLAS P. GODICI

*Attesting Officer*     Acting Director of the United States Patent and Trademark Office